United States Patent
Seok et al.

(10) Patent No.: US 10,546,697 B2
(45) Date of Patent: Jan. 28, 2020

(54) SOLAR CELL HAVING LIGHT-ABSORBING STRUCTURE

(71) Applicant: KOREA RESEARCH INSTITUTE OF CHEMICAL TECHNOLOGY, Daejeon (KR)

(72) Inventors: Sang Il Seok, Daejeon (KR); Sang Hyuk Im, Daejeon (KR); Jun Hong Noh, Daejeon (KR); Jin Hyuck Heo, Busan (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 576 days.

(21) Appl. No.: 14/427,502

(22) PCT Filed: Sep. 12, 2013

(86) PCT No.: PCT/KR2013/008270
§ 371 (c)(1),
(2) Date: Mar. 11, 2015

(87) PCT Pub. No.: WO2014/042449
PCT Pub. Date: Mar. 20, 2014

(65) Prior Publication Data
US 2015/0228415 A1 Aug. 13, 2015

(30) Foreign Application Priority Data
Sep. 12, 2012 (KR) .................. 10-2012-0101192

(51) Int. Cl.
*H01G 9/20* (2006.01)

(52) U.S. Cl.
CPC .......... *H01G 9/209* (2013.01); *H01G 9/2027* (2013.01)

(58) Field of Classification Search
CPC .................................................. H01L 51/4226
USPC .................................................. 136/243–265
See application file for complete search history.

(56) References Cited

U.S. PATENT DOCUMENTS

| 6,987,071 B1 | 1/2006 | Bollman et al. |
| 7,511,217 B1 * | 3/2009 | Roscheisen ............ B82Y 10/00 136/256 |
| 2005/0121068 A1 * | 6/2005 | Sager .................. H01L 51/4213 136/252 |

(Continued)

FOREIGN PATENT DOCUMENTS

| JP | 2002-075470 A | 3/2002 |
| JP | 2003-217688 A | 7/2003 |

(Continued)

OTHER PUBLICATIONS

Jeong Ah Chang, et al; "High-Performance Nanostructured Inorganic-Organic Heterojunction Solar Cells", Nano Letters, vol. 10, pp. 2609-2612; Published on Web: May 28, 2010.

(Continued)

*Primary Examiner* — Niki Bakhtiari

(57) ABSTRACT

Provided is a solar cell including: a first electrode; a composite layer positioned on the first electrode and including a light absorber impregnated thereinto; a light absorption structure positioned on the composite layer and composed of a light absorber; a hole conductive layer positioned on the light absorption structure; and a second electrode positioned on the hole conductive layer.

12 Claims, 11 Drawing Sheets

(56) References Cited

U.S. PATENT DOCUMENTS

| | | | | |
|---|---|---|---|---|
| 2010/0300515 A1* | 12/2010 | Monden | ............... | H01G 9/2031 136/252 |
| 2015/0122314 A1* | 5/2015 | Snaith | ................ | H01L 51/4213 136/255 |
| 2015/0200377 A1* | 7/2015 | Etgar | .................. | H01L 51/4226 136/256 |

FOREIGN PATENT DOCUMENTS

| | | |
|---|---|---|
| JP | 2005-244159 A | 9/2005 |
| JP | 2005-310388 A | 11/2005 |
| JP | 2007-027171 A | 2/2007 |
| JP | 2008-021582 A | 1/2008 |
| JP | 2009-520861 | 5/2009 |
| JP | 2011-065751 A | 3/2011 |
| KR | 20110095215 A | 8/2011 |
| KR | 101172534 B1 | 8/2012 |
| WO | 2004/044948 A2 | 5/2004 |
| WO | 2004/044948 A3 | 5/2004 |
| WO | 2015/031944 A1 | 3/2015 |

OTHER PUBLICATIONS

Yafit Itzhaik, et al; "$Sb_2S_3$-Sensitized Nanoporaus $TiO_2$ Solar Cells", The Journal of Physical Chemistry C Letters, vol. 113, pp. 4254-4256; XP-002604892.; Published on Web Feb. 20, 2009.

Extended European Search Report dated Apr. 22, 2016; Appln. No. 13836764.4-1555/2897178 PCT/KR2013008270.

Hui-Seon Kim, et al; "Lead Iodide Perovskite Sensitized All-Solid-State Submicron Thin Film Mesoscopic Solar Cell with Efficiency Exceeding 9%", Scientific Reports; Published Aug. 21, 2012; pp. 1-7.

Lin Min-Xian; "Introduction to Solar Cell Techniques" 12.2.5 Counter Electrode Section, pp. 11-12; Jan. 2008.

U. Bach, et al; "Solid-state dye-sensitized mesoporous $TiO_2$ solar cells with high photon-to-electron conversion efficiencies" Nature, vol. 395, Oct. 8, 1998; pp. 583-585.

Zhicai He, et al; "Simultaneous Enhancement of Open-Circuit Voltage, Short-Circuit Current Density, and Fill Factor in Polymer Solar Cells", Advanced Materials, vol. 23, pp. 4636-4643; Sep. 9, 2011.

Sang Hyuk Im, et al; "Toward Interaction of Sensitizer and Functional Moieties in Hole-Transporting Materials for Efficient Semiconductor-Sensitized Solar Cells", Nano Letters, vol. 11, pp. 4789-4793; Published Sep. 30, 2011.

Akihiro Kojima, et al; "Organometal Halide Perovskites as Visible-Light Sensitizers for Photovoltaic Cells", J. Am. Chemical Society, vol. 131, pp. 6050-6051, Published on Web Apr. 14, 2009.

Jeong-Hyerok Im, et al; "6.5% efficient perovskite quantum-dot sensitized solar cell", Nanoscale, vol. 3, pp. 4088-4093; First published online Sep. 7, 2011.

Koichi Tamaki, et al; "Dye-Sensitized Solar Cells by Directly-Linked Heterometallic Porphyrin Dimers", 214th ECS Meeting, Oct. 2008, Honolulu, Hawaii; Abstract #349.

Sanjun Zhang, et al; "Synthesis and optical properties of novel organic-inorganic hybrid nanolayer structure semiconductors", Acta Materialia; vol. 57, pp. 3301-3309; Available online May 4, 2009; pp. 3301-3309.

Japanese Office Action dated Feb. 12, 2016; Appln. No. 2015-531854.

Jin Hyuck Heo, et al; "Efficient inorganic-organic hybrid heterojunction solar cells containing perovskite compound and polymeric hole conductors", Nature photonics, vol. 7, Jun. 2013; 7 pages, published online May 5, 2013.

European Office Action dated Nov. 8, 2018; Appln No. 13 836 764.4.

Japanese Office Action dated Nov. 6, 2018; Appln. No. 2017-201595.

* cited by examiner

SOLAR CELL HAVING LIGHT-ABSORBING STRUCTURE

TECHNICAL FIELD

The following disclosure relates to a solar cell, and more particularly, to a solar cell having a new structure capable of having excellent photovoltaic efficiency due to excellent separation and collection efficiency of photoelectrons and photoholes generated by light absorption, and a manufacturing method thereof.

BACKGROUND

In order to solve exhaustion of fossil energy and earth-environmental problems by using fossil energy, research into alternative energy sources such as solar energy, wind energy, and hydro energy that are recyclable and clean has been actively conducted.

Among them, an interest in a solar cell directly converting solar lights into electric energy has significantly increased. Here, the solar cell means a cell generating current-voltage using a photovoltaic effect that the cell absorbs light energy from the solar lights to generate electrons and holes.

Currently, a n-p diode type single-crystalline silicon (Si) based solar cell having photoelectric conversion efficiency higher than 20% may be manufactured and actually used in solar power generation, and a solar cell using a compound semiconductor such as GaAs having conversion efficiency higher than that of the n-p diode type single-crystalline silicon (Si) based solar cell is present. However, since these inorganic semiconductor based solar cells require a significantly highly purified material for high efficiency, a large amount of energy is consumed in purifying a raw material, and expensive processing equipment is required during a single crystallization process or a thinning process using the raw material, such that there is a limitation in lowering a manufacturing cost of the solar cell, thereby blocking large-scale use of the solar cell.

Therefore, in order to manufacture the solar cell at low cost, a cost of a core material used in the solar cell or the manufacturing process of the solar cell should be greatly reduced, and research into a dye-sensitized solar cell (DSSC) and an organic solar cell that may be manufactured using an inexpensive material and process has been actively conducted as an alternative to the inorganic semiconductor based solar cell.

The dye-sensitized solar cell (DSSC) was initially developed by Michael Gratzel in 1991, a professor at EPFL in Switzerland and was reported in Nature.

An early dye-sensitized solar cell had a simple structure in which a dye absorbing light was loaded on porous photoanodes on a transparent electrode film through which light and electricity flow, another conductive glass substrate was positioned on the film, and a liquid electrolyte was filled therebetween.

An operation principle of the dye-sensitized solar cell is as follows. When dye molecules chemically adsorbed on surfaces of the porous photoanodes absorb solar light, the dye molecules generate electron-hole pairs, and electrons are injected into a conduction band of semiconducting oxides used as the porous photoanodes to be transported to the transparent conductive film, thereby generating current. The holes remaining in the dye molecules configure a complete solar cell circuit in a shape in which the holes are transported to photocathodes by hole conduction due to oxidation-reduction reaction of a liquid or solid electrolyte or a hole-conductive polymer, thereby performing external work.

In this dye-sensitized solar cell configuration, the transparent conductive film was mainly made of fluorine doped tin oxide (FTO) or indium doped tin oxide (ITO), and nanoparticles having a broad bandgap are used as the porous photoanodes.

As the dye, various materials capable of absorbing light particularly well and easily separating an exciton generated by the light due to a lowest unoccupied molecular orbital (LUMO) energy level that is higher than an energy level of the conduction band of the photoanode material to thereby increase the efficiency of the solar cell are chemically synthesized and used. The maximum efficiency of a liquid type dye-sensitized solar cell reported up to now has been 11 to 12% for about last 20 years. The liquid type dye-sensitized solar cell has relatively high efficiency, such that there is a possibility that the liquid type dye-sensitized solar cell will be commercialized. However, there are problems in stability according to the time by a volatile liquid electrolyte and reducing a cost due to using a high-cost ruthenium (Ru) based dye.

In order to solve these problems, research into uses of a non-volatile electrolyte using an ionic solvent rather than the volatile liquid electrolyte, a gel-type polymer electrolyte, and an inexpensive pure organic dye has been conducted, but there is a problem in that efficiency of a dye-sensitized solar cell using these materials is lower than that of the dye-sensitized solar cell using the volatile liquid electrolyte and the Ru based dye.

Meanwhile, an organic photovoltaic (OPV) that has been studied in earnest since the mid-1990 is configured of organic materials having electron donor (D, or often called a hole acceptor) characteristics and electron acceptor (A) characteristics. When the solar cell made of organic molecules absorbs the light, electrons and holes are formed, which are called exciton. The exciton moves to a D-A interface, such that an electric charge is separated, an electron moves to the electron acceptor, and the hole moves to the electron donor, thereby generating photo current.

Since a distance at which the exciton generated in the electron donor may move is about 10 nm, which is significantly short, photo active organic materials may not be thickly laminated, such that optical absorbance was low and the efficiency was low. However, recently, due to introduction of a so-called bulk heterojunction (BHJ) concept of increasing a surface area at an interface and development of an electron donor organic material having a small band gap to easily absorb solar lights in a wide range, the efficiency was significantly increased, such that an organic photovoltaic having efficiency higher than 8% has been reported (Advanced Materials, 23 (2011) 4636).

In the organic photovoltaic, a manufacturing process of a device is simple due to high formability of the organic material, diversity thereof, and a low cost thereof, such that the organic photovoltaic may be manufactured at a low cost, as compared to the existing solar cell. However, the organic photovoltaic has a problem in that a structure of the BHJ is degraded by moisture in air or oxygen, which rapidly decreases the efficiency of the solar cell, that is, a problem in the stability of the solar cell. When a technology of completely sealing the solar cell is introduced in order to solve this problem, the stability may be increased, but a cost may also be increased.

As a method of solving a problem of the dye-sensitized solar cell (DSSC) by the liquid electrolyte, an all-solid state DSSC using Spiro-OMeTAD [2,2',7,7'-tetrkis (N,N-di-p-methoxyphenylamine)-9,9'-spirobi fluorine], which is a solid state hole conductive organic material, rather than the liquid electrolyte to thereby have efficiency of 0.74% was reported in Nature in 1998 by Michael Gratzel, a chemistry professor at EPFL in Switzerland, who is an inventor of the DSSC. Thereafter, the efficiency was increased up to about 6% by optimizing the structure, improving interfacial properties, and improving hole conductivity, and the like. In addition, a solar cell using a cheap pure organic dye instead of the ruthenium based dye and using poly(3-hexylthiophene) (P3HT), poly(3,4-ethylenedioxythiophene) (PEDOT), or the like, as a hole conductor has been manufactured, but efficiency of this solar cell is still low at 2 to 7%.

Further, research into a solar cell using quantum dot nanoparticles as a light absorber rather than the dye and using a hole conductive inorganic material or organic material rather than the liquid electrolyte has been reported. A plurality of solar cells using CdSe, PbS, or the like, as the quantum dot and using a conductive polymer such as spiro-OMeTAD or P3HT as the hole conductive organic material have been reported, but efficiency thereof were still significantly low at 5% or less. Further, a fact that a solar cell using $Sb_2S_3$ as the light absorbing inorganic material and using poly[2,6-(4,4-bis-(2-ethylhexyl)-4H-cyclopenta[2,1-b;3,4-b']dithiophene)-alt-4,7-(2,1,3-benxothiadiazole)] (PCPDTBT) as the hole conductive organic material has efficiency of about 6% has been reported [Nano Letters, 11 (2011) 4789], but it has not been reported that the efficiency is further improved.

In addition, currently, as a promising solar cell among solar cells capable of being manufactured by a solution method, a solar cell using copper zinc tin chalcogenides (CZTS/Se) or copper indium gallium chalcogenides (CIGS/Se) has been studied, but efficiency thereof was only about 11%. In addition, there were problems in that the resource such as indium is limited, a material having high toxicity such as hydrazine was used, a secondary heat treatment process at a high temperature was required, and stability and reproducibility may be deteriorated due to high volatility of chalcogen elements and it was difficult to perform long-term heat treatment at a high temperature due to the chalcogen element, such that there was a limitation in manufacturing coarse grains by the solution method.

As described above, in order to replace the semiconductor based solar cell, various solar cells such as an organic solar cell, a dye-sensitized solar cell, an inorganic quantum dot-sensitized solar cell, and an organic/inorganic hybrid type solar cell suggested by the present applicants (Korean Patent Registration No. 1172534) have been suggested, but there was a limitation in replacing the semiconductor based solar cell in view of efficiency.

RELATED ART DOCUMENT

Patent Document

Korean Patent No. 1172534

Non-Patent Document

Advanced Materials, 23 (2011) 4636
Nano Letters, 11 (2011) 4789
J. Am. Chem. Soc., 131 (2009) 6050

SUMMARY

An embodiment of the present invention is directed to providing a solar cell having a new structure capable of having excellent separation efficiency of photoelectrons and photoholes produced by light absorption from each other, preventing the photoholes from being lost by recombination, directionally moving the photoholes, having an increased photoactive region, being simply and easily manufactured, and being mass-produced at a low cost, and a manufacturing method thereof.

In one general aspect, there is provided a solar cell including: a first electrode; a composite layer positioned on the first electrode and including a light absorber impregnated thereinto; a light absorption structure positioned on the composite layer and composed of a light absorber; a hole conductive layer positioned on the light absorption structure; and a second electrode positioned on the hole conductive layer.

The light absorption structure may satisfy the following Correlation Equation 1.

$$0.05 \le C_{ov}/S_{urf} \le 1 \qquad \text{(Correlation Equation 1)}$$

(In Correlation Equation 1, $S_{urf}$ is the entire surface area of a surface of the composite layer on which the light absorption structure is positioned, $C_{ov}$ is a surface area of the composite layer covered by the light absorption structure.)

$C_{ov}/S_{urf}$ ($S_{urf}$ is the entire surface area of a surface of the composite layer on which the light absorption structure is positioned, $C_{ov}$ is a surface area of the composite layer covered by the light absorption structure) corresponding to a surface coverage of the composite layer by the light absorption structure may be 0.25 to 1.

$C_{ov}/S_{urf}$ ($S_{urf}$ is the entire surface area of a surface of the composite layer on which the light absorption structure is positioned, $C_{ov}$ is a surface area of the composite layer covered by the light absorption structure) corresponding to a surface coverage of the composite layer by the light absorption structure may be 0.7 to 1.

The light absorption structure may include a light absorber pillar, a light absorber thin film, and a light absorber pillar protruding on the light absorber thin film.

A shape of the light absorber pillar may be a column, a plate, a needle, a wire, a rod, or a mixture thereof.

The light absorber thin film may be a dense film, a porous film, or a laminate film thereof.

The light absorption structure may include a wire web structure in which light absorber wires are irregularly entangled with each other.

The light absorption structure may include a light absorber thin film having a thickness of 1 to 2000 nm.

The light absorption structure may include a light absorber thin film having a thickness of 50 to 800 nm.

The light absorption structure may be extended from the composite layer.

The light absorption structure may be formed simultaneously with the light absorber of the composite layer by a single process of a solution application method using a light absorber solution.

The composite layer may include a porous metal oxide layer into which the light absorber is impregnated.

A thickness of the porous metal oxide layer may be 50 nm to 10 μm.

A thickness of the porous metal oxide layer may be 50 nm to 800 nm.

A porosity of the porous metal oxide layer may be 30 to 65%.

The solar cell may further include a metal oxide thin film positioned between the first electrode and the composite layer.

The light absorber of the composite layer and the light absorber of the light absorption structure may each independently include one or at least two materials selected from inorganic-organic hybrid perovskite compounds, CdS, CdSe, CdTe, PbS, PbSe, PbTe, $Bi_2S_3$, $Bi_2Se_3$, InP, InAs, InGaAs, ZnSe, ZnTe, GaN, GaP, GaAs, GaSb, InSb, Si, Ge, AlAs, AlSb, $InCuS_2$, $In(CuGa)Se_2$, $Sb_2S_3$, $Sb_2Se_3$, $Sb_2Te_3$, $SnS_x(1 \leq x \leq 2)$, NiS, CoS, $FeS_x(1 \leq x \leq 2)$, $In_2S_3$, MoS, MoSe, $Cu_2S$, HgTe, and MgSe.

The light absorber of the composite layer and the light absorber of the light absorption structure may each independently include one or at least two materials selected from inorganic-organic hybrid perovskite compounds satisfying the following Chemical Formula 1 or 2.

$$AMX_3 \quad \text{(Chemical Formula 1)}$$

(In Chemical Formula 1, A is a monovalent organic ammonium ion or $Cs^+$, M is a divalent metal ion, and X is a halogen ion.)

$$A_2MX_4 \quad \text{(Chemical Formula 2)}$$

(In Chemical Formula 2, A is a monovalent organic ammonium ion or $Cs^+$, M is a divalent metal ion, and X is a halogen ion.)

A hole transporting material of the hole conductive layer may be an organic hole transporting material.

A hole transporting material of the hole conductive layer may be a monomer or polymer.

A hole transporting material of the hole conductive layer may be one or at least two selected from thiophen based hole conductive polymers, para-phenylene vinylene based hole conductive polymers, carbazole based hole conductive polymers, and triphenylamine based hole conductive polymers.

The hole transporting material of the hole conductive layer may be one or at least two selected from thiophen based hole conductive polymers and triphenylamine based hole conductive polymers.

The hole transporting material of the hole conductive layer may include an organic material satisfying the following Chemical Formula 3.

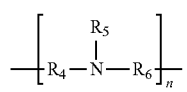

(Chemical Formula 3)

In Chemical Formula 3, $R_4$ and $R_6$ each are independently (C6-C20)arylene, $R_5$ is (C6-C20)aryl, $R_3$ to $R_6$ each are independently substituted with at least one selected from a group consisting of halogen, (C1-C30)alkyl substituted or unsubstituted with halogen, (C6-C30)aryl, (C2-C30)heteroaryl substituted or unsubstituted with (C6-C30)aryl, 5- to 7-membered heterocycloalkyl, 5- to 7-membered heterocloalkyl fused with at least one aromatic ring, (C3-C30)cycloalkyl, (C6-C30)cycloalkyl fused with at least one aromatic ring, (C2-C30)alkenyl, (C2-C30)alkinyl, cyano, carbazolyl, (C6-C30)ar(C1-C30)alkyl, (C1-C30)alkyl(C6-C30)aryl, nitro, and hydroxyl, and n is a natural number of 2 to 100,000.

The metal oxide of the porous metal oxide layer may be one or at least two selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, Sr—Ti oxide, and a composite thereof.

The light absorber of the composite layer may be filled in pores of the porous metal oxide layer.

A hole transporting material of the hole conductive layer may not be present in the composite layer.

The solar cell may further include a flexible substrate positioned under the first electrode or on the second electrode.

In another general aspect, there is provided a solar cell including: a first electrode; a composite layer positioned on the first electrode and having a structure in which an electron transporting material and a light absorber are impregnated with each other; a light absorption structure positioned on the composite layer and composed of a light absorber; a hole conductive layer positioned on the light absorption structure; a second electrode positioned on the hole conductive layer.

The solar cell may further include an electron transporting film between the first electrode and the composite layer.

The light absorption structure may include a light absorber thin film.

A hole transporting material of the hole conductive layer and the light absorption structure may have a structure in which they are impregnated with each other.

The light absorber thin film may include a porous film.

In another general aspect, there is provided a solar cell module including the solar cell as described above.

In another general aspect, there is provided a device supplied with power by the solar cell as described above.

DETAILED DESCRIPTION OF MAIN ELEMENTS

Figure 1:
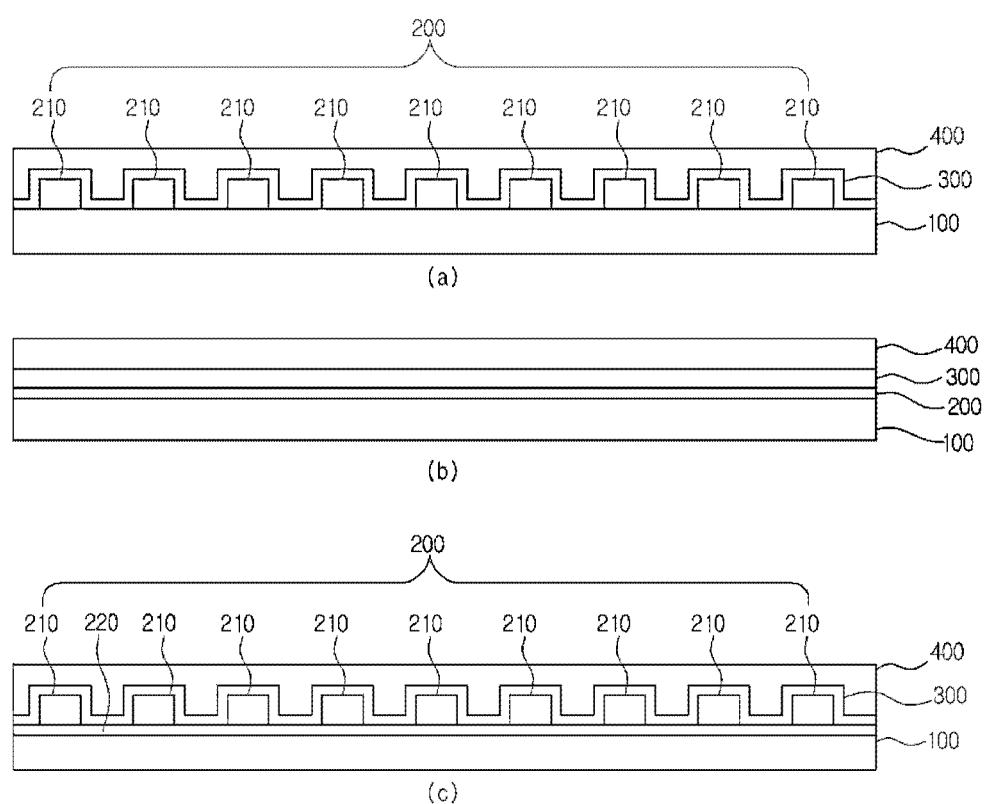
FIGS. 1A to 1C are cross-sectional views showing examples of a solar cell according to an exemplary embodiment of the present invention.
Figure 2:
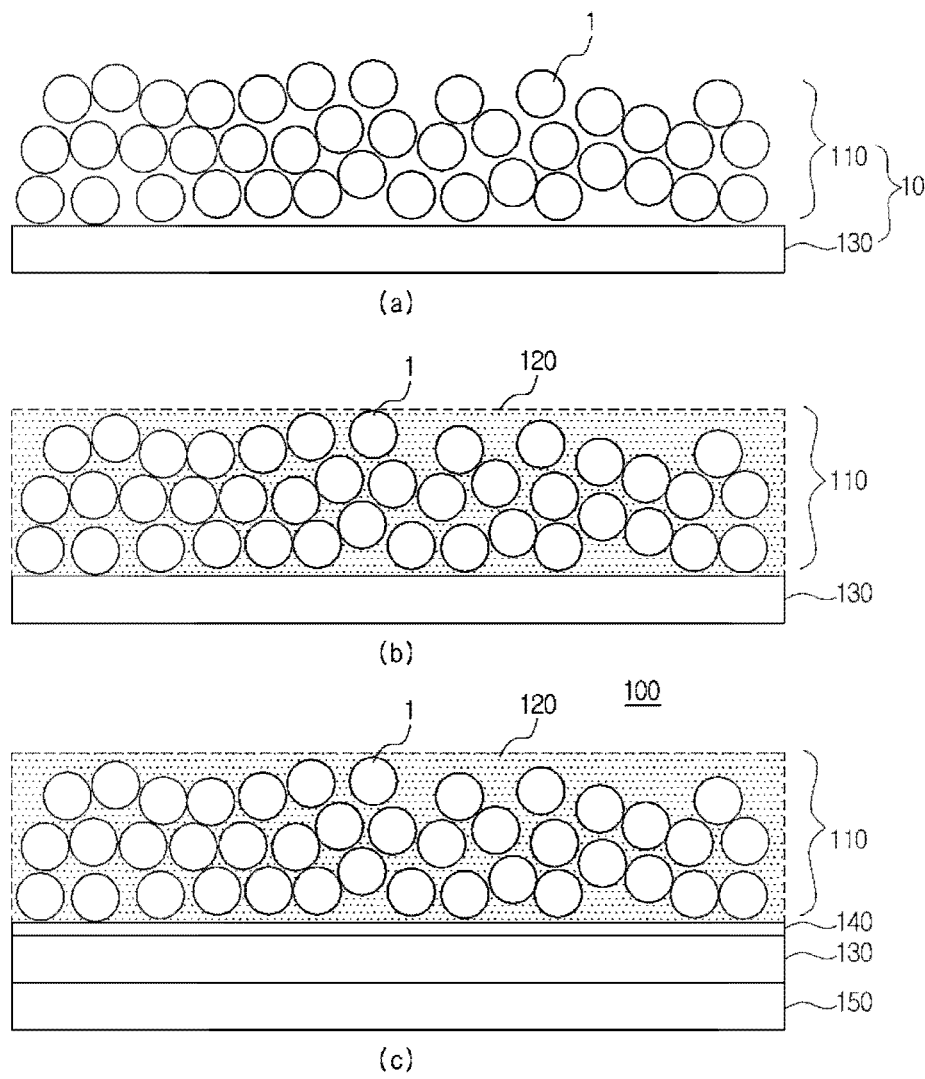
FIGS. 2A to 2C are cross-sectional views showing examples of a composite layer in detail in the solar cell according to the exemplary embodiment of the present invention.

100: Composite layer
10: Porous electrode
110: Porous metal oxide layer
1: Metal oxide particle
120: Light absorber
130: First electrode
140: Metal oxide thin film
150: Substrate
200: Light absorption structure
210: Pillar
211: Pillar stump
220: Aggregation structure body
300: Hole conductive layer
400: Second electrode

DETAILED DESCRIPTION OF EMBODIMENTS

Hereinafter, a solar cell according to present invention will be described in detail with reference to the accompanying drawings. Here, technical terms and scientific terms used in the present specification have a general meaning understood by those skilled in the art to which the present invention pertains unless otherwise defined, and a description for the known function and configuration obscuring the present invention will be omitted in the following description and the accompanying drawings.

In a dye-sensitized solar cell or quantum dot-sensitized solar cell field, a structure in which a dye or quantum dot absorbing light to generate a photoelectron-photohole pair is uniformly dispersed in and attached to a porous supporter, and pores of the porous supporter to which the dye or quantum dot is attached are filled with a redox pair based hole conductive liquid or a hole transporting material is considered as the most suitable structure for improving efficiency of the solar cell. The reason is that a supported amount of light absorber such as the dye or quantum dot may be increased by increasing a specific surface area of the porous supporter, and the light absorber has a structure in which the light absorber simultaneously contact an electron transporting material and a hole transporting material, such that the photoelectron and the photohole may be effectively separated from each other.

However, the present applicant found that efficiency of a solar cell may be significantly improved by a structure in which the light absorber fills in a porous electron transporting material, and a light absorption structure made of the light absorber is positioned on the porous electron transporting material, preferably a structure in which the light absorber covers an upper portion of the porous electron transporting material as compared to a structure in which the light absorber is dispersed and impregnated in the porous electron transporting material, and conducted further studies on this structure, thereby completing the present invention.

The solar cell according to the present invention may include a first electrode; a composite layer positioned on the first electrode and including a light absorber impregnated thereinto; a light absorption structure positioned on the composite layer and made of the light absorber; a hole conductive layer position on the light absorption structure; and a second electrode positioned on the hole conductive layer.

In the solar cell according to the exemplary embodiment of the present invention, the light absorption structure made of the light absorber may include a light absorber pillar, a light absorber thin film or a light absorber pillar protruding on a light absorber thin film.

In the solar cell according to the exemplary embodiment of the present invention, the composite layer into which the light absorber is impregnated may include the light absorber; and a metal oxide functioning as an electron transporting material and/or a supporter of the light absorber. The metal oxide of the composite layer may be a porous metal oxide in which metal oxides form a continuum having a porous structure. In detail, the composite layer may include the porous metal oxide layer having open pores and include the porous metal oxide layer impregnated with the light absorber through the pores. Hereinafter, a structure in which the light absorber is impregnated into the porous metal oxide is referred to as the composite layer, and a structure including the first electrode and the composite layer positioned on the first electrode is referred to as a porous electrode.

The solar cell according to the present invention may have excellent power conversion efficiency by the light absorption structure positioned on the composite layer, and more specifically, power conversion efficiency increased by at least 50% as compared to a solar cell having a structure in which the light absorption structure is not present on the composite layer but the light absorber is impregnated into the porous metal oxide layer.

In detail, the solar cell according to the present invention may have the power conversion efficiency at 10 to 17.3% by the light absorption structure, and this power conversion efficiency (17.3%) is the maximum power conversion efficiency that has never been reported up to now in an organic solar cell using a conductive polymer, a dye-sensitized solar cell, and an organic-inorganic hybrid solar cell using an inorganic semiconductor nanoparticle as a light absorber and a hole conductive organic material as a hole transporting material.

The present applicant found through various experiments that the power conversion efficiency may be significantly improved by the light absorption structure and at the same time, the power conversion efficiency may be changed according to the shape and size of the light absorption structure and the surface coverage of the composite layer by the light absorption structure defined as the following Correlation Equation 1. Particularly, the present applicant found that the coverage by the light absorption structure may have a large influence on the power conversion efficiency.

In the solar cell according to the exemplary embodiment of the present invention, the light absorption structure may satisfy the following Correlation Equation 1.

$$0.05 \leq C_{ov}/S_{urf} \leq 1 \quad \text{(Correlation Equation 1)}$$

In Correlation Equation 1, $S_{urf}$ is the entire surface area of one surface of the composite layer on which the light absorption structure is positioned, and $C_{ov}$ is a surface area of the composite layer covered by the light absorption structure.

That is, the light absorption structure may be positioned so as to contact one surface of the composite layer and a surface area corresponding to 5 to 100% of one surface may be covered by the light absorption structure, based on one surface of the composite layer on which the light absorption structure is positioned.

The light absorption structure may satisfy the following Correlation Equation 1-1, such that the solar cell may have power conversion efficiency of at least 10%.

$$0.25 \leq C_{ov}/S_{urf} \leq 1 \quad \text{(Correlation Equation 1-1)}$$

The light absorption structure may satisfy the following Correlation Equation 1-2, such that the solar cell may have power conversion efficiency of at least 15%.

$$0.7 \leq C_{ov}/S_{urf} \leq 1 \quad \text{(Correlation Equation 1-2)}$$

In the solar cell according to the exemplary embodiment of the present invention, the light absorption structure may include the light absorber pillar, the light absorber thin film, or the light absorber pillar protruding on the light absorber thin film, wherein the light absorber thin film may include a porous film, a dense film, or a laminate film on which the porous film and the dense film are laminated, and the light absorber pillar protruding on the light absorber thin film may mean a light absorber thin film having a protrusion structure. In this case, a lower region of the protrusion structure may configure the light absorber thin film. This light absorption structure may have an extended structure from the composite layer.

The extended structure may mean a structure in which the composite layer and the light absorption structure are physically bonded to each other. In detail, the extended structure may mean a structure in which the metal oxide of the composite layer (metal oxide of the porous metal oxide layer) and/or the light absorber of the composite layer and the light absorber of the light absorption structure are physically bonded to each other. The physically bonded structure may mean a structure in which the metal oxide of the composite layer (metal oxide of the porous metal oxide layer) and/or the light absorber of the composite layer and the light absorber of the light absorption structure contact each other as a grain boundary phase or continuous phase.

In view of a manufacturing method, the structure in which the light absorption structure is extended from the composite layer may mean that the light absorption structure is formed simultaneously with the light absorber contained in the composite layer by a single process or the light absorption structure is grown from the light absorber contained in the composite layer by using the light absorber contained in the composite layer as a nucleation site or a seed.

Describing this structure in connection with the shape of the light absorption structure, the extended structure as described above may mean a structure in which the pillar of the light absorption structure is bonded to the composite layer while contacting the composite layer or a structure in which one surface of the thin film of the light absorption structure is bonded integrally with the composite layer while contacting the composite layer.

That is, the extended structure may mean a structure in which the light absorption structure and the composite layer are physically integrated with each other, a structure in which the light absorption structure and the light absorber contained in the composite layer are physically integrated with each other, a structure in which the light absorption structure is formed by being grown from the composite layer, or a structure in which the light absorption structure is formed by being grown from the light absorber contained in the composite layer.

As described above, the light absorption structure has the extended structure from the composite layer, such that a loss by scattering at the time of movement of the photohole and photoelectron between the composite layer and the light absorption structure may be prevented.

In the solar cell according to the exemplary embodiment of the present invention, the light absorption structure may include the light absorber pillar, the light absorber thin film or the light absorber pillar protruding on the light absorber thin film.

The light absorber pillar of the light absorption structure may mean a protrusion part made of the light absorber and having an arbitrary shape, and the protrusion part (pillar) may have a column shape, a plate shape, a needle shape, a wire shape, a rod shape, or a mixed shape thereof.

In detail, the light absorber pillar having the column shape may have an irregular unevenness, but a cross section thereof may macroscopically have a polygonal, circular, or oval shape, and one end of the column may be bonded to the composite layer or a light absorber film. However, the shape of the light absorber pillar is not limited to the light absorber pillar macroscopically having the column shape, and the column shaped pillar may have an aspect ratio (in the case of the column shape, it is equal to a ratio of a length in a first direction to a length in a second direction to be described below) of 1 or more and include an aggregation structure in which a macroscopic shape thereof is not clearly defined by irregular surface unevenness.

In detail, the light absorber pillar having the plate shape may be irregularly uneven, but a cross section thereof may macroscopically have a polygonal, circular, or oval shape, and one end of the plate may be bonded to the composite layer or the light absorber film. However, the shape of the light absorber pillar is not limited to the light absorber pillar macroscopically having the plate shape, and the plate shaped pillar may have an aspect ratio (in the case of the plate shape, it is equal to a ratio of a length in a first direction to a length in a second direction to be described below) less than 1 and include an aggregation structure in which a macroscopic shape thereof is not clearly defined by irregular surface unevenness.

In this case, a direction from the first electrode to the second electrode, which are two electrodes of the solar cell facing each other, may be defined as the first direction, and a direction parallel to the first electrode may be defined as the second direction. In the case in which the length in the first direction is larger than the length in the second direction, the shape may be considered as the column shape, and in the case in which the length in the first direction is smaller than the length in the second direction, the shape may be considered as the plate shape.

In detail, the light absorber pillar having the needle shape may have a lens shape and a shape in which a cross-sectional area thereof is continuously or discontinuously changed according to the length. That is, the needle shaped light absorber pillar may have an aspect ratio more than 1 and a shape in which the cross-sectional area thereof may be changed in a long axis direction. As a specific example, the needle shaped light absorber pillar may have a shape in which a cross-sectional area at at least one end is smaller than that at the center (the center of the long axis) or cross-sectional areas at both ends are smaller than that at the center (the center of the long axis).

In detail, the wire or rod shaped light absorber pillar may have an aspect ratio more than 1 and a shape in which a cross-sectional area is constant in a long axis direction. Here, in the case in which a cross section of the short axis has a large diameter of micrometer (μm) order, the shape may be considered as the rod shape, and in the case in which the cross section has a smaller diameter, more specifically a diameter of several to several hundred nanometer (nm) order, the shape may be considered as the wire shape.

In this case, pillars having at least two shapes selected from the above-mentioned column shape, plate shape, needle shape, wire shape, and rod shape may be mixed in the light absorption structure. In addition, a plurality of pillars having one or at least two shapes selected from the above-mentioned column shape, plate shape, needle shape, wire shape, and rod shape may irregularly contact each other in the light absorption structure. As a specific example, the light absorption structure may include a wire web structure in which the wire shape light absorber pillars are irregularly entangled with each other.

In the case in which the light absorption structure includes the light absorber pillar, the light absorption structure may include the column shaped light absorber pillar, the plate shaped light absorber pillar, the wire shaped light absorber pillar including the wire web structure, or the mixed shape thereof. The reason is that more excellent power conversion efficiency, specifically, power conversion efficiency of 12% or more, and more specifically, 15% or more may be obtained due to excellent (high) surface coverage of the composite layer, smooth movement of the photohole and/or photoelectron to the composite layer, and an increase in a contact area with the hole conductive layer.

In the case in which the light absorption structure on the composite layer has the protrusion structure, that is, the pillar structure, a detailed protrusion shape is defined as the column shape, the plate shape, the needle shape, the wire shape, or the rod shape and then described, but these shapes are illustratively provided in order to assist in clear understanding the light absorption structure according to the exemplary embodiment of the present invention. Therefore, the shape of the light absorption structure having the protrusion structure is not limited to the column shape, the plate shape, the needle shape, the wire shape, or the rod shape as dictionary meaning, and an equivalent or similar modified structure may be included in the present invention.

In the case in which the light absorption structure on the composite layer has the protrusion structure, that is, the pillar structure, a size or thickness is not particularly limited. However, in the case of the column or plate shaped light absorber pillar, a diameter (a length in the second direction) of the pillar may be preferably 100 to 100,000 nm, and a thickness (a length in the first direction) of the pillar may be preferably 10 to 1,000 nm, and in the case of the needle or rod shaped light absorber pillar, a length of a long axis of the pillar may be preferably 500 to 100,000 nm, and a length of a short axis of the pillar may be preferably 100 to 10,000 nm. Further, in the case of the wire shaped light absorber pillar, a length of a long axis of the pillar may be preferably 50 to 10,000 nm. The reason is that as the size or thickness of the pillar may mainly affect a moving path of the photohole moving through the light absorption structure, the size and thickness of the pillar may affect movement easiness of the photohole moving from the light absorber of the composite layer to the pillar, that is, an internal movement length of the photohole moving from the light absorber of the composite layer to the pillar and affect interfacial resistance between the pillar and the composite layer. The photohole may move from the composite layer to the pillar via a shorter path by the pillar having the above-mentioned size, the contact area between the composite layer and pillar may be increased, and photohole annihilation in the pillar may be effectively prevented while increasing a photoactive region by the pillar.

Further, the light absorber of the composite layer and the light absorption structure may be simultaneously formed by the single process or the light absorption structure may be grown from the light absorber to thereby have the extended structure therefrom, such that one end or a side of the pillar may be positioned in the composite layer. More specifically, in the case in which the light absorption structure includes the column shaped and/or plate shaped pillar, the pillar may have a structure in which one end of the pillar is buried in the composite layer. That is, as the light absorption structure may be formed simultaneously with the light absorber contained in the composite layer by the single process (applying and drying a solution in which the light absorber is dissolved), or the light absorption structure may be grown from the light absorber contained in the composite layer, one end of the pillar toward the composite layer may be positioned on the surface of the composite layer or in the composite layer, and the other end of the pillar may protrude upwardly from the surface of the composite layer to form the protrusion structure. The structure in which one end of the pillar is buried in the light absorber may improve separation and movement efficiency of the photoelectrons generated in the light absorption structure.

As described above, in the case in which the light absorption structure includes the light absorber pillar, the surface coverage ($=C_{ov}/S_{urf}$) of the composite layer by the pillar, which is an area ratio of the composite layer covered by the light absorber pillar, may be changed according to the density and size of the light absorber pillar. The surface coverage of the composite layer by the pillar as described above may significantly affect the power conversion efficiency of the solar cell.

When the surface coverage ($=C_{ov}/S_{urf}$) of the composite layer by the pillar protruding on the composite layer is at least 5% ($C_{ov}/S_{urf}=0.05$) of the surface area, based on the entire surface area of an upper surface of the composite layer on which the light absorption structure is positioned, the power conversion efficiency may be increased by the pillar, and preferably, the surface coverage may be 10% ($C_{ov}/S_{urf}=0.1$) or more. In the case in which the surface coverage of the composite layer by the pillar is 25% ($C_{ov}/S_{urf}=0.25$) or more, the solar cell may have power conversion efficiency of 10% or more, and in the case in which the surface coverage of the composite layer by the pillar is 70% ($C_{ov}/S_{urf}=0.70$) or more, the solar cell may have power conversion efficiency of 15% or more. In this case, when the density of the pillar is significantly high, the light absorption structure has a structure corresponding to a structure of a light absorber thin film having a porous or almost dense film rather than a structure of independent pillars spaced apart from each other, such that the upper limit of the surface coverage of the composite layer by the pillar may approach 100% ($C_{ov}/S_{urf}=1$). However, in the case of dividing significantly high-density pillars and the porous film from each other based on whether or not the continuum is formed, that is, in the case of limiting the pillars to independent protrusion structures not forming the continuum but being spaced apart from each other (that is, independent pillars spaced apart from each other), the upper limit of the surface coverage of the composite layer by the pillar may be changed according to the specific size and shape of the pillar but be 80% ($C_{ov}/S_{urf}=0.80$), specifically 75% ($C_{ov}/S_{urf}=0.75$), and more specifically 70% ($C_{ov}/S_{urf}=0.70$).

As a non-restrictive and specific example of the light absorption structure, in view of the high surface coverage of the composite layer by the pillar as described above, prevention of annihilation due to recombination at the time of movement of the photoelectron/photohole, a smooth interfacial contact with the hole conductive layer, the light absorption structure may include a nanoplate shaped pillar having a surface coverage of the composite layer of 25% ($C_{ov}/S_{urf}=0.25$) or more, a diameter (a length in a second direction) of 500 to 20,000 nm, and a thickness (a length in a first direction) of 100 to 600 nm and/or a nanocolumn shaped pillar having a surface coverage of the composite layer of 70% ($C_{ov}/S_{urf}=0.70$) or more, a diameter (a length in a second direction) of 200 to 5,000 nm, and a thickness (a length in a first direction) of 300 to 800 nm.

In the solar cell according to the exemplary embodiment of the present invention, the light absorption structure may include the aggregation structure in which a plurality of pillars as described above are aggregated with each other, and the aggregation structure may include a structure in which a plurality of pillars as described above discontinuously contact each other.

This aggregation structure may include an aggregation structure body having a polygonal column (plate) shape, a circular column (plate) shape, or an oval column (plate) shape in addition to the above-mentioned wire web structure. That is, in the aggregation structure of the light absorption structure, the plurality of pillars may be aggregated with each other while being spaced apart from each other, and the aggregated shape may form the polygonal column (plate) shape, the circular column (plate) shape, or the oval column (plate) shape. The light absorption structure may have a shape in which a plurality of aggregation structures are arranged to be spaced apart from each other.

The aggregation structure may have a structure in which each of the pillars forming the aggregation structure body is independently extended from the composite layer or extended via a single root from the composite layer to thereby be divided into the plurality of pillars.

That is, the plurality of pillars forming the aggregation structure may be individually extended from the composite layer, respectively, or bonded to each other at a stump thereof (a region adjacent to the composite layer) to thereby be extended from the composite layer.

In view of a manufacturing method, the aggregation structure in which the pillars are extended via the single root from the composite layer and then divided in plural may be formed by partially etching the light absorber pillar extended from the composite layer using a directional dry etching method including a plasma etching method.

For example, the aggregation structure may be formed by dry etching the light absorber grown from the composite layer to protrude in a column or plate shape so that a plurality of pillars are formed at an end portion (one end toward the second electrode) while maintaining a single column shape at the stump portion thereof. In this case, the structure in which the pillars are extended via the single root from the composite layer and then divided in plural may be interpreted as a polygonal column (plate), circular column (plate), or oval column (plate) shaped light absorber pillar of which surface roughness of one surface dry-etched is increased.

The structure in which the plurality of pillars are extended from the composite layer via the single stump may be preferable in view that a pillar having a microfine structure is formed to thereby increase a contact area between the pillar and the hole transporting material while increasing the contact area between the composite layer and the pillar.

The light absorber thin film of the light absorption structure may mean a continuum film made of the light absorber. The continuum may mean a state in which a single light absorber grain contacts at least one grain among light absorber grains adjacent to the single light absorber grain while forming a grain boundary, based on the single light absorber grain, such that the light absorber grains are continuously connected to each other. This continuum film may have a porous or dense structure according to how the single light absorber grain forms the grain boundary together with the light absorber grains adjacent thereto. More specifically, the light absorber thin film of the light absorption structure may be a dense film, a porous film, or a laminate film thereof. In the case of the laminate film, the dense film and the porous film may be sequentially laminated on the composite layer or the porous film and the dense film may be sequentially laminated on the composite layer. In this case, the dense film may include a film containing pores partially distributed at points where at least two grains contact each other such as a triple point and is not limited to a dense film in which a pore is not present as a film of the light absorber.

When the light absorption structure includes the light absorber thin film, a surface coverage of the composite layer by the light absorber thin film may be 70% ($C_{ov}/S_{urf}=0.70$) to 100% ($C_{ov}/S_{urf}=1$). The surface coverage of the composite layer of 70% ($C_{ov}/S_{urf}=0.70$) or more may be achieved by the light absorber thin film forming the continuum, and the solar cell may have power conversion efficiency of 15% or more due to this excellent surface coverage. Particularly, in the case of the dense film type light absorption structure having the surface coverage of about 100%, the solar cell may have significantly excellent power conversion efficiency at 17% or more. That is, when the light absorber of the composite layer does not directly contact the hole transporting material of the hole conductive layer but contact the hole transporting material via the dense light absorber thin film, the solar cell may have significantly excellent power conversion efficiency at 17% or more. In this case, when the surface coverage is experimentally 70% ($C_{ov}/S_{urf}=0.70$) to 90% ($C_{ov}/S_{urf}=0.9$) based on the surface coverage of the composite layer by the light absorber thin film, the light absorber thin film may be referred to as a porous film type light absorber thin film, and when the surface coverage is more than 90% ($C_{ov}/S_{urf}=0.9$), the light absorber thin film may be referred to as a dense film type light absorber thin film.

In the case in which the light absorption structure includes the thin film, a structure of the composite layer and the light absorption structure may be interpreted as a structure in which the light absorber is impregnated into the porous metal oxide layer while covering the porous metal oxide layer (the light absorber is impregnated into pores of the metal oxide layer while covering one surface of metal oxide layer) in consideration of the light absorber of the light absorption structure and the light absorber in the porous metal oxide.

In the case in which the light absorption structure includes the light absorber thin film, a thickness of the light absorber thin film is not particularly limited but may be preferably 1 to 2,000 nm, more preferably 10 to 1,000 nm, more preferably, 50 to 800 nm, even more preferably 50 to 600 nm, and most preferably 50 to 400 nm. In the case in which the light absorber thin film has the above-mentioned thickness, at the time of movement of the photo current through the light absorber thin film, the photo active region absorbing light to generate the photoelectron and the photohole may be sufficiently secured while preventing the current from being annihilated by recombination, and irradiated light may be completely absorbed.

As described above, the light absorption structure may include the light absorber pillar or light absorber thin film. Further, the light absorption structure may include a light absorber thin film on which the light absorber pillar is formed.

The light absorber thin film on which the light absorber pillar is formed may mean a light absorber thin film on which a protrusion structure of the light absorber is formed. The protrusion structure of the light absorber may include a structure in which the light absorbers having one or at least two shapes selected from a column shape, a plate shape, a needle shape, a wire shape, and a rod shape are mixed or aggregated with each other and be similar or equal to that in the above-mentioned case in which the light absorption structure is the pillar. In the case of the light absorption thin film on which the light absorber pillar is formed, the light absorber thin film may include the porous light absorber film, the dense light absorber film, or the laminate film thereof and be similar or equal to that in the above-mentioned case in which the light absorption structure is the light absorber thin film.

The light absorber pillar may have a structure in which one end or a region of one side thereof is bonded to the light absorber thin film. More specifically, the light absorber pillar and the light absorber thin film may have a structure in which they are extended to each other and integrated with each other. A size of the light absorber pillar and/or a thickness of the light absorber thin film are not particularly limited. However, in consideration of the entire size and thickness of the light absorption structure including both of the pillar and the film, in view of preventing current from being annihilated by recombination and increasing the photo active region, the thickness of the light absorber thin film may be 5 to 100 nm, and the size and shape of the light absorber pillar formed on the light absorber thin film may be similar to those as described above.

As described above, the porous electrode may include the first electrode and the composite layer positioned on the first electrode.

As the first electrode provided in the porous electrode, any conductive electrode may be used as long as it ohmic contacts the electron transporting material (metal oxide), and in order to improve light transmission, a transparent conductive electrode may be preferable. The first electrode may correspond to a front electrode, which is an electrode provided at a portion at which light is received, and a front electrode material generally used in a solar cell field may be used. As a non-restrictive example, the conductive electrode may be a conductive electrode made of an inorganic material such as fluorine doped tin oxide (FTO), indium doped tin oxide (ITO), ZnO, carbon nanotube (CNT), or graphene, or a conductive electrode made of an organic material such as polyethylene dioxythiophene:polystyrene sulfonate (PEDOT:PSS). The organic conductive electrode may be preferable when attempting to provide a flexible solar cell or transparent solar cell. However, the present invention is not limited by the material of the first electrode.

The composite layer may contain the porous metal oxide functioning as the electron transporting material and/or the supporter of the light absorber and contain a porous metal oxide of which the light absorber is impregnated into pores.

The porous metal oxide of the composite layer may mean a metal oxide having open pores. As the porous metal oxide, a porous metal oxide having any structure may be used as long as the light absorber may be uniformly and easily supported thereon (impregnated thereinto). Preferably, the porous metal oxide may include a plurality of metal oxide particles and have a porous structure by spaces between the metal oxide particles. In detail, the porous metal oxide may be a porous metal oxide layer in which the plurality of metal oxide particles are aggregated and have the porous structure by gaps between the metal oxide particles, wherein the porous structure may include an open pore structure. In the case in which the porous metal oxide include the metal oxide particles, porosity may be easily adjusted by adjusting an average size of the metal oxide particles, and the porous metal oxide may be formed by applying and drying slurry containing the metal oxide particles, such that the porous metal oxide may be simply manufactured, thereby making it possible to increase a production rate of the solar cell, decrease a manufacturing cost, and mass-produce the solar cell.

The composite layer may be a layer in which the above-mentioned porous metal oxide functioning as the electron transporting material and/or the supporter of the light absorber and the light absorber are mixed. At least, the composite layer may have a structure in which the light absorber is positioned in the open pore of the porous metal oxide.

In detail, the composite layer may have a structure in which the pores of the porous metal oxide are partially or entirely filled with the light absorber. In more detail, the composite layer may have a structure in which the light absorber covers the surface (including a surface by the pores) of the porous metal oxide (that is, a structure of a coating layer coated on the surface) or a structure in which the light absorber entirely fills in the pores of the porous metal oxide.

In the composite layer, the light absorber may fill in the pores to a volume of 20 to 100% (0.2 to 1 Vp) based on the total volume (Vp) of the pores of the porous metal oxide. That is, a filling fraction of the light absorber, which is a volume fraction of the light absorber filled in the total volume of the pores of the porous metal oxide may be 0.2 to 1, preferably 0.5 to 1. In the case in which the filling fraction of the light absorber is more than 0.5, the light absorbers may be stably and continuously connected to each other in the composite layer, such that flowability of the photo current in the light absorber may be improved, and separation and transportation of the photoelectron to the metal oxide may be further smoothly performed. In the case in which the light absorber is formed by a solution application method to be described below, the filling fraction of the light absorber may be substantially 0.8 to 1, more substantially 0.9 to 1, and most substantially 0.95 to 1.

The porous metal oxide (layer) functioning as the electron transporting material transporting electrons and/or the supporter of the light absorber may have a porosity (apparent porosity) corresponding to a general porosity of a supporter or an electron transporting material on which a dye (inorganic semiconductor quantum dot) is supported in a general dye-sensitized solar cell or inorganic semiconductor based solar cell using an inorganic semiconductor quantum dot as the dye, but the porosity may be preferably, 30 to 65%, more preferably 40 to 60%. Due to this porosity, an easy and continuous flow of the electron may be secured in the porous metal oxide, a relative content of the light absorber in the composite layer may be increased, and the contact area between the metal oxide and the light absorber may be increased.

The porous metal oxide (layer) functioning as the electron transporting material transporting electrons and/or the supporter of the light absorber may have a general specific surface area of the supporter or the electron transporting material on which the dye (inorganic semiconductor quantum dot) is supported in the general dye-sensitized solar cell or inorganic semiconductor based solar cell using an inorganic semiconductor quantum dot as the dye, but the specific surface area may be preferably 10 to 100 $m^2/g$. This specific surface area is a specific surface area at which optical absorbance may be increased even in the case of not excessively increasing a thickness of the solar cell, and the photoelectron-photohole generated by light may be easily separated from each other to move via the metal oxide or light absorber itself before the photoelectron-photohole are recombined to thereby be annihilated.

The porous metal oxide (layer) may have a thickness corresponding to a general thickness of the supporter or the electron transporting material on which the dye (inorganic semiconductor quantum dot) is supported in the general dye-sensitized solar cell or inorganic semiconductor based solar cell using an inorganic semiconductor quantum dot as the dye, but the thickness may be preferably 10 μm or less, more preferably 5 μm or less, even more preferably 1 μm or less, and most preferably 800 nm or less. In the case in which the thickness is more than 10 μm, a distance at which the electron generated from the light is transported to an external circuit is increased, such that efficiency of the solar cell may be deteriorated. Further, in the case in which the thickness of the porous metal oxide (layer) is 1000 nm or less, preferably 800 nm or less, the composite layer in which the light absorber is impregnated into the porous metal oxide; and the light absorption structure may be simultaneously and stably formed by a single process of applying and drying a light absorber solution in which the light absorber is dissolved, and at least 15% of the surface of the composite layer may be covered by the light absorption structure.

In the solar cell according to the exemplary embodiment of the present invention, as the light absorption structure made of the light absorber is positioned on the composite layer, the photo current may be generated in the light absorption structure together with the light absorber of the composite layer. Therefore, even though the thickness of the porous metal oxide (layer) is implemented to be thin, excellent power conversion efficiency of the solar cell may be secured. In the case of the general dye- or inorganic semiconductor-sensitized solar cell, when a thickness of a supporter (electron transporting material) supporting a dye is excessively thin, since an absolute amount of the dye supported on the supporter is excessively decreased, it is general to use a supporter (electron transporting material) having a thickness optimized by two factors having contradictory effects to each other, that is, annihilation of the photo current by a thickened supporter (electron transporting material) and an increase in the absolute amount of the dye supported on the supporter (electron transporting material). However, as described above, in the solar cell according to the exemplary embodiment of the present invention, the light absorption structure as well as the light absorber of the composite layer may also provide the photo active region, such that in view of improving the power conversion efficiency, the thickness of the porous metal oxide (layer) may be controlled by two factors, that is, annihilation of the photo current according the increase in a moving distance of the photo current and the increase in the contact area between the electron transporting material and the light absorber. In detail, the thickness of the porous metal oxide may be 1000 nm or less, specifically, 800 nm or less, and more specifically, 600 nm or less, and the lower limit of thickness of the porous metal oxide (layer) may be 50 nm. That is, the thickness of the porous metal oxide (layer) may be 50 to 1000 nm, preferably 50 to 800 nm, more preferably 50 to 600 nm, even more preferably 100 to 600 nm, and most preferably 200 to 600 nm by the above-mentioned light absorption structure, and in the case in which the porous metal oxide (layer) has the above-mentioned thickness, at the time of transporting electron via the metal oxide, annihilation due to recombination may be effectively prevented, and separation and transportation of the electron between the light absorber (including the light absorbers in both of the light absorption structure and the porous metal oxide) and the metal oxide (metal oxide of the porous metal oxide layer) may be further smoothly performed, thereby making it possible to improve power conversion efficiency.

In addition, the metal oxide particle configuring the porous metal oxide (layer) may have a diameter corresponding to that of a particle capable of having a general specific surface area of the supporter or the electron transporting material on which the dye (inorganic semiconductor quantum dot) is supported in the general dye-sensitized solar cell or inorganic semiconductor based solar cell using an inorganic semiconductor quantum dot as the dye, but preferably, the diameter may be 5 to 500 nm. In the case in which the diameter is less than 5 nm, the gap is excessively small, such that the light absorber may not be sufficiently attached into the gap, the light absorber and the metal oxide may not smoothly contact each other, or electrical charges may not be smoothly transferred due to a number of interfaces between the metal oxides, and in the case in which the diameter is more than 500 nm, the specific surface area of the porous metal oxide (layer) may be decreased, such that efficiency of the solar cell may be deteriorated.

The porous metal oxide (layer) functioning as the electron transporting material and/or the supporter of the light absorber may be a general metal oxide used in conducting photoelectrons in the solar cell field. For example, the porous metal oxide (layer) may be one or at least two materials selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, and Sr—Ti oxide, or a mixture or composite thereof.

Further, the porous metal oxide (layer) may be a generally known coating layer formed in order to improve the interfacial contact between the metal oxide particles. In detail, the coating layer may be made of one or at least two materials selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, Sr—Ti oxide, a mixture thereof, and a composite thereof and be coated in a range in which the gaps of the porous metal oxide are not filled, in order to improve the interfacial contact between the metal oxide particles.

The porous electrode may further include an electron transporting film, which is a thin film capable of transporting electrons between the first electrode and the composite layer. The electron transporting film may serve to transport the electron simultaneously with preventing the light absorber of the composite layer and the first electrode from directly contacting each other in advance. As the electron transporting film positioned between the first electrode and the composite layer, any material on an energy band diagram may be used as long as electrons may spontaneously move from the porous metal oxide of the composite layer to the first electrode transporting film.

As a non-restrictive and specific example, the electron transporting film may be a metal oxide thin film, and a metal oxide of the metal oxide thin film may be a material equal to or different from the metal oxide of the porous metal oxide. In detail, the material of the metal oxide thin film may be at least one material selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, Sr—Ti oxide, a mixture thereof, and a composite thereof.

As a non-restrictive and specific example, the electron transporting film may be an organic thin film having electric conductivity and generally used in an organic electronic device, and as a non-restrictive example, the electron transporting film may be a conductive organic thin film such as a PEDOT:PSS thin film. The conductive organic thin film may be preferable when attempting to provide a flexible solar cell or transparent solar cell.

As described above, the electron transporting film may mainly perform a role of allowing the electron to smoothly move from the porous metal oxide to the first electrode and a role of preventing the light absorber and the first electrode from directly contacting each other in advance. The electron transporting film may have any thickness as long as these roles may be suitably performed, but the thickness may be substantially 10 nm or more, more substantially 10 to 100 nm, and further more substantially to 100 nm. Therefore, a smooth moving path of the electron may be provided between the first electrode and the porous metal oxide, the thin film having a uniform and homogeneous thickness may be secured, and an excessive increase in the thickness of the solar cell or a decrease in light transmittance may be prevented.

The porous electrode may further include a substrate positioned under the first electrode. Any transparent substrate may be used as long as the substrate may serve as a supporter for supporting the porous electrode or the second electrode and light may be transmitted through the substrate, and a substrate capable of being positioned on the front electrode in a general solar cell may be used. As a non-restrictive example, the substrate may be a rigid substrate including a glass substrate or a flexible substrate containing polyethylene terephthalate (PET), polyethylene naphthalate (PEN), polyimide (PI), polycarbonate (PC), polypropylene (PP), triacetylcellulose (TAC), polyethersulfone (PES), or the like.

The solar cell according to the exemplary embodiment of the present invention, including the above-mentioned electron transporting film, the above-mentioned composite layer, and the above-mentioned light absorption structure, will be described in detail in view of operation mechanism of the solar cell.

The composite layer may be a layer having a structure in which the electron transporting material and the light absorber are impregnated with each other. The composite layer may have the structure in which the electron transporting material and the light absorber are impregnated with each other, wherein the electron transporting material of the composite layer may be a continuum contacting the electron transporting film, and the light absorber of the composite layer may be a continuum contacting the light absorption structure.

The continuum may mean a state in which particles or grains are continuously connected while surface-contacting (including a grain boundary) or point-contacting at least one particle or grain among particles or grains adjacent to a single grain based on the single particle or grain forming the electron transporting material or the light absorber.

The impregnation structure of the composite layer may mean a state in which the electron transporting material, which is the continuum, and the light absorber, which is the continuum, are mixed with each other and mean a state in which interfaces between the electron transporting material and the light absorber are continuously distributed on different planes rather than a single plane.

More specifically, the electron transporting material may be a porous electron transporting material which is a continuum and has open pores. For example, the electron transporting material may be the above-mentioned porous metal oxide. The light absorber is impregnated into the open pore of the electron transporting material to form the continuum, thereby forming the impregnation structure of the composite layer.

As described above, as the light absorber is impregnated into the open pore of the electron transporting material to form the impregnation structure, in the case in which the open pores present in the electron transporting material are connected to each other, the light absorber of the composite layer may be a single continuum contacting the light absorption structure, and in the case in which the open pores of the electron transporting material are not connected to each other, the light absorber may be composed of a plurality of continuums contacting the light absorption structure. In this case, the number of plural continuums contacting the light absorption structure may correspond to the number of open pores of the electron transporting material that are not connected to each other.

The electron transporting material of the composite layer may be the porous metal oxide composed of metal oxide particles. In the case in which the porous electron transporting material having the open pores includes the metal oxide particles, the continuum may be easily formed by contacts between the metal oxide particles, and empty spaces between the metal oxide particles may also be connected to each other to form a continuum, which is preferable in view of increasing an interfacial area between the electron transporting material and the light absorber. That is, in the case in which the porous electron transporting material is the porous metal oxide layer including the metal oxide particles, the pores in which the light absorber is positioned are connected to each other in addition to continuous connection between the metal oxide particles, thereby forming a continuum, substantially, a single continuum.

The light absorber of the composite layer may have a structure in which the light absorber is impregnated into the pore of the porous electron transporting material while contacting the light absorption structure. In this case, preferably, the pores of the porous electron transporting material are partially or entirely filled with the light absorber, or at least, the surface (including the surface by the pore) of the porous electron transporting material is coated by the light absorber, such that a coating layer of the light absorber is formed on the entire region of the surfaces of the open pores of the electron transporting material. More preferably, the light absorber fills in all of the open pores of the porous electron transporting material. In this case, the meaning of filling in all of the open pores of the porous electron transporting material is not strictly interpreted as meaning that pores do not remain in the composite layer. Undesired pores may partially remain in the composite layer due to a limitation in an experimental implementation method or implementation of each experiment, which is known to those skilled in all of the fields associated with depositing or applying a material to form a film.

As described above, in the composite layer the light absorber may fill in the pores to a volume of 20 to 100% (0.2 to 1 Vp) based on the total volume (Vp) of the pores of the porous electron transporting material, and in view of the light absorber of the continuum, preferably fill in the pores to a volume of 50 to 100%. In this case, the porosity (apparent porosity) of the porous electron transporting material may be preferably 30 to 65%, more preferably 40 to 60%, as described above. In addition, the thickness of the porous electron transporting material may be 10 μm or less, specifically 5 μm or less, and preferably 1 μm or less, as described above. The thickness of the porous metal oxide (layer) may be 50 to 1000 nm, preferably to 800 nm, more preferably 50 to 600 nm, even more preferably 100 to 600 nm, and most preferably 200 to 600 nm.

As described above, the composite layer may have the structure in which the electron transporting material and the light absorber are impregnated with each other, the light absorption structure positioned on the composite layer, more specifically, contacting a surface of the composite layer facing the second electrode and the light absorber of the composite layer are connected to each other, and the electron transporting film positioned under the composite layer, more specifically, contacting a surface of the composite layer facing the first electrode and the electron transporting material of the composite layer are connected to each other.

In addition, the light absorption structure and the hole transporting material of the hole conductive layer may also have a structure in which they are impregnated with each other. That is, in the case in which the light absorption structure includes the light absorber thin film formed with the light absorber pillar, the light absorber pillar, or the porous light absorber thin film, the hole transporting material of the hole conductive layer may form a film covering the composite layer formed with the light absorption structure while filling in an empty space of the light absorption structure, such that the hole transporting material of the hole conductive layer is impregnated into the light absorption structure, thereby forming an impregnation structure in which interfaces between the hole conductive layer and the light absorber (light absorber of the light absorption structure) are continuously distributed on different planes rather than a single plane.

In the case of having a structure in which the hole conductive layer is impregnated into the light absorption structure, separation efficiency of the photoelectron-photohole may be improved by an increase in interfacial contact area between the light absorber of the light absorption structure and the hole conductive layer, thereby making it possible to increase power conversion efficiency.

Due to this structure, the photoelectron of the photoelectron and the photohole formed in the light absorption structure may flow to the electron transporting material through the light absorption structure or through the light absorbers of the light absorption structure and the composite layer to thereby move to the first electrode. The photohole of the photoelectron and the photohole formed in the light absorption structure may flow to the hole conductive layer through the light absorption structure to thereby move to the second electrode.

In addition, the photoelectron of the photoelectron and the photohole formed in the light absorber of the composite layer may directly flow to the electron transporting material of the composite layer or flow thereto through the light absorber of the composite layer to thereby move to the first electrode. In the case in which the light absorption structure is the porous film structure and/or the pillar structure, the photohole of the photoelectron and the photohole formed in the light absorber of the composite layer may flow to the hole conductive layer through the light absorber of the composite layer or through the light absorber of the composite layer and the light absorption structure to thereby move to the second electrode, and in the case in which the light absorption structure includes the dense film, the photohole may flow to the hole conductive layer through the light absorber of the composite layer and the light absorption structure to thereby move to the second electrode.

As described above, the light absorber of the composite layer and/or the light absorption structure may simultaneously perform its original role of absorbing light to form the photoelectron and the photohole and a role of providing the moving path of the photoelectron and/or the photohole. That is, the light absorber may simultaneously serve as an electron transporting material (second electron transporting material) and/or a hole conductor (second hole conductive layer) in addition to forming the photo current.

As the light absorber has a structure in which it may simultaneously serve as the electron transporting material (second electron transporting material) and/or the hole conductor (second hole conductive layer) in addition to forming the photo current, in the case in which the surface coverage of the composite layer by the light absorption structure positioned on the composite layer satisfies Correlation Equation 1, preferably Correlation Equation 1-1, and more preferably Correlation Equation 1-2, power conversion efficiency may be further increased. When the light absorption structure includes, more preferably, the light absorber thin film, even more preferably, the light absorber dense film, the power conversion efficiency may be further increased. In another aspect, when the hole transporting material of the hole conductive layer contacts the electron transporting material through the light absorber of the composite layer, preferably, when the hole transporting material of the hole conductive layer does not intrude into at least the composite layer, and more preferably, when the hole transporting material of the hole conductive layer contacts the composite layer through the light absorption structure, the power conversion efficiency may be further increased.

As described above, in the case in which the light absorption structure includes the light absorber thin film, a thickness of the light absorber thin film is not particularly limited but may be preferably 1 to 2,000 nm, more preferably 10 to 1,000 nm, more preferably 50 to 800 nm, even more preferably 50 to 600 nm, and most preferably 50 to 400 nm.

The light absorber contained in the composite layer together with the porous metal oxide layer and the light absorber forming the light absorption structure may independently include an inorganic or organic-inorganic semiconductor absorbing solar light to form an electron-hole pair. The organic-inorganic semiconductor may include an organic-inorganic semiconductor having a perovskite structure (that is, an inorganic-organic hybrid perovskite compound). In this case, in view of preventing photo current from being lost at the interface between the composite layer and the light absorption structure and securing a smooth flow of the photo current, the light absorber contained in the composite layer and the light absorber forming the light absorption structure may be the same material as each other.

As a semiconductor material used as the light absorber, a material capable of efficiently separating and transporting the exciton generated by light by having a low bandgap and a high light absorption coefficient to efficiently absorb solar lights and having excellent energy band matching between each of the components configuring the solar cell may be preferable. In this case, the bandgap means a gap between a conduction band of the semiconductor material and a valence band thereof, and may include a band gap depending on unique characteristics of the material or a band gap changed from the unique characteristics of the material according to the size by quantum-confinement effect in the case in which the size of particle is small.

The light absorber (photo sensitizer) absorbing solar light to generate the photoelectron-photohole pair may be an inorganic-organic hybrid perovskite compound, an inorganic semiconductor material having an inorganic semiconductor quantum dot generally used in the inorganic semiconductor quantum dot-sensitized solar cell, or a mixture thereof.

In detail, the light absorber may be one or at least two materials selected from the inorganic-organic hybrid perovskite compound, $Bi_2S_3$, $Bi_2Se_3$, InP, $InCuS_2$, $In(CuGa)Se_2$, $Sb_2S_3$, $Sb_2Se_3$, $SnS_x$ (x is a real number satisfying the following Equation: $1 \leq x \leq 2$), NiS, CoS, $FeS_y$ (y is a real number satisfying the following Equation: $1 \leq y \leq 2$), $In_2S_3$, MoS, and MoSe.

In the solar cell according to the exemplary embodiment of the present invention, the light absorber may be preferably the inorganic-organic hybrid perovskite compound. The light absorber made of the inorganic-organic hybrid perovskite compound has advantages in that the light absorber (light absorbers of the composite layer and the light absorption structure) may be formed by a simple, easy, and cheap process of applying and drying the solution, a light absorber composed of coarse grains may be formed due to spontaneous crystallization caused by drying of the applied solution, and conductivity for both of the electron and hole is excellent. The inorganic-organic hybrid perovskite compound may include a material satisfying the following Chemical Formulas 1 to 2 or 4 to 7 to be described below.

The light absorber of the composite layer and the light absorber of the light absorption structure may be independently one or at least two selected from compounds satisfying the following Chemical Formulas 1 and 2.

$AMX_3$ (Chemical Formula 1)

In Chemical Formula 1, A is a monovalent organic ammonium ion or $Cs^+$, M is a divalent metal ion, and X is a halogen ion.

$A_2MX_4$ (Chemical Formula 2)

In Chemical Formula 2, A is a monovalent organic ammonium ion or $Cs^+$, M is a divalent metal ion, and X is a halogen ion.

In this case, M may be positioned at the center of a unit cell in a perovskite structure, X may be positioned at the center of each side of the unit cell to form an octahedron structure based on M, and A may be positioned at each corner of the unit cell.

In detail, the light absorber of the composite layer and the light absorber of the light absorption structure may be independently one or at least two selected from compounds satisfying the following Chemical Formulas 4 to 7.

$(R_1-NH_3^+)MX_3$ (Chemical Formula 4)

In Chemical Formula 4, $R_1$ is (C1-C24)alkyl, (C3-C20)cycloalkyl, or (C6-C20)aryl, M is one or at least two metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or at least two halogen ions selected from $Cl^-$, $Br^-$, and $I^-$.

$(R_1-NH_3^+)_2MX_4$ (Chemical Formula 5)

In Chemical Formula 5, $R_1$ is (C1-C24)alkyl, (C3-C20)cycloalkyl, or (C6-C20)aryl, M is one or at least two metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$ and $Yb^{2+}$, and X is one or at least two halogen ions selected from $Cl^-$, $Br^-$, and $I^-$.

$(R_2-C_3H_3N_2^+-R_3)MX_3$ (Chemical Formula 6)

In Chemical Formula 6, $R_2$ is (C1-C24)alkyl, (C3-C20)cycloalkyl, or (C6-C20)aryl, $R_3$ is hydrogen or (C1-C24)alkyl, M is one or at least two metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or at least two halogen ions selected from $Cl^-$, $Br^-$, and $I^-$.

$(R_2-C_3H_3N_2^+-R_3)_2MX_4$ (Chemical Formula 7)

In Chemical Formula 7, $R_2$ is (C1-C24)alkyl, (C3-C20)cycloalkyl, or (C6-C20)aryl, $R_3$ is hydrogen or (C1-C24)alkyl, M is one or at least two metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or at least two halogen ions selected from $Cl^-$, $Br^-$, and $I^-$.

For example, the compound having the perovskite structure may be $AMX^a_x X^b_y$ or $A_2MX^a_x X^b_y$ (x and y are real numbers satisfying the following Inequalities, respectively: $0<x<3$ and $0<y<3$, $x+y=3$, and $X^a$ and $X^b$ are different halogen ions).

For example, in Chemical Formula 4 or 5, $R_1$ may be (C1-C24)alkyl, preferably (C1-C7)alkyl, and more preferably methyl. As a specific example, the compound having the perovskite structure may be one or at least two selected from $CH_3NH_3PbI_xCl_y$ (x and y are real numbers satisfying the following Equations, respectively: $0 \leq x \leq 3$ and $0 \leq y \leq 3$, and $x+y=3$), $CH_3NH_3PbI_xBr_y$ (x and y are real numbers satisfying the following Equations, respectively: $0 \leq x \leq 3$ and $0 \leq y \leq 3$, and $x+y=3$), $CH_3NH_3PbI_xBr_y$ (x and y are real numbers satisfying the following Equations, respectively: $0 \leq x \leq 3$ and $0 \leq y \leq 3$, and $x+y=3$), and $CH_3NH_3PbI_xF_y$ (x and y are real numbers satisfying the following Equations, respectively: $0 \leq x \leq 3$ and $0 \leq y \leq 3$, and $x+y=3$), or be one or at least two selected from $(CH_3NH_3)_2PbI_xCl_y$ (x and y are real numbers satisfying the following Equations, respectively: $0 \leq x \leq 4$ and $0 \leq y \leq 4$, and $x+y=4$), $CH_3NH_3PbI_xBr_y$ (x and y are real numbers satisfying the following Equations, respectively: $0 \leq x \leq 4$ and $0 \leq y \leq 4$ and $x+y=4$), $CH_3NH_3PbCl_xBr_y$ (x and y are real numbers satisfying the following Equations, respectively: $0 \leq x \leq 4$ and $0 \leq y \leq 4$, and $x+y=4$), and $CH_3NH_3PbI_xF_y$ (x and y are real numbers satisfying the following Equations, respectively: $0 \leq x \leq 4$ and $0 \leq y \leq 4$, and $x+y=4$).

For example, in Chemical Formula 6 or 7, $R_2$ may be (C1-C24)alkyl, and $R_3$ may be hydrogen or (C1-C24)alkyl, preferably, $R_2$ may be (C1-C7)alkyl, and $R_3$ may be hydrogen or (C1-C7)alkyl, and more preferably, $R_2$ may be methyl and $R_3$ may be hydrogen.

The solar cell according to the exemplary embodiment of the present invention may include the hole conductive layer between the second electrode, which is a counter electrode to the first electrode, and the composite layer formed with the light absorption structure. In a general dye-sensitized solar cell or inorganic semiconductor quantum dot-sensitized solar cell, a hole transporting material of a hole conductive layer is impregnated into a supporter (electron transporting material) supporting a dye (inorganic semiconductor quantum dot) to fill in pores of the supporter, such that the solar cell has a structure in which the electron transporting material, the dye (inorganic semiconductor quantum dot), and the hole transporting material are mixed with each other while contacting each other. However, as described above, the solar cell according to the exemplary embodiment of the present invention may have a structure in which the light absorber fills in the pores of the porous metal oxide or the surface (including the surface by the pores) of the porous metal oxide is coated by the light absorber, and the light absorber thin film may be positioned on the composite layer, such that even though the hole transporting material is not present in the composite layer or the hole transporting material is impregnated into the composite layer, the hole transporting material and the porous metal oxide do not directly contact each other but contact each other through the coating layer of the light absorber coated on the surface of the porous metal oxide.

In the case in which the light absorption structure include the pillar or porous thin film, the hole transporting material may fill empty spaces between the pillars spaced apart from each other to thereby be present in an island form or pores of the porous thin film, thereby being impregnated into the light absorption structure and contacting the composite layer. In this case, as described above, the meaning of contacting the composite layer may include a structure in which the hole transporting material does not intrude into the composite layer but contact the surface of the composite layer on which the light absorption structure is positioned. In addition, the meaning of contacting the composite layer may include a structure in which the hole transporting material intrudes through the open pore remaining in the composite layer to thereby contact the coating layer of the light absorber positioned on the surface of the open pore. Further, in the case in which the light absorption structure includes the dense thin film, the hole conductive layer may be positioned on the light absorption structure and not directly contact the composite layer. In this case, the hole conductive layer may be formed so as to cover the entire surface of the light absorption structure (and a surface of the composite layer exposed between the pillars arranged to be spaced apart from each other), and the hole conductive layer or the second electrode may also have a curved shape due to an uneven structure by the pillar, or a flat surface.

The hole transporting material of the hole conductive layer may include an organic hole transporting material, specifically, a monomer- or polymer-based organic hole transporting material (hole conductive organic material). As the organic hole transporting material, any organic hole transporting material may be used as long as it is used in a general inorganic semiconductor based solar cell using an inorganic semiconductor quantum dot as a dye. In the case in which the light absorption structure includes the pillar and has a significantly fine unevenness structure by fine pillars, the monomer- or small molecule-based organic hole transporting material may be preferable in view of filling in fine gaps and stably forming the interfacial contact between the light absorption structure (and the composite layer) and the hole conductive layer, and the polymer-based organic hole transporting material may be preferable in view of energy matching with the light absorber.

A non-restrictive example of the monomer- or small molecule-based organic hole transporting material may be one or at least two materials selected from pentacene, 3-(2-benzothiazolyl)-7-(diethylamino)coumarin (coumarin 6), zinc phthalocyanine (ZnPC), copper phthalocyanine (CuPC), titanium oxide phthalocyanine (TiOPC), 2,2',7,7'-tetrakis(N,N-p-dimethoxyphenylamino)-9,9'-spirobifluorene (Spiro-MeOTAD), copper(II) 1,2,3,4,8,9,10,11,15,16,17,18,22,23,24,25-hexadecafluoro-29H,31H-phthalocyanine (F16CuPC), boron subphthalocyanine chloride (SubPc), and cis-di(thiocyanato)-bis(2,2'-bipyridyl-4,4'-dicarboxylic acid)-ruthenium(II) (N3) but is not limited thereto.

In the case in which the light absorber is an organic-inorganic semiconductor having a perovskite structure, the hole transporting material of the hole conductive layer may be preferably a polymer (hole conductive polymer). In this case, stable driving of the solar cell may be secured, and the solar cell may have power conversion efficiency further improved by energy matching with the light absorber. In detail, as the hole conductive polymer of the hole conductive layer, one or at least two materials selected from thiophene based materials, para-phenylene vinylene based materials, carbazole based materials, and triphenylamine based materials may be used. In view of energy matching with the light absorber having the perovskite structure, the organic hole transporting material may be preferably one or at least two selected from the thiophene based materials and the triphenylamine based materials, more preferably, the triphenylamine based materials.

In detail, the organic hole transporting material may satisfy the following Chemical Formula 3.

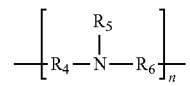

(Chemical Formula 3)

In Chemical Formula 3, $R_4$ and $R_6$ each are independently (C6-C20)arylene, $R_5$ is (C6-C20)aryl, $R_4$ to $R_6$ each are independently substituted with at least one selected from a group consisting of halogen, (C1-C30)alkyl substituted or unsubstituted with halogen, (C6-C30)aryl, (C2-C30)heteroaryl substituted or unsubstituted with (C6-C30)aryl, 5- to 7-membered heterocycloalkyl, 5- to 7-membered heterocycloalkyl fused with at least one aromatic ring, (C3-C30)cycloalkyl, (C6-C30)cycloalkyl fused with at least one aromatic ring, (C2-C30)alkenyl, (C2-C30)alkinyl, cyano, carbazolyl, (C6-C30)ar(C1-C30)alkyl, (C1-C30)alkyl(C6-C30)aryl, nitro, and hydroxyl, and n is a natural number of 2 to 100,000.

In Chemical Formula 3, $R_4$ and $R_6$ each are independently phenylene, naphthylene, biphenylene, terphenylene, anthrylene, fluorenylene, phenanthrylene, triphenylenylene, pyrenylene, perylenylene, chrysenylene, naphthacenylene, or fluoranthenylene, and $R_5$ may be phenyl, naphthyl, biphenyl, terphenyl, anthryl, indenyl, fluorenyl, phenanthryl, triphenylenyl, pyrenyl, perylenyl, chrysenyl, napthacenyl, or fluoranthenyl.

In detail, the organic hole transporting material may be one or at least two selected from poly[3-hexylthiophene] (P3HT), poly[2-methoxy-5-(3',7'-dimethyloctyloxyl)]-1,4-phenylene vinylene (MDMO-PPV), poly[2-methoxy-5-(2'-ethylhexyloxy)-p-phenylene vinylene] (MEH-PPV), poly(3-octyl thiophene) (P3OT), poly(octyl thiophene) (POT), poly (3-decyl thiophene) (P3DT), poly(3-dodecyl thiophene) (P3DDT), poly(p-phenylene vinylene) (PPV), poly(9,9'-dioctylfluorene-co-N-(4-butylphenyl)diphenyl amine (TFB), polyaniline, [2,22',7,77'-tetrkis (N,N-di-p-methoxyphenyl amine)-9,9,9'-spirobi fluorine] (Spiro-MeOTAD), CuSCN, CuI, poly[2,1,3-benzothiadiazole-4,7-diyl[4,4-bis(2-ethylhexyl-4H-cyclopenta[2,1-b:3,4-b']dithiophene-2,6-diyl]] (PCPDTBT), poly[(4,4'-bis(2-ethylhexyl)dithieno[3,2-b:2', 3'-d]silole)-2,6-diyl-alt-(2,1,3-benzothiadiazole)-4,7-diyl] (Si-PCPDTBT), poly((4,8-diethylhexyloxyl)benzo([1,2-b:4, 5-b']dithiophene)-2,6-diyl)-alt-((5-octylthieno[3,4-c]pyrrole-4,6-dione)-1,3-diyl) (PBDTTPD), poly[2,7-(9-(2-ethylhexyl)-9-hexyl-fluorene)-alt-5,5-(4',7,-di-2-thienyl-2',1',3'-benzothiadiazole)] (PFDTBT), poly[2,7-9,9-(dioctyl-fluorene)-alt-5,5-(4',7'-di-2-.thienyl-2',1',3'-benzothiadiazole)] (PFO-DBT), poly[(2,7-dioctylsilafluorene)-2,7-diyl-alt-(4,7-bis(2-thienyl)-2,1,3-benzothiadiazole)-5,5'-diyl] (PSiFDTBT), poly[(4,4'-bis(2-ethylhexyl)dithieno[3,2-b:2',3'-d]silole)-2,6-diyl-alt-(2,1,3-benzothiadiazole)-4,7-diyl] (PSBTBT), poly[[9-(1-octylnonyl)-9H-carbazole-2,7-diyl]-2,5-thiophenediyl 2,1, 3-benzothiadiazole-4,7-diyl-2,5-thiophenediyl] (PCDTBT), poly(9,9'-dioctylfluorene-co-bis(N,N'-(4,butylphenyl))bis (N,N'-phenyl-1,4-phenylene)diamine (PFB), poly(9,9'-dioctylfluorene-co-benzothiadiazole (F8BT), poly(3,4-ethylenedioxythiophene) (PEDOT), poly(3,4-ethylenedioxythiophene)poly(styrenesulfonate) (PEDOT: PSS), poly(triarylamine) (PTAA), poly(4-butylphenyl-diphenyl-amine), and copolymers thereof.

The hole conductive layer may have a thickness suitable for stably covering the entire composite layer formed with the light absorption structure so that the light absorption structure does not directly contact the second electrode. As a non-restrictive and specific example, the hole conductive layer may have a thickness of 5 to 500 nm.

The hole conductive layer may further include an additive generally used in the general inorganic semiconductor based solar cell using an inorganic semiconductor quantum dot as the dye in order to improve properties such as conductivity of an organic material based hole conductive layer. As a non-restrictive example, the hole conductive layer may further contain one or at least two additives selected from tertiary butyl pyridine (TBP), lithium bis(trifluoro methanesulfonyl)imide (LiTFSI), and tris(2-(1H-pyrazol-1-yl)pyridine)cobalt(III), and contain 0.05 to 100 mg of the additive per 1 g of the organic hole transporting material. However, the present invention is not limited by the presence/absence of the additive in the hole conductive layer, a kind of additive, and a content of the additive.

As the second electrode, any rear electrode generally used in the solar cell field as a counter electrode of a porous electrode may be used. As a non-restrictive example, the second electrode may be made of at least one material selected from gold, silver, platinum, palladium, copper, aluminum, carbon, cobalt sulfide, copper sulfide, nickel oxide, and composites thereof. The first and second electrodes may have a thickness corresponding to a general thickness of front and rear electrodes in the general dye-sensitized solar cell or inorganic semiconductor based solar cell using an inorganic semiconductor quantum dot as the dye.

Based on FIGS. 1A to 6, examples of the solar cell according to the present invention will be described in detail, but the following drawings to be introduced are provided by way of example so that the idea of the present invention can be sufficiently transferred to those skilled in the art. Therefore, the present invention is not limited to the drawings to be provided below, but may be modified in many different forms. In addition, the drawings to be provided below may be exaggerated in order to clarify the scope of the present invention.

Figure 10:
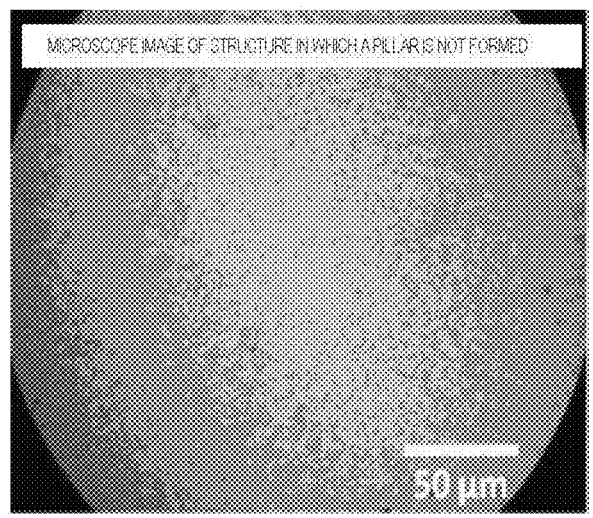
FIG. 10 is an optical microscope photograph obtained by observing a surface of a sample prepared in Preparation Example 4-6.

FIGS. 1A to 1C are cross-sectional views showing examples of the solar cell according to the exemplary embodiment of the present invention. FIG. 1A shows the case in which a light absorption structure 200 is composed of light absorbers arranged to be spaced apart from each other and having a protrusion structure, that is, the light absorption structure 200 is composed of light absorber pillars 210, FIG. 1B shows the case in which the light absorption structure 200 composed of light absorbers is composed of a light absorber thin film, and FIG. 10 shows the case in which the light absorption structure 200 is composed of a light absorber thin film 220 and light absorber pillars 210 extended and protruding from the light absorber thin film 220.

As shown in FIGS. 1A to 10, the solar cell according to the exemplary embodiment of the present invention may include a composite layer 100 in which a light absorber is impregnated into a porous electrode, the light absorption structure 200 extended from the composite layer 100 and made of a light absorber, a hole conductive layer 300 and a second electrode 400 positioned on the composite layer 100 formed with the light absorption structure 200.

FIGS. 2A to 2C are views showing the composite layer 100 in detail in the solar cell according to the exemplary embodiment of the present invention. FIG. 2A shows an example of a first electrode 130 and a porous electrode 10 positioned on the first electrode 130 and including a porous metal oxide layer 110. As shown in FIG. 2A, the porous metal oxide layer 110 may include a plurality of metal oxide particles 1 and have an open porous structure. FIG. 2B is a view showing an example of the composite layer 100 in which a light absorber 120 is impregnated into the porous electrode 10, and more specifically, an example of the composite layer 100 including the porous metal oxide layer 110 under which the first electrode 130 is formed and the light absorber 120 impregnated into the porous metal oxide layer 110. FIG. 2C is a view showing the case in which an electron transporting layer 140 is further provided between the porous metal oxide layer 110 and the first electrode 130, and a substrate 150, for example, a rigid substrate or flexible substrate is further provided under the first electrode 130. In this case, although a structure in which the light absorber fills in all of the open pores of the porous metal oxide layer 110 is shown in FIGS. 2B and 2C, the light absorber may fill in some of the open pores or form a light absorber coating layer, and pores by the porous metal oxide layer may partially remain in the composite layer, as described above.

Figure 3:
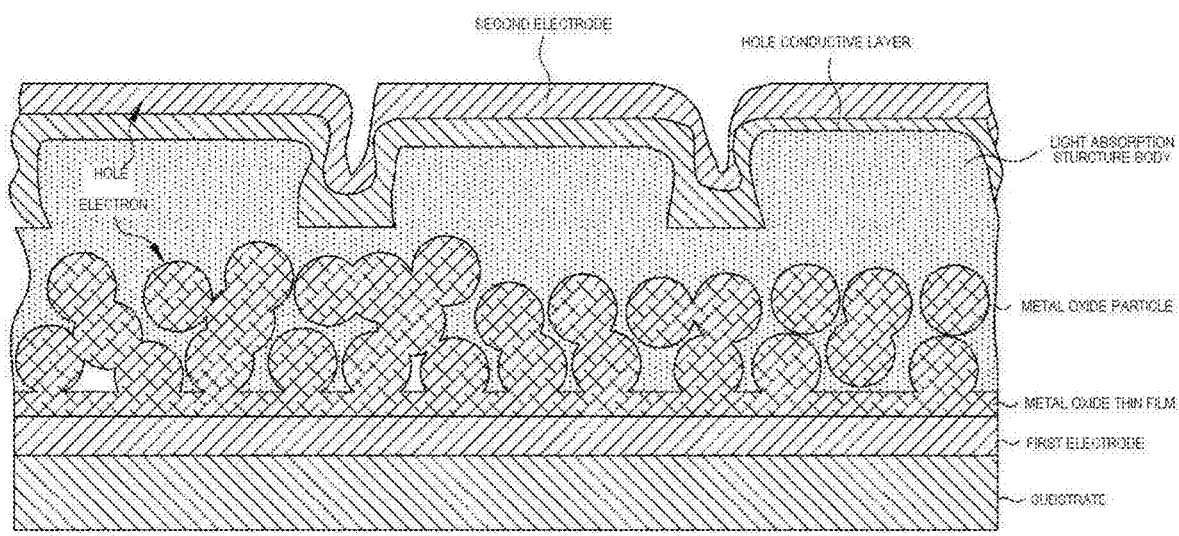
FIG. 3 is a cross-sectional view showing another example of the solar cell according to the exemplary embodiment of the present invention.
Figure 4:
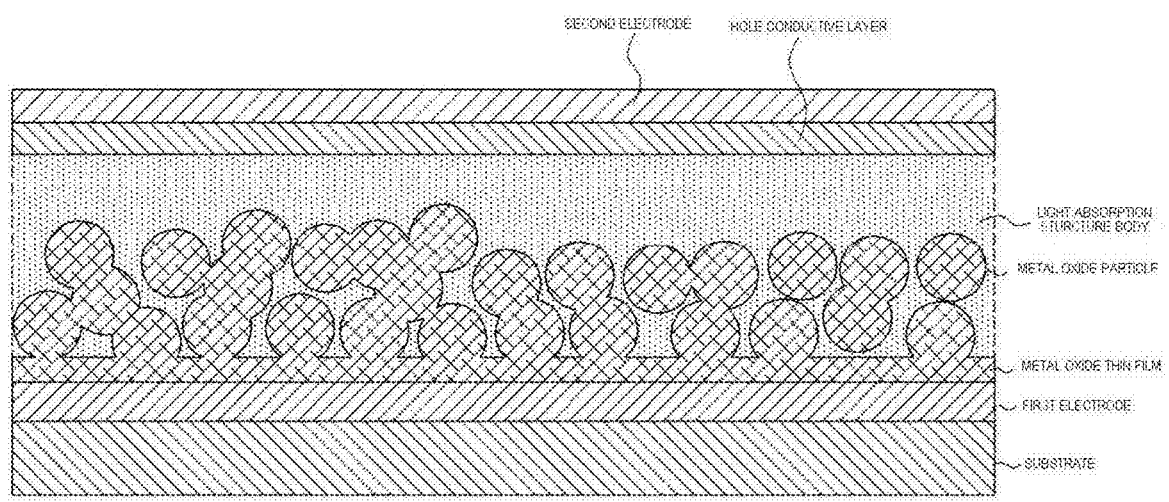
FIG. 4 is a cross-sectional view showing another example of a solar cell according to the exemplary embodiment of the present invention.

FIGS. 3 and 4 are conceptual views showing generation/separation/movement of the photoelectron and the photo-hole by light absorption. FIG. 3 shows the case in which the light absorption structure includes the light absorber pillars, and FIG. 4 shows the case in which the light absorption structure includes a light absorber dense film. As shown in FIGS. 3 and 4, the light absorption structure may have a structure in which the light absorption structure is integrated with the light absorber of the composite layer and absorb light including solar light together with the light absorber of the composite layer to form the photoelectron and photohole. Among the generated photoelectron and photohole, the photohole may be separated and moved through the hole conductive layer, and the photoelectron may be separated and moved through the light absorber itself and/or the metal oxide particle of the porous metal oxide layer.

Figure 5:
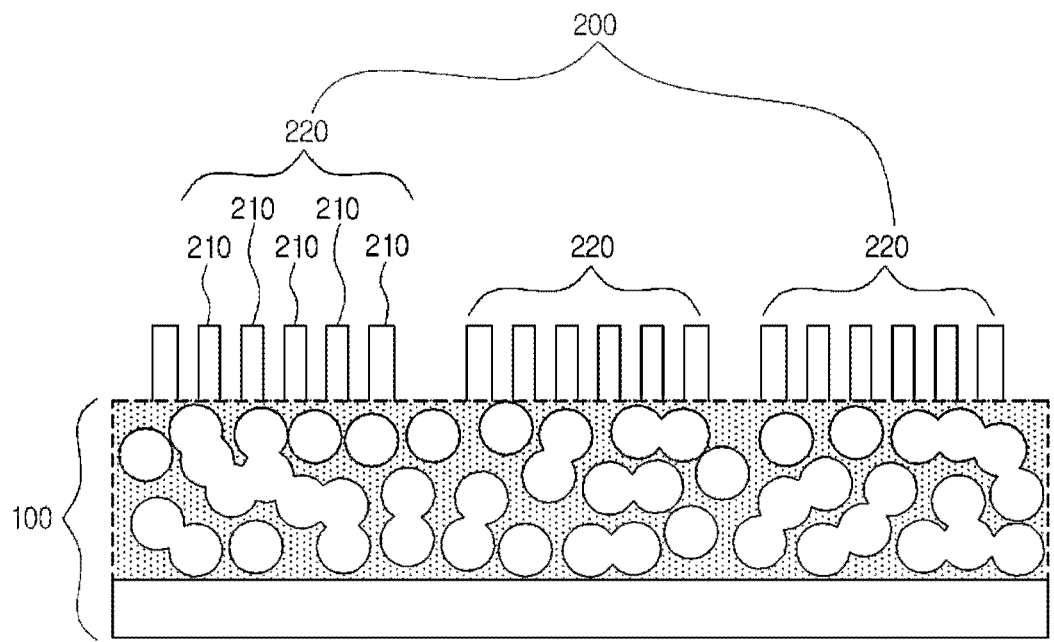
FIG. 5 is a cross-sectional view showing another example of the solar cell composed of the composite layer and the upper light absorption layer, in the solar cell according to the exemplary embodiment of the present invention.

FIG. 5 is another cross-sectional view showing the composite layer 100 and the light absorption structure 200 in detail, in the solar cell according to the exemplary embodiment of the present invention. The light absorption structure 200 may include pillar aggregates 220 as described above. In detail, the light absorption structure 200 may include a plurality of pillar aggregates 220 arranged to be spaced apart from each other. The pillar aggregate 220 may include a plurality of pillars 210 spaced apart from each other and aggregated so as to form a macroscopic shape, and each of the pillars 210 forming the pillar aggregate 220 may have a structure in which one end thereof is bonded to the composite layer 100. That is, each of the pillars 210 may have a structure extended from the composite layer 100.

Figure 6:
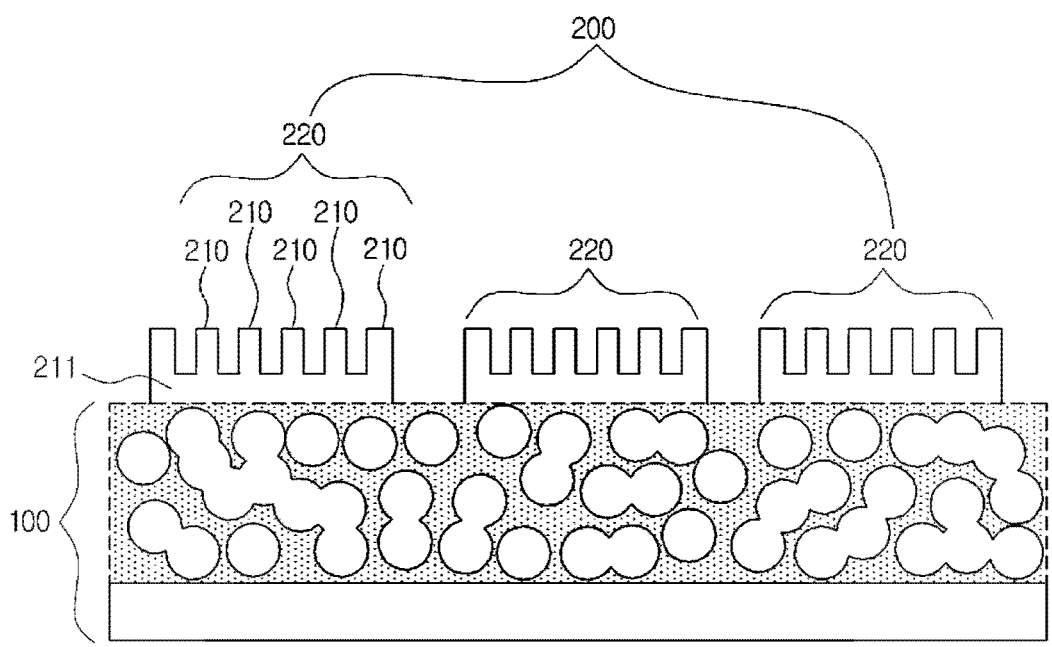
FIG. 6 is a cross-sectional view showing still another example of the solar cell composed of the composite layer and the upper light absorption layer, in the solar cell according to the exemplary embodiment of the present invention.

FIG. 6 is another cross-sectional view showing the composite layer 100 and the light absorption structure 200 in detail, in the solar cell according to the exemplary embodiment of the present invention. The light absorption structure 200 may include a plurality of pillar aggregates 220, and the pillar aggregate 220 may have a structure composed of a plurality of pillars 210 bonded to the composite layer 100 via a single stump 211. In this case, as described above, the light absorption structure according to the exemplary embodiment of the present invention shown in FIG. 6 may be formed by dry-etching a column or plate shaped light absorber pillar.

Hereinafter, a manufacturing method of a solar cell according to the exemplary embodiment of the present invention will be described in detail. In describing the manufacturing method in detail, descriptions of a material, a structure, a shape, and the like, that are similar to those of the above-mentioned solar cell will be omitted.

A composite layer may be formed by forming a porous metal oxide on a first electrode to manufacture a porous electrode and then forming a light absorber in porous metal oxide pores of the porous electrode. In this case, the first electrode may be formed on a rigid substrate or transparent substrate, which is a flexible substrate, using physical vapor deposition, chemical vapor deposition, or thermal evaporation.

In detail, the porous electrode may be manufactured by applying slurry containing metal oxide particles onto the first electrode and heat-treating the applied slurry.

In more detail, a porous metal oxide layer forming step may be performed by applying and drying slurry containing metal oxide particles onto the first electrode and then heat-treating the dried slurry. A method of applying the slurry is not particularly limited, but the slurry may be applied by at least one method selected from a screen printing method; a spin coating method; a bar coating method; a gravure coating method; a blade coating method; a roll coating method; and a slot die method.

Main factors affecting a specific surface area of the porous metal oxide layer and an open pore structure are an average particle size of the metal oxide particles and a heat treatment temperature. The average particle size of the metal oxide particles may be 5 to 500 nm, and heat treatment may be performed at 200 to 600° C. in the air.

A coating thickness of the slurry may be controlled so that a thickness of the porous metal oxide layer manufactured by drying the slurry applied in the porous metal oxide layer forming step and then heat treating the dried slurry becomes preferably 50 nm to 10 µm, more preferably 50 nm to 5 µm, more preferably 50 nm to 1 µm, more preferably 50 to 800 nm, more preferably 50 to 600 nm, even more preferably 100 to 600 nm, and most preferably 200 to 600 nm.

At the time of forming the porous electrode, a post-processing step of impregnating the porous electrode into a metal precursor-dissolved solution containing a metal element of the metal oxide particle may be further performed.

The metal precursor in the post-processing step may be metal halide including metal chloride, metal fluoride, and metal iodide, the metal precursor-dissolved solution is a solution in which the metal precursor is dissolved at a low concentration of 10 to 200 mM, and the post-processing process may be performed by separating and recovering the porous electrode after the impregnation is performed for 6 to 18 hours.

In the post-processing, when the porous electrode manufactured by applying the slurry containing the metal oxide particle onto the first electrode and then heat-treating the applied slurry is left in a significantly weak metal precursor-dissolved solution, a significantly small metal oxide particle is generated by hydrolysis with the passage of time even at room temperature to thereby be attached to the metal oxide particle of the porous metal oxide layer.

Significantly fine metal oxide particles (post-processing particles) generated by this post-processing are present between particles of the porous metal oxide layer having relatively many defects, such that a flow of the electrons of the metal oxide having a porous structure may be improved, the efficiency of the device may be increased by preventing the electron annihilation, and the specific surface may also be increased.

In this case, before performing the porous metal oxide layer forming step, a step of forming an electron transporting film on the first electrode (a thin film forming step) may be further performed. In the case in which the electron transporting film is formed using a conductive organic material, the thin film forming step may be performed by a solution application method of applying and drying a solution in which the conductive organic material is dissolved onto the first electrode, and in the case in which the electron transporting film is formed using an inorganic material, the thin film forming step may be performed by a chemical or physical deposition method generally used in a semiconductor process, for example, a spray pyrolysis method (SPM), but is not limited thereto.

After the porous metal oxide layer formed on the first electrode to manufacture the porous electrode, a light absorber forming step may be performed.

The light absorber forming step may be performed in multiple steps including a composite forming step of forming the light absorber in the open pores of the porous metal oxide layer; and a light absorption structure forming step, or performed in one step of forming the light absorption structure simultaneously with forming the light absorber in the open pores of the porous metal oxide layer.

In the case of forming the light absorber in multiple steps, in the composite forming step, the light absorber may be formed on the porous electrode using a solution application method, a chemical bath deposition (CBD) method, or a successive ionic layer adsorption and reaction (SILAR) method, and in the light absorption structure forming step, a light absorption structure may be formed by forming a light absorber thin film covering one surface of the porous electrode into which the light absorber is impregnated, a light absorption structure including the light absorber pillars arranged to be spaced apart from each other may be formed by partially etching the formed light absorber thin film in a film thickness direction, or a light absorption structure including a thin film at a lower portion thereof and light absorber pillars arranged to be spaced apart from each other at an upper portion thereof may be formed by partially etching the formed light absorber thin film in the film thickness direction. In this case, at the time of partially etching the light absorber thin film, an etching mask used in a general lithography process may be used.

More specifically, in the case of the SILAR method, after preparing each of the precursor solutions by dissolving a precursor of each of the elements configuring the light absorber, a process of alternately impregnating the porous electrode into each of the precursor solutions and then washing the impregnated electrode is performed as a unit process. The composite layer may be formed by repeating this unit process. In this case, the light absorber may be formed so as to partially or entirely fill in the pores of the porous electrode by adjusting a repetition number of unit process. As the precursor, chloride, iodide, fluoride, nitride, an organic material or an inorganic material may be used. As a non-restrictive and specific example, in the case in which the light absorber is $Sb_2S_3$, which is an inorganic semiconductor, $Sb_2O_3$ may be dissolved as a precursor of Sb in a complex forming agent such as tartaric acid, and $Na_2S_2O_3$ may be used as a precursor of S.

In the case of the CBD method, after preparing each of the precursor solutions by dissolving the precursor of each of the elements configuring the light absorber, each of the precursor solutions is mixed to prepare a mixed solution, and then the porous electrode is impregnated into the mixed solution, thereby manufacturing the composite layer. In this case, the light absorber may be formed so as to partially or entirely fill in the pores of the porous electrode by adjusting concentrations of the precursors in the mixed solution or an impregnation time into the mixed solution. As the precursor, chloride, iodide, fluoride, nitride, an organic material or an inorganic material may be used. As a non-restrictive and specific example, in the case in which the light absorber is $Sb_2S_3$, which is an inorganic semiconductor, Sb-chloride is used as a precursor of Sb, and a sulfur-containing organic material or sulfur-containing inorganic material is used as a precursor of S. As a substantial example of the sulfur-containing inorganic material, there is $Na_2S_2O_3$. The CBD may be performed at 10° C. or less.

In detail, in the case of the solution application method, the composite layer may be manufactured by applying the light absorber dissolved solution onto the porous metal oxide layer. The solution application method is a single process and may be performed with reference to the detailed description of a manufacturing method of the composite layer and the light absorption structure.

The light absorption structure forming step may be performed by forming the light absorber thin film on the composite layer or forming the light absorber thin film and then etching the formed light absorber thin film in the thickness direction. In detail, the light absorption structure forming step may be performed using the above-mentioned solution application method, the SILAR method, and the CBD method or performed by physical/chemical deposition, independently of the composite layer forming step. The etching of the light absorber thin film may be performed using drying etching in order to manufacture plurality of pillars from the light absorber thin film while not etching the composite layer (light absorber of the composite layer). Since a dry etching process is a directional etching process, the light absorber thin film may be partially etched while not damaging the composite layer by adjusting an etching time, thereby manufacturing the pillar.

In this case, a length of the pillar to be manufactured may be controlled by adjusting the thickness of the light absorber thin film, and at the time of dry etching, the etching mask is formed on the light absorber, such that the size, the shape, and density of the pillar may be controlled.

Hereinafter, a manufacturing method of the light absorber and the light absorption structure using a significantly simple and easy method of applying and drying the light absorber dissolved solution (solution application method) will be described in detail.

In the case of the solution application method, since manufacturing of the porous electrode, manufacturing of the composite layer and the light absorption structure, and manufacturing of the hole conductive layer may be entirely performed based on application of slurry or a solution, the solution application method may satisfy manufacturing conditions of a cheap solar cell essential for commercialization of the solar cell and mass produce the solar cell in a short time, thereby enabling the solar cell to be commercialized and popularized.

Further, in the case in which the porous electron transporting material is made of the metal oxide particles, as described above, the continuum may be easily formed by the contact between the metal oxide particles, and empty spaces between the metal oxide particles are connected to each other to form the continuum. In addition, the light absorber partially or entirely fills in the empty space between the metal oxide particles or coated onto surfaces of the metal oxide particles as a coating layer, which is preferable in view of increasing an interfacial area between the electron transporting material and the light absorber. In this case, the light absorber is formed in the empty space of the particles of the porous metal oxide particles including the metal oxide particles, but a shape of the empty space is significantly complicated. Therefore, in view of uniformly coating the light absorber onto the empty space, forming the light absorber so as to stably fill in the empty space, the solution application method of forming the light absorber by applying a liquid phase and volatilizing a solvent may be preferable, and in view of forming the continuum of the light absorber, the solution application method may be preferable.

In the manufacturing method using the solution application method, the light absorber of the light absorber solution may be an organic-inorganic-hybrid semiconductor having the perovskite structure (inorganic-organic hybrid perovskite compound).

In detail, the light absorber solution may be a solution in which a light absorber (inorganic-organic hybrid perovskite compound) having a perovskite structure and satisfying Chemical Formulas 1 to 2, more specifically Chemical Formulas 4 to 7 is dissolved in a solvent.

In detail, the light absorber having a perovskite structure and dissolved in the light absorber solution may be one or at least two selected from compounds satisfying the following Chemical Formulas 1 and 2.

$$AMX_3 \qquad \text{(Chemical Formula 1)}$$

In Chemical Formula 1, A is a monovalent organic ammonium ion or $Cs^+$, M is a divalent metal ion, and X is a halogen ion.

$$A_2MX_4 \qquad \text{(Chemical Formula 2)}$$

In Chemical Formula 2, A is a monovalent organic ammonium ion or $Cs^+$, M is a divalent metal ion, and X is a halogen ion.

In this case, M may be positioned at the center of a unit cell in a perovskite structure, X may be positioned at the center of each side of the unit cell to form an octahedron structure based on M, and A may be positioned at each corner of the unit cell.

In detail, the light absorber having a perovskite structure may be one or at least two selected from compounds satisfying the following Chemical Formulas 4 to 7.

$$(R_1\text{—}NH_{3+})MX_3 \qquad \text{(Chemical Formula 4)}$$

In Chemical Formula 4, $R_1$ (C1-C24)alkyl, (C3-C20)cycloalkyl, or (C6-C20)aryl, M is one or at least two metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X is one or at least two halogen ions selected from $Cl^-$, $Br^-$, and $I^-$.

$$(R_1\text{—}NH_{3+})_2MX_4 \qquad \text{(Chemical Formula 5)}$$

In Chemical Formula 5, $R_1$ is (C1-C24)alkyl, (C3-C20)cycloalkyl, or (C6-C20) aryl, M is one or at least two metal ions selected from $Cu^{2+}$, $Ni^{2+}$, $Co^{2+}$, $Fe^{21}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or at least two halogen ions selected from $Cl^-$, $Br^-$, and $I^-$.

$$(R_2\text{—}C_3H_3N_2{}^+\text{—}R_3)MX_3 \qquad \text{(Chemical Formula 6)}$$

In Chemical Formula 6, $R_2$ is (C1-C24)alkyl, (C3-C20)cycloalkyl, or (C6-C20) aryl, $R_3$ is hydrogen or (C1-C24)alkyl, M is one or at least two metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or at least two halogen ions selected from $Cl^-$, $Br^-$, and $I^-$.

$$(R_2\text{—}C_3H_3N_2{}^+\text{—}R_3)_2MX_4 \qquad \text{(Chemical Formula 7)}$$

In Chemical Formula 7, $R_2$ is (C1-C24)alkyl, (C3-C20)cycloalkyl, or (C6-C20) aryl, $R_3$ is hydrogen or (C1-C24)alkyl, M is one or at least two metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or at least two halogen ions selected from $Cl^-$, $Br^-$, and $I^-$.

For example, the compound having the perovskite structure may be an $AMX_a{}^aX^b{}_y$ or $A_2MX_a{}_xX^b{}_y$ compound (x and y are real numbers satisfying the following Inequalities, respectively: $0<x<3$ and $0<y<3$, $x+y=3$, and $X^a$ and $X^b$ are different halogen ions).

For example, in Chemical Formula 4 or 5, $R_1$ may be (C1-C24)alkyl, preferably (C1-C7)alkyl, and more preferably methyl. As a specific example, the compound having the perovskite structure may be one or at least two selected from $CH_3NH_3PbI_xCl_y$ (x and y are real numbers satisfying the following Equations, respectively: $0 \le x \le 3$ and $0 \le y \le 3$, and $x+y=3$), $CH_3NH_3PbI_xBr_y$ (x and y are real numbers satisfying the following Equations, respectively: $0 \le x \le 3$ and $0 \le y \le 3$, and $x+y=3$), $CH_3NH_3PbCl_xBr_y$ (x and y are real numbers satisfying the following Equations, respectively: $0 \le x \le 3$ and $0 \le y \le 3$, and $x+y=3$), and $CH_3NH_3PbI_xF_y$ (x and y are real numbers satisfying the following Equations, respectively: $0 \le x \le 3$ and $0 \le y \le 3$, and $x+y=3$), or be one or at least two selected from $(CH_3NH_3)_2PbI_xCl_y$ (x and y are real numbers satisfying the following Equations, respectively: $0 \le x \le 4$ and $0 \le y \le 4$, and $x+y=4$), $CH_3NH_3PbI_xBr_y$ (x and y are real numbers satisfying the following Equations, respectively: $0 \le x \le 4$ and $0 \le y \le 4$, and $x+y=4$), $CH_3NH_3PbCl_xBr_y$ (x and y are real numbers satisfying the following Equations, respectively: $0 \le x \le 4$ and $0 \le y \le 4$ and $x+y=4$), and $CH_3NH_3PbI_xF_y$ (x and y are real numbers satisfying the following Equations, respectively: $0 \le x \le 4$ and $0 \le y \le 4$, and $x+y=4$).

For example, in Chemical Formula 6 or 7, $R_2$ may be (C1-C24)alkyl, and $R_3$ may be hydrogen or (C1-C24)alkyl, preferably, $R_2$ may be (C1-C7)alkyl, and $R_3$ may be hydrogen or (C1-C7)alkyl, and more preferably, $R_2$ may be methyl and $R_3$ may be hydrogen.

In detail, the light absorber solution may be a solution in which a material itself satisfying the above-mentioned Chemical Formulas 1 and 2, more specifically, Chemical Formulas 4 to 7 is dissolved in the solvent or a solution in which an organic halide (AX), which is a compound of A and X according to the definitions in Chemical Formula 1, and a metal halide ($MX_2$), which is a compound of M and X according to the definitions in Chemical Formula 1, are mixed with each other at a molar ratio so as to satisfy the above-mentioned Chemical Formulas. In the case in which the light absorber is the inorganic-organic hybrid semiconductor having the perovskite structure (inorganic-organic hybrid perovskite compound, at the time of applying the light absorber solution, the solvent of the light absorber solution is volatilized and removed, and a crystalline phase of the inorganic-organic hybrid perovskite compound of $AMX_3$ (Chemical Formula 1) or $A_2MX_4$ (Chemical Formula 2) may be spontaneously formed.

The solution application method may be performed by applying the light absorber solution onto the porous electrode and then drying the applied light absorber solution. As the solvent of the light absorber solution, any solvent may be used as long as it may dissolve the light absorber and be easily volatilized and removed at the time of drying. For example, the solvent may be a non-aqueous polar organic solvent, more specifically, a non-aqueous polar organic solvent having vapor pressure of 0.01 to 10 mmHg at 20° C. As a non-restrictive example, the solvent of the light absorber solution may be one or at least two selected from gamma-butyrolactone, formamide, N,N-dimethylformamide, diformamide, acetonitrile, tetrahydrofuran, dimethylsulfoxide, diethyleneglycol, 1-methyl-2-pyrrolidone, N,N-dimethylacetamide, acetone, α-terpineol, β-terpineol, dihydroterpineol, 2-methoxyethanol, acetylacetone, methanol, ethanol, propanol, butanol, pentanol, hexanol, ketone, methylisobutyl ketone, and the like.

As an application method of the light absorber solution, a general solution application method used in a semiconductor process or manufacturing process of a solar cell may be used, but in view of uniform application of the solution, treatment of a large area, and a short processing time, a spin coating method may be preferable.

In this case, the composite layer and the light absorption structure positioned on the composite layer may be simultaneously manufactured by applying and drying the light absorber solution in a single process, or the composite layer and the light absorption structure positioned on the composite layer may be manufactured by repeating a process of applying and drying the light absorber solution as a unit process.

As the single process, the solution application method for simultaneously manufacturing the composite layer and the light absorption structure positioned on the composite layer by applying and drying the light absorber solution may be provided in detail. The single process may be preferable in that productivity may be increased, coarse crystalline light absorbers may be formed in the composite layer and the light absorption structure, and excellent interfacial properties between the light absorber of the composite layer and the light absorption structure may be obtained.

In order to simultaneously manufacture the composite layer and the light absorption structure positioned on the composite layer by applying the light absorber solution once, mainly, a concentration of the light absorber solution, the thickness of the porous electron transporting material (specifically, the porous metal oxide), porosity of the porous electron transporting material (specifically, the porous metal oxide), and whether or not the light absorber solution remaining on the porous electron transporting material after application is completed forms a film may be adjusted.

There is a limitation in that the concentration of the light absorber solution may not be increased more than a concentration of the saturated solution, and even though the film of the light absorber solution remains on the porous electron transporting material, the light absorber solution may be continuously consumed toward the porous electron transporting material while the composite layer is formed. Therefore, in order to simultaneously manufacture the composite layer and the light absorption structure positioned on the composite layer by applying the light absorber solution once, the thickness of the porous electron transporting material (specifically, the porous metal oxide) may be mainly controlled.

In the case in which the thickness of the porous electron transporting material is excessively thick, after applying the light absorber solution, the light absorber solution remaining on the composite layer may also be continuously consumed in the composite layer, such that the light absorption structure may not be manufactured. Even though the light absorption structure is manufactured, a surface coverage of the composite layer by the light absorption structure is decreased, such that efficiency improvement may be insignificant. In order to simultaneously manufacture the light absorption structure while forming the light absorber in the composite layer by the solution application method in the single process, the thickness of porous electron transporting material (specifically, the porous metal oxide) may be 1000 nm or less, preferably 800 nm or less, and more preferably 600 nm or less. Here, in view of increasing a contact area (interfacial area) between the electron transporting material and the light absorber in the composite layer, the lower limit of the thickness the porous electron transporting material (specifically, the porous metal oxide) may be 50 nm.

In the case in which the porosity of the porous electron transporting material is excessively high, after applying the light absorber solution, the light absorber solution remaining on the composite layer may also be continuously consumed in the composite layer, such that the light absorption structure may not be manufactured. In order to simultaneously manufacture the light absorption structure while forming the light absorber in the composite layer by the solution application method in the single process, the porosity of the porous electron transporting material may be 30 to 65%, preferably, 40 to 60%.

In order to coat the surface (including the surface by the pores) of the porous metal oxide with the light absorber or fill in the pores of the porous metal oxide layer with the light absorber and simultaneously form the light absorption structure on the electron transporting material impregnated with the light absorber using the solution application method, particularly, by applying and drying the single light absorber solution instead of distributing the light absorber in the metal oxide layer as particles or cluster (aggregates of the particles) independent of each other, it is preferable that a light absorber solution in which the light absorber is dissolved at a high concentration is used.

A concentration of the high concentration light absorber solution is not particularly limited, but in view of stably and reproducibly manufacturing the composite layer and the light absorption structure, the concentration of the light absorber solution may satisfy the following Correlation Equation 2, preferably, the following Correlation Equation 2-1.

$0.4 \ M \leq Ms \leq Msat$ (Correlation Equation 2)

$0.8 \ M \leq Ms \leq Msat$ (Correlation Equation 2-1)

In Correlation Equations 2 and 2-1, Ms is a molar concentration of the light absorber in the light absorber solution, and Msat is a molar concentration of the light absorber in the light absorber solution in a saturated solution state at room temperature (25° C.). As a non-restrictive example, in considering the non-aqueous polar organic solvent having a vapor pressure of 0.01 to 10 mmHg at 20° C., Msat may be in a range of 1.1 to 1.8M.

In this case, the molar concentration of the light absorber in the light absorber solution may be increased more than Msat at 20° C. by adjusting a temperature of the light absorber solution to room temperature or more, and application of the light absorber solution may be performed by adjusting a temperature of the porous electrode so as to be equal or similar to a temperature of the light absorber solution heated to thereby maintain a predetermined temperature or an ambient temperature of a sample at the time of application. This adjustment of the temperature of the light absorber solution, the temperature of the porous electrode at the time of applying the light absorber solution, and/or the ambient temperature at the time of application may be included in a modification example according to the scope of the present invention. In addition, specific examples of the solvent of the light absorber solution are demonstrated based on 20° C., but at the time of applying the light absorber solution, the vapor pressure may be adjusted by adjusting the temperature of the porous electrode and/or the ambient temperature, which may also be included in a modification example according to the scope of the present invention.

At the time of applying the light absorber solution, a detailed method of applying the light absorber solution so that a liquid phase film of the light absorber solution remains on the surface of the porous electron transporting material may be changed according to the application method, but those working in applying a liquid to a base material to form a material film may control the liquid phase film to remain by changing process conditions in various application methods.

At the time of applying the light absorber solution, since the electron transporting material has the porous structure, in view of uniform application of the solution, treatment of a large area, and a short processing time, the spin coating method may be preferable. At the time of applying the light absorber solution using the spin coating method, an rpm of spin coating at which the light absorber solution may be uniformly applied and the liquid phase film of the light absorber solution may remain on the porous electron transporting material may be suitable. When rotational force is excessively small at the time of spin coating, it may be difficult to uniformly apply the light absorber solution onto a large-area porous electron transporting material, and when the rotational force is excessively large, the liquid phase (film) of the light absorber solution does not remain on the porous electron transporting material impregnated with the light absorber solution. Those skilled in the art may deduce various spin coating conditions for allowing the liquid phase film of the light absorber solution to remain on the surface of the electron transporting material while uniformly applying the light absorber solution through repetitive experiments. As a non-restrictive and specific example, the maximum rpm at the time of spin coating is preferably less than 5000 rpm. More stably, the spin coating may be performed preferably at 4000 rpm or less, more preferably at 3000 rpm or less. In this case, the spin coating may be performed in multiple steps so as to gradually increase the rpm in a state in which the maximum rpm is 5000 rpm, preferably 4000 rpm or less, more preferably 3000 rpm or less, and as long as the maximum rpm is 5000 rpm, preferably 4000 rpm or less, more preferably 3000 rpm, various specific methods that are known as an effective method for homogeneously and uniformly applying a liquid at the time of applying a general liquid using the spin coating method may be used. In this case, in view of uniformly applying the light absorber solution onto the large-area porous electron transporting material in a short time, the minimum rpm at the time of spin coating, may be 100 rpm, preferably 500 rpm, and more preferably 1000 rpm.

An amount of light absorber solution applied at the time of spin coating may be suitably adjusted in consideration of the total pore volume (Vs) of the porous electron transporting material. It is preferable that an amount more than the total pore volume is applied so that the light absorber solution may be uniformly applied even on a large area to uniformly and homogeneously form the composite layer and the light absorption structure. As a non-restrictive example, the light absorber solution may be applied 10 to 1000 times as much as the total pore volume (Vs). However, in the case of applying the light absorber solution using the spin coating method, the light absorber solution more than a predetermined amount may be removed by rotational force, such that it is preferable that the solution is applied at an amount more than the total pore volume so that the light absorber solution may be easily, uniformly, and homogeneously injected to the pores of the large-area porous electrode. In this case, the light absorber solution applied onto the porous electron transporting material may be continuously or discontinuously put (injected) into the porous metal oxide during the spin coating or be put (injected) thereinto at one time at the time of initiating the spin coating.

When the composite layer and the light absorption structure by the single solution application method, a size (including a thickness in the case of the thin film) of the light absorption structure formed on the composite layer may be adjusted by adjusting the amount of light absorber solution forming the film and remaining on the porous electron transporting material, the concentration of the light absorber solution, and/or the thickness of the porous electron transporting material.

Here, in the case in which the size of the light absorption structure is adjusted through the thickness of the porous electron transporting material, when the contact area between the electron transporting material and the light absorber is excessively small, power conversion efficiency may be decreased, and the amount of the remaining light absorber solution may have a process variation according to the application method and condition. Therefore, it is preferable to adjust the size of the light absorption structure by adjusting the concentration of the light absorber solution in view of stable, reproducible, and precise adjustment. As a non-restrictive example, a light absorption structure (including the light absorber thin film) having a thickness of 10 to 1000 nm may be manufactured by increasing the concentration of the light absorber solution under the condition at which the concentration of the light absorber solution satisfies the Correlation Equation 2, preferably Correlation Equation 2-1 in a state in which the thickness of the porous electron transporting material and application conditions are fixed.

In the manufacturing method using the solution application method according to the exemplary embodiment of the present invention, the shape of the light absorption structure positioned on the composite layer may be controlled according to the solvent of the light absorber solution. More specifically, the shape of the light absorption structure may be controlled using the vapor pressure (20° C.) of the solvent in the light absorber solution as a factor. In this case, regardless of the vapor pressure of the solvent, the light absorber may be coated or the composite of which the pores are filled with the light absorber may be formed by a limitation of space such as the pores in the porous electron transporting material.

In detail, the light absorber nucleates and grows on the surface or an inner portion of the porous electron transporting material to form the protrusion structure or the film on the surface of the porous electron transporting material, thereby manufacturing the light absorption structure. When the vapor pressure (based on 20° C.) of the solvent in which the light absorber is dissolved is high, driving force for nucleation may be increased by rapid volatilization of the solvent, and the pillar formed from the liquid phase film of the light absorber solution on the porous electron transporting material may be formed in a thick column shape due to rapid volatilization of the solvent. That is, in the case of the solvent having a high vapor pressure, the light absorption structure having a high coverage ($C_{ov}/S_{urf}$) due to a lot of simultaneous nucleation as well as the thick column shape may be formed.

In detail, in the case in which the solvent of the light absorber solution is a non-aqueous polar organic solvent having a vapor pressure (based on 20° C.) of 4 to 100 mmHg, preferably 5 to 10 mmHg, the light absorption structure including the column shaped light absorber pillar as described above may be manufactured, and a surface coverage ($C_{ov}/S_{urf}$) of the composite layer by the light absorption structure may be high (60% or more). A specific example of the non-aqueous polar organic solvent having a vapor pressure (based on 20° C.) of 4 to 100 mmHg may be one or at least two solvents selected from methanol, ethanol, 2-methoxyethanol, diethylethanolamine, and ethylenediamine, but is not limited thereto.

In the case in which the vapor pressure of the solvent in which the light absorber is dissolved is low, driving force for nucleation by volatilization of the solvent may be decreased, but it may be easy to grow the nucleated seed. In addition, at the time of seed growth, materials may be continuously and uniformly supplied by the liquid phase film of the light absorber solution remaining on the porous electron transporting material, such that the material may be continuously supplied in a direction parallel with an electrode surface of the first electrode. Therefore, in the case in which the solvent of the light absorber solution is the non-aqueous polar organic solvent having a vapor pressure (20° C.) of 0.01 to 2 mmHg, preferably 0.1 to 2 mmHg, the light absorption structure including the plate shaped light absorber pillar as described above may be manufactured. A specific example of the non-aqueous polar organic solvent having a vapor pressure (20° C.) of 0.01 to 2 mmHg may be one or at least two solvents selected from gamma-butyrolactone, ethylene glycol, diethylene glycol, diethylenetriamine, N-methylethanolamine, N-methyl-2-pyrrolidone (pyrrolidone), and dimethylsulfoxide, but is not limited thereto.

When the vapor pressure of the solvent in which the light absorber is dissolved is lower than that of the solvent at the time of manufacturing the column shaped pillar and higher than that of the solvent at the time of manufacturing the plate shaped pillar, driving force for nucleation and a seed growth rate may balance with each other. As nucleation and growth of the nucleated seed actively and similarly occur at the same time, a solute (light absorber) may be heterogeneous in the applied light absorber solution, such that the material may be heterogeneously supplied to the growing seed. Therefore, in the case in which the solvent of the light absorber solution is a non-aqueous polar organic solvent having a vapor pressure (20° C.) of 2 to 4 mmHg, preferably, 2.5 to 4 mmHg, the light absorption structure including a light absorber pillar having a large aspect ratio, including the needle, wire, or rod shaped pillar as described above may be manufactured. A specific example of the non-aqueous polar organic solvent having a vapor pressure (20° C.) of 2 to 4 mmHg may be one or at least two solvents selected from N,N-dimethylformamide (DMF) and dimethylacetamide, but is not limited thereto.

In the manufacturing method using the solution application method according to the exemplary embodiment of the present invention, the solvent of the light absorber solution may be a mixed solvent (first mixed solvent) in which at least two non-aqueous polar organic solvents having different vapor pressures from each other are mixed. As described above, the pillar shape and size of the light absorption structure may be controlled using the vapor pressure of the single solvent of the light absorber solution, and the pillar shape and size of the light absorption structure may be controlled and the surface coverage ($C_{ov}/S_{urf}$) of the composite layer by the light absorption structure may be controlled by using the mixed solvent in which at least two non-aqueous polar organic solvents having different vapor pressures from each other are mixed.

More specifically, the pillar size and the surface coverage of the composite layer by the pillar may be controlled or the light absorption structure having a structure of the light absorber thin film formed with the light absorber pillar may be manufactured by using the mixed solvent.

More specifically, at least one factor selected from the surface area ($=C_{ov}/S_{urf}$) of the composite layer covered by the light absorption structure and the size or shape of the light absorption structure may be controlled by controlling a mixing volume ratio between a first solvent having a relatively high vapor pressure and a second solvent having a relatively low vapor pressure in the mixed solvent.

A degree of nucleation and a degree of seed growth of the light absorber configuring the light absorption structure may be artificially adjusted by using the mixed solvent in which the first solvent having a relatively high vapor pressure and the second solvent having a relatively low vapor pressure are mixed, and the degree of nucleation and the degree of seed growth of the light absorber may be relatively independently adjusted.

In the mixed solvent, a vapor pressure of the first solvent having a relatively high vapor pressure may be 2 to 20 times higher than that of the second solvent having a relatively low vapor pressure. A ratio between the vapor pressure of the first solvent and the vapor pressure of the second solvent (vapor pressure of the first solvent/vapor pressure of the second solvent) is out of the range of 2 to 20, a light absorption structure having a shape similar to that of a light absorption structure formed by the first or second solvent may be manufactured due to an excessive difference in vapor pressure or a light absorption structure having a shape similar to that of a light absorption structure in the case of using a single solvent may be manufactured due to an insignificant difference in vapor pressure.

The vapor pressure of the second solvent may be 0.01 to 4 mmHg, preferably 0.1 to 4 mmHg at 20° C. As the second solvent, any non-aqueous polar organic solvent may be used as long as it may dissolve the light absorber and has the above-mentioned vapor pressure. A specific example of the second solvent may be one or at least two solvents selected from gamma-butyrolactone, ethylene glycol, diethylene glycol, diethylenetriamine, N-methylethanolamine, N-methyl-2-pyrrolidone, N,N-dimethylformamide (DMF), and dimethylsulfoxide, but is not limited thereto. As the first solvent, any non-aqueous polar organic solvent may be used as long as it may satisfy the above-mentioned ratio of the vapor pressure (vapor pressure of the first solvent/vapor pressure of the second solvent) based on the vapor pressure of the second solvent and dissolve the light absorber. A specific example of the first solvent may be one or at least two solvents selected from methanol, ethanol, 2-methoxy ethanol, diethylethanolamine, and ethylenediamine, but is not limited thereto.

The mixed solvent may contain 0.1 to 99.9 volume % of the first solvent and 99.9 to 0.1 volume % of the second solvent, more specifically, 1 to 99 volume % of the first solvent and 99 to 1 volume % of the second solvent. In the case in which a content of the mixed first solvent (or second solvent) is less than 0.1 volume %, an influence by the first solvent (or second solvent) may be insignificant, such that a structure similar to that in the case of using the single solvent rather than the mixed solvent may be obtained.

Preferably, a volume ratio of two solvents contained in the mixed solvent and having different vapor pressure, that is a volume ratio V2/V1 of a volume V2 of the second solvent to a volume V1 of the first solvent may be 2 or less, preferably 1 or less, more preferably 0.5 or less, more preferably 0.3 or less, even more preferably 0.25 or less, most preferably 0.15 or less, and the minimum value of a substantial volume ratio V2/V1 may be 0.001. In the case in which the volume ratio V2/V1 of a volume V2 of the second solvent to a volume V1 of the first solvent is 0.5 or less, a light absorption structure including a fine column or plate shaped pillar having a diameter of 10 μm or less may be formed, and a light absorption structure by which a surface coverage of the composite layer is 60% or more ($C_{ov}/S_{urf}=0.60$) may be formed. In addition, a solar cell having excellent optical properties, that is, short-circuit current density of 20 mA/cm² or more, open circuit voltage of 0.95V or more, and a fill factor of 0.7 or more may be manufactured, and a solar cell having power conversion efficiency of 13% or more may be manufactured. In the case in which the volume ratio V2/V1 of a volume V2 of the second solvent to a volume V1 of the first solvent is 0.25 or less, a light absorption structure including a fine column shaped pillar having a diameter of 2 μm or less and a length of 500 nm or less may be formed, and a light absorption structure by which a surface coverage of the composite layer is 70% or more ($C_{ov}/S_{urf}=0.70$) may be formed. In addition, a solar cell having excellent optical properties, that is, short-circuit current density of 20 mA/cm² or more, open circuit voltage of 1V or more, and a fill factor of 0.70 or more may be manufactured, and a solar cell having power conversion efficiency of 14% or more may be manufactured. In the case in which the volume ratio V2/V1 of a volume V2 of the second solvent to a volume V1 of the first solvent is 0.15 or less, a light absorption structure in which a fine column shaped pillar having a diameter of 2 µm or less and a wire web are mixed, or a light absorption structure formed with a fine column shape pillar and having a thin film structure may be formed. In this case, the surface coverage of the composite layer may be 80% or more ($C_o/S_{urf}$=0.8) by the light absorption structure including the wire web or thin film structure. In addition, a solar cell having excellent optical properties, that is, short-circuit current density of 21.6 mA/cm$^2$ or more, open circuit voltage of 1.05V or more, and a fill factor of 0.72 or more may be manufactured, and a solar cell having power conversion efficiency of 16% or more may be manufactured. In this case, the minimum volume ratio V2/V1 of the second solvent having a relatively low vapor pressure to the first solvent having a relatively high vapor pressure may be 0.001 or more, preferably 0.01 or more, and more preferably 0.05 or more in view of stably securing an effect caused by mixing the first and second solvents having different vapor pressure.

In the manufacturing method using the solution application method according to the exemplary embodiment of the present invention, after forming the porous electrode, as described above, the shape of the light absorption structure may be controlled using the solvent of the light absorber solution, and independently, the light absorption structure including light absorber thin film may be manufactured by using a mixed solvent (second mixed solvent) in which a solvent of the light absorber and a non-solvent that does not dissolve the light absorber are mixed or applying the light absorber solution and the non-solvent. In this case, a method of sequentially applying the light absorber solution and the non-solvent may be preferable in view that the light absorber may be stably filled in the pores of the porous electron transporting material and the light absorption structure may be stably and reproducibly manufactured, as compared to the case in which the light absorber solution is prepared using the mixed solvent (second mixed solvent) in which the solvent and the non-solvent are mixed.

In detail, this method may include a step of applying the light absorber solution in which the light absorber corresponding to the inorganic-organic hybrid perovskite compound according to the above-mentioned Chemical Formula is dissolved in the solvent onto the porous electron transporting material of the porous electrode; and a step of contacting the porous electron transporting material applied with the light absorber solution and the non-solvent of the light absorber with each other. That is, this method may include the applying step of the light absorber solution onto the porous electron transporting material; and the step of contacting the light absorber solution applied onto the porous electron transporting material with the non-solvent of the light absorber.

The light absorption structure including the light absorber thin film by which the surface coverage ($=C_o/S_{urf}$) of the composite layer is high and the light absorption structure including a denser light absorber thin film may be manufactured by contacting the porous electron transporting material on which the light absorber solution applied with the non-solvent of the light absorber after applying the light absorber solution.

Since the step of applying the light absorber solution in which the light absorber corresponding to the inorganic-organic hybrid perovskite compound according to the above-mentioned Chemical Formula is dissolved in the solvent onto the porous electron transporting material is similar to that in the above-mentioned solution application method using the single or mixed solvent, a detailed description thereof will be omitted.

The non-solvent of the light absorber may mean an organic solvent in which the light absorber may not be dissolved, specifically, an organic solvent in which solubility of the light absorber at 20° C. and 1 atm is less than 0.1M, specifically 0.01M, and more specifically 0.001M. Examples of the non-solvent of the light absorber may include a solvent having immiscible or miscible with the solvent of the light absorber solution. In this case, the immiscible solvent may mean a solvent that is separated from the solvent of the light absorber solution in a static state in which physical stirring is not performed at the time of being mixed with the solvent of the light absorber solution, and the miscible solvent may mean a solvent is not separated from the solvent of the light absorber solution in a static state in which physical stirring is not performed at the time of being mixed with the solvent of the light absorber solution.

More specifically, the non-solvent of the light absorber may be a non-polar organic solvent, preferably a non-polar organic solvent having permittivity (ε; relative permittivity) of 20 or less, substantially permittivity of 1 to 20. A specific example of the non-solvent of the light absorber may be one or at least two selected from pentane, hexene, cyclohexene, 1,4-dioxane, benzene, toluene, triethylamine, chlorobenzene, ethylamine, ethylether, chloroform, ethylacetate, acetic acid, 1,2-dichlorobenzene, tert-butylalcohol, 2-butanol, isopropanol, and methylethylketone, but is not limited thereto.

The non-solvent of the light absorber may be a non-solvent having permittivity of preferably 5 or less, substantially 1 to 5. A specific example of the non-solvent may be one or at least two selected from pentane, hexene, cyclohexene, 1,4-dioxane, benzene, toluene, triethylamine, chlorobenzene, ethylamine, ethylether, and chloroform, but is not limited thereto.

The pores of the porous electron transporting material may be filled with the light absorber solution and the film of the light absorber solution may be formed on the surface of the porous electron transporting material by applying the light absorber solution. A film of the non-solvent may be formed on the porous electron transporting material by subsequently applying the non-solvent. The film of the non-solvent may serve to restrict the light absorber on the surface of the porous electron transporting material in a vertical direction (a direction from the first electrode toward the second electrode) so as not to grow, such that the light absorption structure including the porous film type or dense film type light absorber thin film may be manufactured. Since growth of the surface of the porous electron transporting material in the vertical direction may be restricted by the non-solvent, any polar organic solvent as described above may be used as the solvent of the light absorber solution, and the mixed solvent as described above may be used.

In the case of manufacturing a large-area solar cell, in order to allow the growth in the vertical direction to be homogeneously and uniformly suppressed by the non-solvent, at the time of applying the non-solvent, it is preferable that application is performed so as to form the film of the non-solvent on the surface the porous electron transporting material.

The contact between the light absorber solution applied onto the porous electron transporting material and the non-solvent of the light absorber may be generated by applying the non-solvent again onto the porous electron transporting material applied with the light absorber solution. More specifically, the contact may be generated by reapplying the non-solvent while or after the light absorber solution is applied onto the porous electron transporting material. As described above, various application methods may be used, but in view of uniform application of the solution, treatment of a large area, and a short processing time, the spin coating method may be preferable. At the time of applying the light absorber solution and reapplying the non-solvent, the spin coating method may also be used.

As long as the non-solvent may be applied in a state in which the light absorber solution remains on the porous electron transporting material, any application method and condition may be used, but more specific application conditions will be described based on the spin coating method, which is a preferable application method.

Similarly to the manufacturing method of the light absorption structure using a single solution application process without using the non-solvent as described above, those skilled in the art may deduce various spin coating conditions for allowing the liquid phase of the non-solvent to remain on the surface of the electron transporting material through repetitive experiments.

As a non-restrictive and specific example, at the time of spin coating for applying the non-solvent, the non-solvent having a volume corresponding to 1 to 1000 times, preferably 1 to 10 times of the total pore volume Vs of the porous electron transporting material may be put (injected), and the maximum rpm may be 5000 rpm, preferably 4000 rpm or less, and more preferably 3000 rpm or less. Similarly to the case of applying the light absorber solution, the minimum rpm at the time of spin coating may be 100 rpm, preferably 500 rpm, and more preferably 1000 rpm.

Since growth of the light absorber in the vertical direction is restricted by the application of the non-solvent, the non-solvent may be preferably applied in a state in which the light absorber may be generated or grow from the light absorber solution applied onto the porous electron transporting material. In detail, the non-solvent may be preferably applied in a state in which the light absorber solution remains on the porous electron transporting material.

Specifically, after application of the light absorber solution using the spin coating method is completed, the non-solvent may be sequentially applied, or after the light absorber solution is injected into a region of the porous electron transporting material corresponding to the rotational center, while the electron transporting material is rotated so as to uniformly disperse the injected light absorber solution, the non-solvent may be reinjected into the region of the porous electron transporting material corresponding to the rotational center.

As described above, after or while the light absorber solution is applied, the non-solvent may be reapplied, and a reapplication timing point of the non-solvent may be adjusted in consideration of the vapor pressure of the non-aqueous polar organic solvent, which is the solvent of the light absorber solution.

More specifically, in the case in which the non-aqueous polar organic solvent used as the solvent of the light absorber solution has a high vapor pressure of 4 mmHg or more, in order to apply the non-solvent in a state in which the light absorber solution stably remains on the surface of the electron transporting material, the non-solvent may be applied during application of the light absorber solution, that is, during rotation for injecting the light absorber solution into the rotational center of spin coating and dispersing the light absorber solution. In consideration of a size of a solar cell to be manufactured, a time interval between a timing point at which injection of the light absorber solution into the rotational center of spin coating is completed and a timing point at which the non-solvent is injected may be suitably adjusted, but as a non-restrictive and specific example, the non-solvent may be injected after 1 to 100 seconds immediately after the injection of the light absorber solution is completed. In this case, a specific example of the non-aqueous polar organic solvent having a high vapor pressure of 4 mmHg or more may be one or at least two solvents selected from methanol, ethanol, 2-methoxy ethanol, diethylethanolamine, and ethylenediamine, but is not limited thereto.

In the case in which the non-aqueous polar organic solvent used as the solvent of the light absorber solution has a low vapor pressure less than 4 mmHg, since volatilization of the solvent of the light absorber solution is not fast, the non-solvent may be applied while or after the light absorber solution is applied as described above. In the case in which the non-solvent is reapplied after application of the light absorber solution is completed, application times of the light absorber solution and the non-solvent using the spin coating method may also be adjusted in consideration of a size of a solar cell to be manufactured, but as a non-restrictive example, the spin coating for applying the light absorber solution may be performed for 1 to 150 seconds, preferably 10 to 150 seconds, the spin coating for applying the non-solvent may be performed for 1 to 60 seconds, and after application of the light absorber solution is completed, the non-solvent may be applied. A specific example of the non-aqueous polar organic solvent having a low vapor pressure less than 4 mmHg may be one or at least two solvents selected from gamma-butyrolactone, ethylene glycol, diethylene glycol, diethylenetriamine, N-methylethanolamine, N-methyl-2-pyrrolidone, N,N-dimethylformamide (DMF), and dimethylsulfoxide, but is not limited thereto.

In view of process reproducibility and stability, the case in which the non-solvent is sequentially applied after application of the light absorber solution is completed may be preferable as compared to the case in which the non-solvent is applied while the light absorber solution is applied, and an influence by changes in external process parameters (for example, an ambient temperature at the time of spin coating) on the light absorption structure may be minimized.

In addition, in view of manufacturing the light absorption structure including a denser light absorber thin film, it is preferable that the non-solvent is applied when the applied light absorber solution may have sufficient light absorber precipitation capacity. Therefore, in order to more reproducibly and stably manufacture the light absorption structure including the dense film type light absorber thin film, it is preferable that the solvent of the light absorber solution is a non-aqueous polar solvent having a vapor pressure of 4 mmHg or less, preferably 2 mmHg or less. That is, in view of manufacturing the light absorption structure having a stable process margin and including a light absorber thin film composed of coarse grains, it is preferable that the solvent of the light absorber solution is a non-aqueous polar solvent having a vapor pressure of 4 mmHg or less, preferably 2 mmHg or less.

In order to more reproducibly manufacture the light absorption structure including the light absorber thin film composed of denser and coarse grains by applying the non-solvent, the solvent of the light absorber solution may be a mixed solution (third mixed solvent) in which at least two solvents having different vapor pressure are mixed.

In the case of using the mixed solvent (third mixed solvent) at the time of applying the non-solvent, the mixed solvent (third mixed solvent) may be equal or similar to the above-mentioned mixed solvent (first mixed solvent) used in the above-mentioned method for simultaneously manufacturing the composite layer and the light absorption structure without using the non-solvent and include all of the specific contents of the above-mentioned mixed solvent (first mixed solvent). Independently, the mixed solvent (third mixed solvent) used at the time of applying the non-solvent may satisfy conditions to be described below. At the time of using the non-solvent, since growth of the light absorber may be controlled by the non-solvent, at the time of controlling a micro-structure of the light absorption structure, the micro-structure is not sensitively changed according to the kind and the relative volume ratio of solvents in the mixed solvent, such that conditions of the mixed solvent (third mixed solvent) may be adjusted so that a more stable process (that is, application of the non-solvent after the application of the light absorber solution is completed) may be implemented and the light absorber composed of the coarse grains may be formed. However, in the case of using the non-solvent, the solar cell may be manufactured using the above-mentioned mixed solvent (first mixed solvent).

As described above, the light absorber solution is prepared using the mixed solvent (third mixed solvent) in which at least two solvents having different vapor pressure are mixed simultaneously with using the non-solvent, such that even though the non-solvent is applied after application of the light absorber solution is completed, including the composite layer and the light absorption structure including the light absorber thin film may be stably manufactured with high reproducibility while having excellent process margin, and the light absorption structure composed of the coarse light absorber grains may be manufactured.

More specifically, in the mixed solvent (third mixed solvent), a vapor pressure of a solvent (third solvent) having a relatively high vapor pressure may be 2 to 20 times higher than that of a solvent (fourth solvent) having a relatively low vapor pressure, and the solvent having a relatively high vapor pressure may have a vapor pressure of 1 to 100 mmHg at 20° C. More specifically, the solvent (third solvent) having a relatively high vapor pressure may be one or at least two solvents selected from gamma-butyrolactone (GBL), N,N-dimethylformamide (DMF), methanol, ethanol, 2-methoxyethanol, diethylethanolamine, and ethylene diamine, but is not limited thereto. More specifically, the solvent (fourth solvent) having a relatively low vapor pressure may be one or at least two solvents selected from ethylene glycol, diethylene glycol, diethylenetriamine, N-methylethanolamine, N-methyl-2-pyrrolidone, and dimethylsulfoxide, but is not limited thereto. In this case, the mixed solvent (third mixed solvent) may contain 0.05 to 99.95 volume % of the third solvent and 99.95 to 0.05 volume % of the fourth solvent, more specifically, 1 to 99 volume % of the third solvent and 99 to 1 volume % of the fourth solvent. The stable process margin may be secured and more coarse light absorber may be formed by the condition as described above.

In the case of manufacturing the light absorption structure including the light absorber thin film using the non-solvent, when a volume ratio (V4/V3) of a volume V4 of the solvent (fourth solvent) having a relatively low vapor pressure to a volume V3 of solvent (third solvent) having a relatively high vapor pressure in the mixed solvent (third mixed solvent) is 4 or more, the light absorption thin film having a porous film shape may be manufactured.

In the case of manufacturing the light absorption structure including the light absorber thin film using the non-solvent, when a volume ratio (V4/V3) of a volume V4 of the solvent having a relatively low vapor pressure to a volume V3 of solvent having a relatively high vapor pressure in the mixed solvent is less than 4, preferably 2.5 or less, and more preferably 1.5 or less, the light absorption thin film having a dense film shape may be manufactured. In this case, in order to manufacture high quality dense film in which remaining pores such as a pore trapped at a triple point is prevented, the volume ratio (V4/V3) may be preferably 1 or less, more preferably 0.7 or less, and most preferably 0.3 or less. In this case, the volume ratio (V4/V3) is more than 0, and in view of coarsening the light absorber grains forming the light absorber thin film by the mixed solution (third mixed solvent), the volume ratio (V4/V3) may be 0.001 or more, preferably 0.01 or more.

At the time of sequentially applying the light absorber solution and the non-solvent (that is, when the spin coating for applying the light absorber solution and the spin coating for applying the non-solvent are separately performed), it is preferable that after the spin coating of the light absorber solution is completed, the drying of the light absorber solution is not performed, and immediately after the spin coating of the light absorber solution is completed, the non-solvent is applied. Thereafter, the drying may be performed. In addition, when the non-solvent is applied while the light absorber solution is applied (that is, the light absorber solution and the non-solvent are applied by a single spin coating process), after the spin coating is completed, the drying may be performed.

At the time of simultaneously manufacturing the composite layer and the light absorber using the solution application method, after applying the light absorber solution (the case of not applying the non-solvent) or after applying the non-solvent, the drying is not particularly limited, but may be performed at 60 to 150° C. under atmospheric pressure for 1 to 100 minutes.

After the light absorbers (light absorbers of the composite layer and the light absorption structure) are formed using the above-mentioned solution application method, an etching step of dry etching the light absorption structure including the light absorber pillar protruding to thereby be extended from the composite layer, the light absorber thin film extended from the composite layer, or the light absorber thin film formed with the protrusion structure of the light absorber pillar may be further performed. This is to further finely form the light absorption structure, preferably, the pillar, and in case in which the coarse light absorber protrudes to thereby be formed from the composite layer, this etching step is performed in order to manufacture this light absorber into a fine pillar aggregate. The dry etching may include plasma etching, and as plasma used in the etching step, any plasma formed under vacuum or at atmospheric pressure may be used. In this case, at the time of plasma etching, the pillar aggregates may be formed by adjusting etching power, an etching time, and a kind and amount of gas forming plasma. In this case, since the light absorber extended and protruding from the composite layer is allowed to be finely formed, even in the case of performing simple plasma etching without using an etching mask, the pillar aggregates may be manufactured due to directionality and non-uniformity of the etching. In detail, at the time of atmospheric plasma etching, at least two etching gases selected from argon, nitrogen, oxygen, and hydrogen may be used, plasma power may be 50 to 600 W, a plasma etching time may be 10 seconds or 1 hour, and a plasma exposure time may be changed according to plasma power. In addition, the etching process may be performed by exposing the light absorption structure to the plasma for a long time or repetitively exposing the light absorption structure to the plasma for a short time (several seconds).

After forming the above-mentioned composite layer and light absorption structure and selectively performing the plasma etching step, a hole conductive layer forming step may be performed.

The hole conductive layer forming step may be performed by applying and drying a solution containing the organic hole transporting material so as to cover an upper portion of the composite layer formed with the light absorption structure. Application may be performed by a solution application method generally used in a semiconductor or a solar cell manufacturing field, but a spin coating method may be preferable. A thickness of the organic hole transporting material (hole conductive layer) is not limited as long as the organic hole transporting material may stably and homogeneously contact the composite layer formed with the light absorption structure. As a non-restrictive example, the thickness may be 5 to 500 nm.

As a solvent used for forming the hole conductive layer, any solvent may be used as long as it may dissolve the organic hole transporting material and does not chemically react with the materials of the light absorber and the porous electrode. As an example, the solvent used for forming the hole conductive layer may be a non-polar solvent. As a substantial example, the solvent may be one or at least two solvents selected from toluene, chloroform, chlorobenzene, dichlorobenzene, anisole, xylene, and hydrocarbon based solvents having 6 to 14 carbon atoms, but is not limited thereto.

The solution containing the organic hole transporting material (hole transporting material solution) may further contain one or at least two additives selected from tertiary butyl pyridine (TBP), lithium bis(trifluoro methanesulfonyl) imide (LiTFSI), and tris(2-(1H-pyrazol-1-yl)pyridine)cobalt (III), together with the organic hole transporting material described above based on the solar cell. The additive may be added at a content of 0.05 to 100 mg per 1 g of the organic hole transporting material.

After the hole conductive layer forming step is performed, a second electrode forming step may be performed. The second electrode forming step may be performed by a general metal deposition method used in the semiconductor process. As an example, the second electrode may be formed using physical vapor deposition or chemical vapor deposition, and may be formed using thermal evaporation. A thickness of the second electrode is not limited as long as the second electrode may stably and homogeneously contact the hole conductive layer and the photo current may stably move. As a non-restrictive example, the thickness of the second electrode may be 5 to 500 nm.

The present invention includes a solar cell manufactured by the above-mentioned manufacturing method.

The present invention may include the above-mentioned solar cell or a covered solar cell including the solar cell manufactured by the above-mentioned manufacturing method; and an encapsulant covering the solar cell. The encapsulant may partially or entirely cover a surface of the solar cell and be a transparent resin. The present invention may include the above-mentioned solar cell or a covered solar cell including the solar cell manufactured by the above-mentioned manufacturing method; and a transparent resin layer covering the solar cell. The transparent resin layer may serve to prevent transmission of moisture and/or oxygen simultaneously with protecting the surface of the solar cell. As the transparent resin of the transparent resin layer, a resin used as an encapsulant for protecting a glass solar cell may be used. As a specific example of the transparent resin may include a polyethylene based resin, a polypropylene based resin, a cyclic polyolefin based resin, a polystyrene based resin, an acrylonitrile-styrene copolymer, an acrylonitrile-butadiene-styrene copolymer, a polyvinylchloride based resin, a fluorine based resin, a poly(meth)acrylic resin, a polycarbonate based resin, and a mixture thereof. Further, the transparent resin layer may further contain an adsorbent adsorbing oxygen and/or moisture for preventing transmission of oxygen and/or moisture, and this adsorbent may be distributed on the transparent resin layer in a particle phase or embedded in the transparent resin layer while forming a predetermined layer. As the above-mentioned adsorbent, all of the materials that are known to adsorb moisture and/or oxygen may be used. A specific example may include an alkali earth metal such as Ca or Sr, an alkaline earth metal oxide such as CaO or SrO, Fe, ascorbic acid, a hydrazine compound, or a mixture thereof, but is not limited thereto.

The present invention includes a solar cell module using the above-mentioned solar cell or the solar cell manufactured by the above-mentioned manufacturing method as a unit cell and including at least two cells arranged therein and electrically connected to each other. The solar cell module may have a cell arrangement and structure generally used in the solar cell field, and further include a general light concentration means, and a general light block guiding a path of the solar light.

The present invention includes a device supplied with power by the above-mentioned solar cell or a solar cell manufactured by the above-mentioned manufacturing method.

Preparation Example 1

Manufacturing Porous $TiO_2$ Thin Film Substrate

After a glass substrate on which fluorine containing tin oxide is coated (F-doped $SnO_2$, 8 ohms/cm$^2$, Pilkington, hereinafter, FTO substrate (first electrode)) was cut to a size of 25×25 mm, end portions thereof were etched to partially remove FTO.

A dense $TiO_2$ film having a thickness of 50 nm was manufactured on the cut and partially etched FTO substrate by a spray pyrolysis method as a metal oxide thin film. The SPM was performed using a titanium acetylacetonate (TAA):EtOH (1:9 v/v %) solution, and the thickness was controlled by repeating a process of spraying the solution onto the FTO substrate positioned on a hot plate maintained at 450° C. for 3 seconds and stopping for 10 seconds.

5 ml of ethyl cellulose solution in which 10 weight % of ethyl cellulose is dissolved in ethyl alcohol was added to $TiO_2$ powder having an average particle size (diameter) of 50 nm (preparing by hydrothermal treatment of titanium perocomplex aqueous solution in which 1 weight % of $TiO_2$ is dissolved at 250° C. for 12 hours) per 1 g of $TiO_2$, and 5 g of terpinol was added thereto per 1 g of $TiO_2$ and then mixed, followed by removing ethyl alcohol by a vacuum distillation method, thereby preparing a $TiO_2$ paste.

Ethanol was added to the prepared $TiO_2$ powder paste, thereby preparing $TiO_2$ slurry for spin coating. The $TiO_2$ slurry for spin coating was coated onto the $TiO_2$ thin film on the FTO substrate by a spin coating method and heat treated at 500° C. for 60 minutes. Then, after the heat treated substrate is immersed in 30 mM TiCl$_4$ aqueous solution at 60° C. and left for 30 minutes, the substrate was washed and dried using deionized water and ethanol, followed by heat treatment at 500° C. for 30 minutes, thereby manufacturing a porous TiO$_2$ thin film (porous electron transporting material).

In this case, a thickness of the porous TiO$_2$ thin film (porous electron transporting material) was adjusted by changing a mixing degree of ethanol added to the prepared TiO$_2$ powder paste and spin coating conditions of the TiO$_2$ slurry for spin coating. A porous TiO$_2$ thin film (porous electron transporting material, Preparation Example 1-1) having a thickness of 1000 nm was manufactured by mixing the TiO$_2$ powder paste and ethanol with each other at a mixing weight ratio of 2 (TiO$_2$ powder paste):3 (ethanol) and then spin coating at 1000 rpm, and a porous TiO$_2$ thin film (porous electron transporting material, Preparation Example 1-2) having a thickness of 800 nm was manufactured by mixing the TiO$_2$ powder paste and ethanol with each other at a mixing weight ratio of 2 (TiO$_2$ powder paste):3 (ethanol) and then spin coating at 1500 rpm. A porous TiO$_2$ thin film (porous electron transporting material, Preparation Example 1-3) having a thickness of 600 nm was manufactured by mixing the TiO$_2$ powder paste and ethanol with each other at a mixing weight ratio of 1 (TiO$_2$ powder paste):2 (ethanol) and then spin coating at 1000 rpm, and a porous TiO$_2$ thin film (porous electron transporting material, Preparation Example 1-4) having a thickness of 300 nm was manufactured by mixing the TiO$_2$ powder paste and ethanol with each other at a mixing weight ratio of 1 (TiO$_2$ powder paste):3 (ethanol) and then spin coating at 1000 rpm. A porous TiO$_2$ thin film (porous electron transporting material, Preparation Example 1-5) having a thickness of 100 nm was manufactured by mixing the TiO$_2$ powder paste and ethanol with each other at a mixing weight ratio of 1 (TiO$_2$ powder paste):5 (ethanol) and then spin coating at 3000 rpm. A specific surface area of the prepared porous electron transporting material was 33 m$^2$/g, and porosity (apparent porosity) thereof was 50%.

Preparation Example 2

Preparation of Light Absorber Solution

Methylammonium iodide (CH$_3$NH$_3$I) and lead diiodide (PbI$_2$) were dissolved at a molar ratio of 1:1 in gamma-butyrolactone and stirred at 60° C. for 12 hours, thereby preparing 1.2M methylammonium leadtriiodide solution (CH$_3$NH$_3$PbI$_3$, Preparation Example 2-1). 0.8M methylammonium leadtriiodide solution thereof (Preparation Example 2-2) and 0.5M methylammonium leadtriiodide solution (Preparation Example 2-3) were prepared by the same method.

Preparation Example 3

Preparation of Perovskite Light Absorber According to the Thickness of Porous Electrode 1.2M methylammonium leadtriiodide solution (total volume: 1 ml, at least 700% based on the total pore volumes of the porous electron transporting material) prepared in Preparation Example 2-1 was applied onto (injected into) porous electrodes formed with the porous electron transporting material having a thickness of 1000, 800, 600, 300, or 100 nm prepared in Preparation Examples 1-1 to 1-5, and spin coating was performed at 3000 rpm for 100 seconds, followed by drying at 100° C. under atmospheric pressure for 10 minutes, thereby forming the perovskite light absorber. At the time of preparing the light absorber, environmental conditions were maintained at a temperature of 25° C. and relative humidity of 25%.

When the thickness of the porous electron transporting material was 1000 nm (Preparation Example 3-1), the light absorber having a pillar shape was prepared, but it may be appreciated that the coverage ($C_{ov}/S_{urf}$) was low (about 10%). However, it may be appreciated that in the case in which the thickness of the porous electron transporting material was 800 nm (Preparation Example 3-2), the coverage ($C_{ov}/S_{urf}$) was about 30%, in the case in which the thickness of the porous electron transporting material was 600 nm (Preparation Example 3-3), the coverage ($C_{ov}/S_{urf}$) was about 40%, and in the cases in which the thickness of the porous electron transporting material was 300 nm (Preparation Example 3-4) or 100 nm (Preparation Example 3-5), the coverage ($C_{ov}/S_{urf}$) was significantly high at about 45%.

Preparation Example 4

Preparation of Perovskite Light Absorber According to the Spin RPM of Spin Coating 1.2M methylammonium leadtriiodide solution (total volume: 1 ml, at least 700% based on the total pore volumes of the porous electron transporting material) prepared in Preparation Example 2-1 was applied onto (injected into) porous electrodes formed with the porous electron transporting material having a thickness of 600 nm prepared in Preparation Example 1-3, and spin coating was performed at 1000 (Preparation Example 4-1), 2000 (Preparation Example 4-2), 3000 (Preparation Example 4-3), 4000 (Preparation Example 4-4), 5000 (Preparation Example 4-5) and 6000 (Preparation Example 4-6) rpm for 100 seconds, respectively, followed by drying at 100° C. under atmospheric pressure for 10 minutes, thereby forming the perovskite light absorber. At the time of preparing the light absorber, environmental conditions were maintained at a temperature of 25° C. and relative humidity of 25%.

It was confirmed that at the time of spin coating at 6000 rpm (Preparation Example 4-6), a light absorption structure was not formed, and the light absorption structure was formed from at 5000 rpm (Preparation Example 4-5). The coverage ($C_{ov}/S_{urf}$) was 20% at 5000 rpm, the coverage ($C_{ov}/S_{urf}$) was 28% at 4000 rpm (Preparation Example 4-4), and the lower the rpm, the higher the coverage. In addition, the coverage ($C_{ov}/S_{urf}$) at 3000 rpm (Preparation Example 4-3), 2000 rpm (Preparation Example 42), and 1000 rpm (Preparation Example 4-1) was 40%, 45%, and 45%, respectively, such that it may be appreciated that the coverage was saturated.

Preparation Example 5

Preparation of Light Absorber According to the Concentration of Light Absorber Solution 0.5M (Preparation Example 5-3), 0.8M (Preparation Example 5-2), or 1.2M (Preparation Example 5-1)methylammonium leadtriiodide solution (total volume: 1 ml, at least 700% based on the total pore volumes of the porous electron transporting material) prepared in Preparation Example 2 was applied onto (injected into) porous electrodes formed with the porous electron transporting material having a thickness of 600 nm prepared in Preparation Example 1-3, and spin coating was performed at 3000 rpm for 100 seconds, followed by drying at 100° C. under atmospheric pressure for 10 minutes, thereby forming the perovskite light absorber. At the time of preparing the light absorber, environmental conditions were maintained at a temperature of 25° C. and relative humidity of 25%.

In the case of 0.5M solution (Preparation Example 5-3), it was confirmed that a light absorption structure was formed on the composite layer, but reproducibility of formation thereof was low, and the coverage ($C_{ov}/S_{urf}$) was also low (about 2%). In the case of 0.8M solution (Preparation Example 5-2), it was confirmed that a light absorption structure was stably and reproducibly formed, and the coverage ($C_{ov}/S_{urf}$) reached 30%. In the case of 1.2M solution (Preparation Example 5-1), it was confirmed that a light absorption structure was stably and reproducibly formed, and the coverage ($C_{ov}/S_{urf}$) reached 40%.

Figure 7:
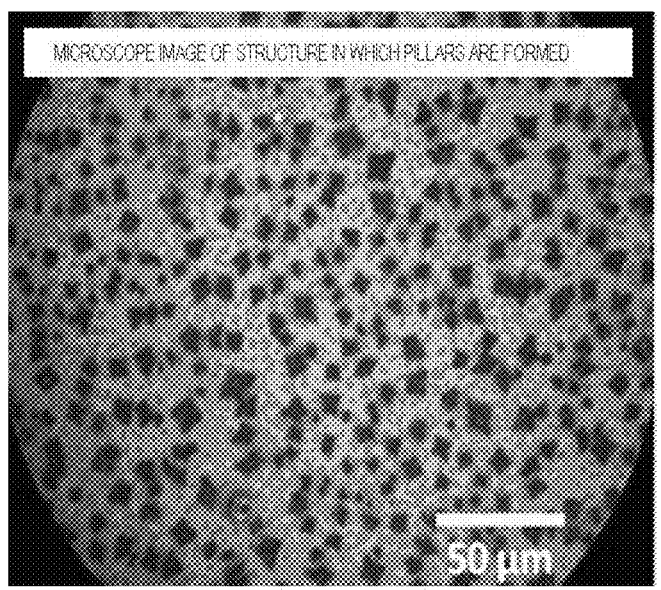
FIG. 7 is an optical microscope photograph obtained by observing a light absorption structure formed on a composite layer of a sample prepared in Preparation Example 5-2.
Figure 8:
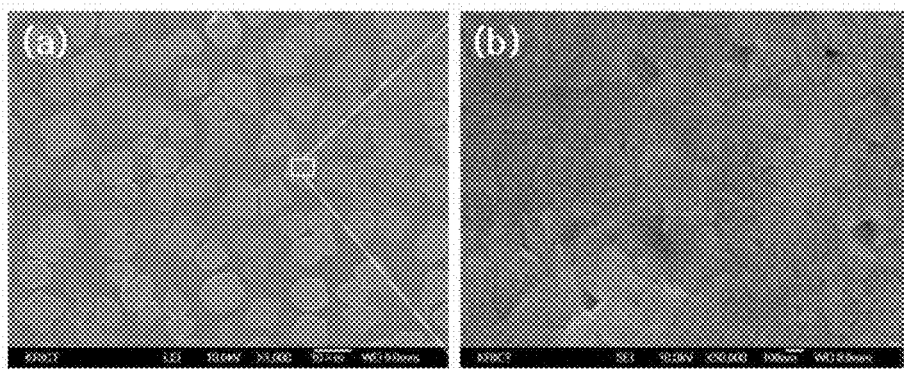
FIGS. 8A and 8B are scanning electron microscope photographs obtained by observing the light absorption structure formed on the composite layer of the sample prepared in Preparation Example 5-2.

FIG. 7 is an optical microscope photograph obtained by observing the light absorption structure formed on the composite layer of the sample (Preparation Example 5-2) manufactured by applying 0.8M light absorber solution onto the porous electron transporting material having a thickness of 600 nm at a spin rate of 3000 rpm, and FIGS. 8A and 8B are scanning electron microscope photographs obtained by observing the same sample. In this case, FIG. 8A is a low magnification photograph, and FIG. 8B is a photograph obtained by enlarging a square part in FIG. 8A. As shown in FIGS. 7 to 8B, it was confirmed that pillars having a polygonal plate shape were manufactured, and it may be appreciated that the pillar has a diameter of 10,000 to 30,000 nm, a thickness of 300 to 700 nm, and a coverage of 30% based on a surface area of the composite layer. In the case in which the light absorption structure bodies were manufactured using the light absorber solution prepared in Preparation Example 2, although there was a fine difference in size, all of the light absorption structure bodies were polygonal plate shaped pillars similar to that in FIGS. 7 to 8B.

Figure 9:
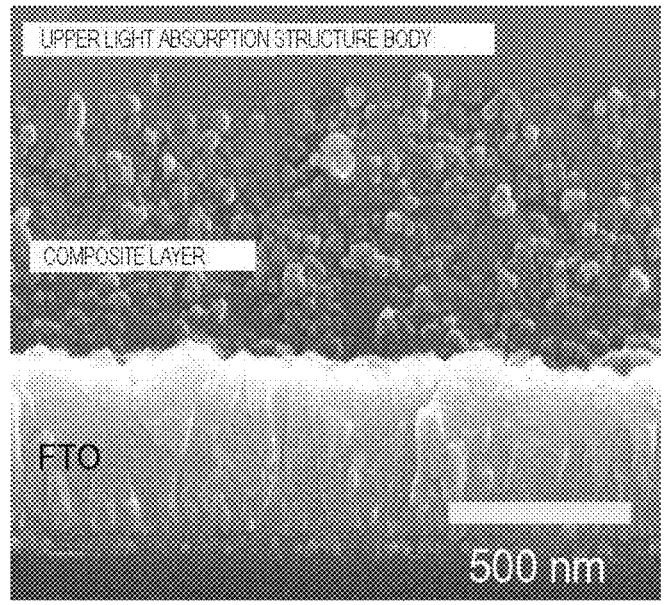
FIG. 9 is a scanning electron microscope photograph obtained by observing a cross section of the sample prepared in Preparation Example 5-2.

FIG. 9 is a scanning electron microscope photograph obtained by observing a cross section of the sample (Preparation Example 5-2) manufactured by applying 0.8M light absorber solution onto the porous electron transporting material having a thickness of 600 nm at a spin rate of 3000 rpm. As shown in FIG. 9, it may be appreciated that all of the pores of the porous electron transporting material were filled with the light absorber, and it was confirmed that in all of the samples in which the light absorption structure was manufactured, the composite layer of which open pores were filled with the light absorber was prepared similarly to the case in FIG. 9.

FIG. 10 is an optical microscope photograph obtained by observing a surface of a sample (Preparation Example 4-6) manufactured by applying 1.2M light absorber solution prepared in advance onto the porous electrode formed with the electron transporting material having a thickness of 600 nm at a spin rate of 6000 rpm. It may be confirmed that the light absorption structure including the pillar was not formed on a surface of the composite layer.

It may be appreciated through the above-mentioned Preparation Examples that when the thickness of the porous electron transporting material was 1000 nm or less, preferably 800 nm or less, the coverage by the light absorption structure was preferably 30% or more.

It may be appreciated through the above-mentioned Preparation Examples that at the time of applying the light absorber solution, when the maximum rpm was 5000 rpm or less, preferably 4000 rpm or less, and more preferably 3000 rpm or less, the light absorption structure may be simultaneously manufactured, and a light absorption structure having a coverage of 28% or more, more preferably 40% or more may be formed.

It may be appreciated through the above-mentioned Preparation Examples that when the concentration of the light absorber solution was 0.4M or more, preferably 0.8M or more, the composite layer and the light absorption structure may be stably manufactured, and the coverage by the light absorption structure may be preferably 30% or more.

Preparation Example 6

A porous electron transporting material having a thickness of 600 nm was prepared by the same method as that in Preparation Example 1 except for using $TiO_2$ nanoparticles having an average particle size (diameter) of 20 nm at the time of manufacturing the porous $TiO_2$ thin film substrate of Preparation Example 1. A porosity of the prepared porous electron transporting material was 66%. A light absorber was formed on the porous electron material having a porosity of 66% by the same method as the method of using 0.8M light absorber solution prepared in Preparation Example 2-2 and performing the spin coating at 3000 rpm to form the light absorber in Preparation Example 5-2.

In the case of the sample of Preparation Example 5-2 in which the porous electron transporting material having the thickness of 600 nm and the porosity of 50% and 0.8M light absorber solution were used and the spin coating was performed at 3000 rpm, the above-mentioned polygonal plate shaped pillar was formed with a coverage of 30%, but it was confirmed that in the case in which the porosity is 66%, at the time of applying the light absorber solution, although the film of the solution was formed on the surface of the porous electron transporting material, most of the light absorber solution was continuously absorbed and consumed in the porous electron transporting material due to excessively high porosity, such that the light absorption structure was not formed.

In the following Examples, in order to measure current-voltage characteristics of the manufactured solar cell, an ORIEL class A solar simulator (Newport, model 91195A) and a source-meter (Kethley, model 2420) were used. Power conversion efficiency was measured under 100 mW/cm$^2$ AM1.5 illumination conditions by covering an optical mask having an active area of 0.096 cm$^2$.

Example 1

The sample (Preparation Example 5-2 or 5-1) in which the light absorber was formed by applying 0.8M (Preparation Example 2-2) or 1.2M (Preparation Example 2-1) light absorber solution (methylammonium leadtriiodide solution) at 3000 rpm on the porous electrode on which the porous electron transporting material having a thickness of 600 nm and prepared using the $TiO_2$ nanoparticles having the average particle size (diameter) of 50 nm and manufactured in Preparation Example 1-3 was used as the composite layer. Thereafter, a PTAA dissolved toluene solution (15 mg (PTAA)/1 mL (dichlorobenzene)] was spin coated on the composite layer on which the light absorption structure was formed at 3000 rpm for 60 seconds, thereby forming a hole conductive layer. In this case, 2.31 mg of LiTFSI and 6.28 mg of TBP were added to the PTAA solution.

Then, Au electrode (second electrode) having a thickness of about 70 nm was formed by vacuum depositing Au on the hole conductive layer using high vacuum (5×10⁻⁶ torr or less) thermal evaporator, thereby manufacturing a solar cell (Example 1-1: sample of using 0.8M light absorber solution, and Example 1-2: sample of using 1.2M light absorber solution).

Example 2

A solar cell was manufactured by the same method as that in Example 1-1 except for performing an atmospheric plasma treatment process (RF power: 350 W, argon flow: 6 slm, and a process of exposing the pillar on the plasma for 2 second and not exposing the pillar for 2 seconds was repeated 30 times) on the manufactured pillar in order to finely form the plate shape pillar formed on the composite layer.

Figure 11:
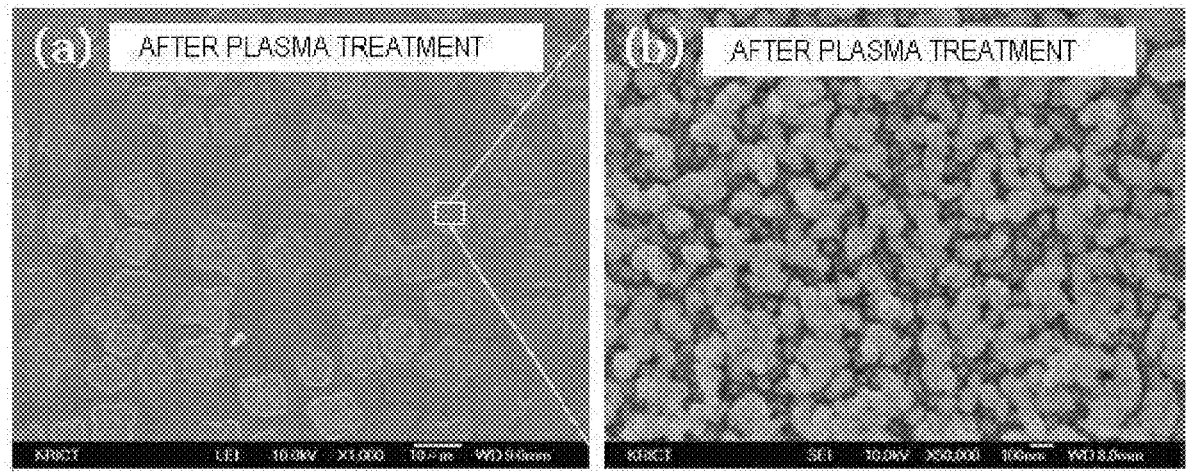
FIGS. 11A and 11B are scanning electron microscope photographs obtained by observing a light absorption structure formed on a composite layer after atmospheric plasma treatment in Example 2.

Scanning electron microscope photographs of the pillar formed on the composite layer after performing the atmospheric plasma treatment process according to the Example 2 were shown in FIGS. 11A and 11B. In this case, FIG. 11A is a low magnification scanning electron microscope photograph, and FIG. 11B is a photograph obtained by enlarging a square part in FIG. 11A. It may be appreciated that the polygonal pillars having a diameter of 10,000 to 30,000 nm on the composite layer was changed into fine pillars having a diameter of 10 to 100 nm and a length of 200 to 300 nm by atmospheric plasma treatment.

Figure 12:
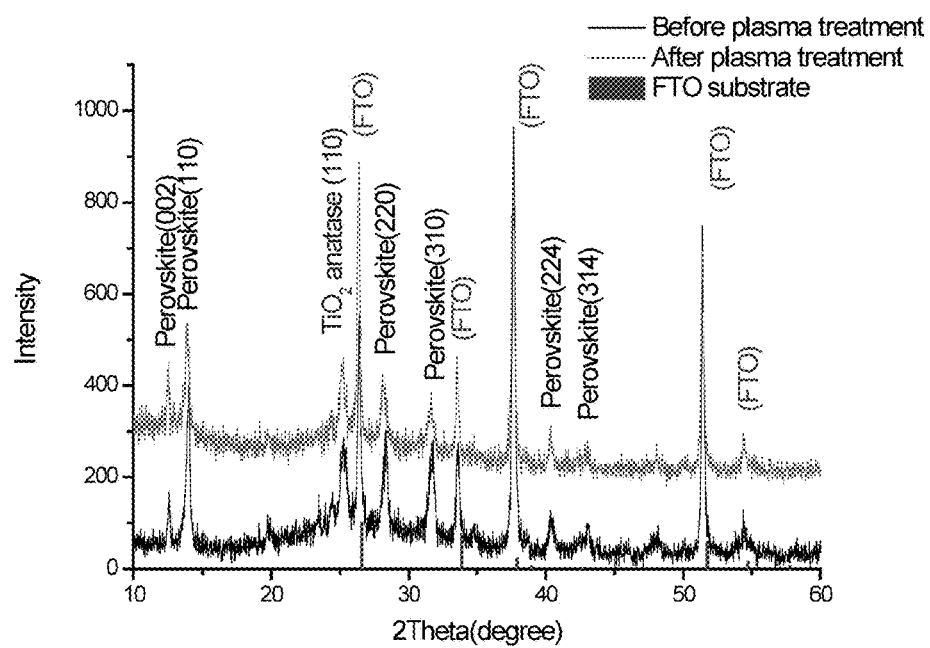
FIG. 12 is a view showing X-ray diffraction pattern (XRD) results of light absorbers prepared in Examples 1 and 2.

FIG. 12 is a view showing X-ray diffraction pattern (XRD) results of the light absorbers prepared in Examples 1 and 2. As shown in FIG. 12, it may be appreciated that the perovskite structure of the light absorber was not changed even though the atmospheric plasma treatment was performed, but only the shape may be selectively changed by plasma treatment.

Comparative Example 1

A solar cell was manufactured by the same method as that in Example 1 except for using the sample (Preparation Example 4-6) in which the light absorption structure was not formed by being manufactured by applying 1.2M light absorber solution (methylammonium leadtriiodide solution) at 6000 rpm on the porous electrode on which the porous electron transporting material having a thickness of 600 nm and prepared using the $TiO_2$ nanoparticles having the average particle size (diameter) of 50 nm in Preparation Example.

Current-voltage characteristic values of the solar cells manufactured in Examples 1-1, 1-2, and 2 and Comparative Example 1 were shown in Table 1.

TABLE 1

Performance of solar cell according to Examples 1 and 2

| | Coverage (Cov/Surf, %) | Short-circuit current density (mA/cm²) | Open circuit voltage (V) | Fill factor (%) | Power conversion efficiency (%) |
|---|---|---|---|---|---|
| Example 1-1 | 30 | 15.5 | 0.95 | 0.70 | 10.0 |
| Example 1-2 | 40 | 16.7 | 0.97 | 0.75 | 12.1 |
| Example 2 | 30 | 15.3 | 0.96 | 0.75 | 11.0 |
| Comparative Example 1 | 0 | 10.2 | 0.80 | 0.60 | 4.9 |

In Table 1, it may be appreciated that in the case of the solar cell of Example 1-1 or 1-2 having a structure in which the pillar was formed on the composite layer by using 0.8M or 1.2M light absorber solution, excellent short-circuit current density and open circuit voltage were obtained, such that high power conversion efficiency was obtained, and particularly, in the case of forming the pillar having a micro structure as in Example 2, electrical charges formed in the light absorber may more easily move to the electron transporting material (metal oxide of the porous electrode) and the hole transporting material (organic hole transporting material of the hole conductive layer), such that the high fill factor and power conversion efficiency were obtained. On the contrary, in the case in which the light absorption structure was not formed on the composite layer, the short-circuit current density and open circuit voltage were relatively low, such that low efficiency was obtained. This result shows that an upper structure body formed on the composite layer may absorb additional light to generate photocharges, and photohole may be directionally transported to the electrode due to the limited structure and increased interface caused by the formed upper structure body, thereby implementing excellent power conversion efficiency.

Preparation Example 7

Preparation of Light Absorber Solution and Light Absorber

A light absorber was prepared by the same method as that in Preparation Example 3-3 (the case of using the electron transporting material having a thickness of 600 nm in Preparation Example 3) except for using 1.2M methylammonium leadtriiodide, ($CH_3NH_3PbI_3$) solution prepared by dissolving methylammonium iodide ($CH_3NH_3I$) and lead diiodide ($PbI_2$) at a molar ratio of 1:1 in 2-methoxyethanol and stirred at 60° C. for 12 hours instead of the light absorber solution prepared in Preparation Example 2.

Preparation Example 8

Preparation of Light Absorber Solution and Light Absorber

A light absorber was prepared by the same method as that in Preparation Example 3-3 except for using 1.2M methylammonium leadtriiodide, ($CH_3NH_3PbI_3$) solution prepared by dissolving methylammonium iodide ($CH_3NH_3I$) and lead diiodide ($PbI_2$) at a molar ratio of 1:1 in dimethylsulfoxide and stirred at 60° C. for 12 hours.

Preparation Example 9

Preparation of Light Absorber Solution and Light Absorber

A light absorber was prepared by the same method as that in Preparation Example 3-3 except for using 1.2M methylammonium leadtriiodide, ($CH_3NH_3PbI_3$) solution prepared by dissolving methylammonium iodide ($CH_3NH_3I$) and lead diiodide ($PbI_2$) at a molar ratio of 1:1 in dimethylformamide and stirred at 60° C. for 12 hours.

Figure 13:
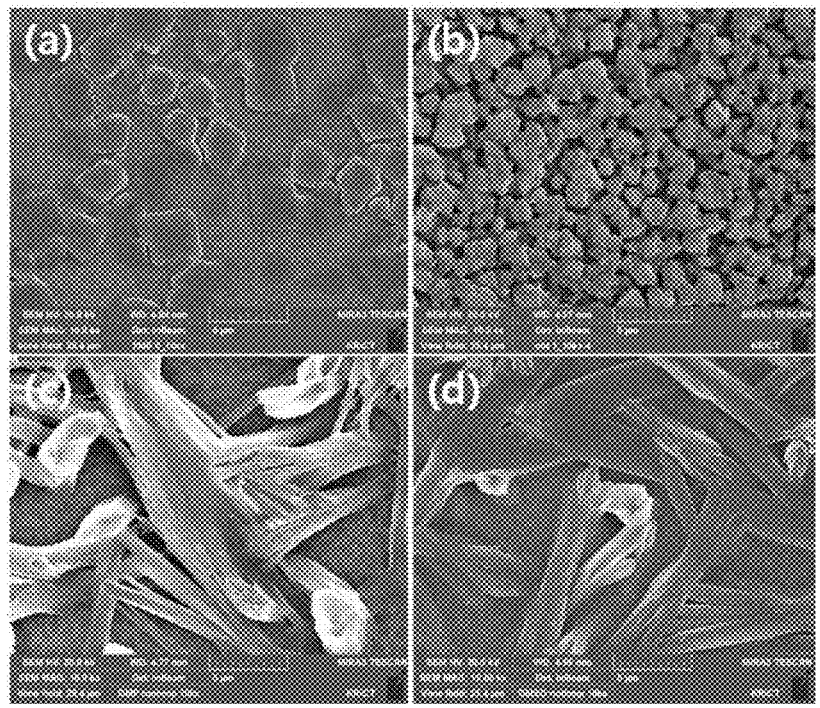
FIGS. 13A to 13D are scanning electron microscope photographs obtained by observing light absorption structure bodies manufactured in Preparation Example 3-3 (FIG. 13A), 7 (FIG. 13B), 8 (FIG. 13C), and 9 (FIG. 13D)

FIGS. 13A to 13D are scanning electron microscope photographs obtained by observing light absorption structure bodies manufactured in Preparation Examples 3-3 (FIG. 13A), 7 (FIG. 13B), 8 (FIG. 13C), and 9 (FIG. 13D). As shown in FIGS. 13A to 13B, it was confirmed that the light absorber pillar was formed simultaneously with forming light absorber in the pores of the porous electron transporting material, and it may be appreciated that the size, the shape, and density of the formed pillar were significantly changed according to the vapor pressure of the solvent used in the light absorber solution.

It was confirmed that in the case of the sample of Preparation Example 7 in which 2-methoxyethanol having a vapor pressure of 6.17 mmHg at 20° C. under 1 atm, coarse and angular pillars having a size (diameter) of 1 to 2 μm and a thickness of 700 to 900 nm were formed on the surface. In this case, the coverage was about 70%. It may be appreciated that in the case of the sample of Preparation Example 3-3 in which gamma-butyrolactone having a vapor pressure of 1.5 mmHg at 20° C. under 1 atm, the plate shape pillars having a size (diameter) of 2 to 4 μm were formed, and thickness of the pillar was 200 to 400 nm, the surface coverage was about 35%, which was low as compared to the case in Preparation Example 7. In the case of Preparation Example 8, dimethylformamide having a vapor pressure of 2.7 mmHg at 20° C. under 1 atm was used, and as a result, coarse needle shaped pillars having a length of 10 μm or more and a thickness of 800 to 1500 nm were formed. It may be appreciated that in Preparation Example 9, in the case of using dimethylsulfoxide having a vapor pressure of 0.42 mmHg at 20° C. under 1 atm as a solvent, a long plate shaped pillar structure was formed.

Preparation Example 10

Preparation of Light Absorber Solution and Light Absorber

A light absorber solution and a light absorber were prepared by the same method as that in Preparation Example 7 except for mixing 2-metoxyethanol and gamma-butyrolactone with each other at a volume ratio of 9 (2-metoxyethanol):1 (gamma-butyrolactone) to use the mixed solution as a solvent at the time of preparing a methylammonium leadtriiodide, ($CH_3NH_3PbI_3$) solution.

Preparation Example 11

Preparation of Light Absorber Solution and Light Absorber

A light absorber solution and a light absorber were prepared by the same method as that in Preparation Example 7 except for mixing 2-metoxyethanol and gamma-butyrolactone with each other at a volume ratio of 8 (2-metoxyethanol):2 (gamma-butyrolactone) to use the mixed solution as a solvent at the time of preparing a methylammonium leadtriiodide, ($CH_3NH_3PbI_3$) solution.

Preparation Example 12

Preparation of Light Absorber Solution and Light Absorber

A light absorber solution and a light absorber were prepared by the same method as that as in Preparation Example 7 except for mixing 2-metoxyethanol and gamma-butyrolactone with each other at a volume ratio of 7 (2-metoxyethanol):3 (gamma-butyrolactone) to use the mixed solution as a solvent at the time of preparing a methylammonium leadtriiodide, ($CH_3NH_3PbI_3$) solution.

Preparation Example 13

Preparation of Light Absorber Solution and Light Absorber

A light absorber solution and a light absorber were prepared by the same method as that in Preparation Example 7 except for mixing 2-metoxyethanol and gamma-butyrolactone with each other at a volume ratio of 5 (2-metoxyethanol):5 (gamma-butyrolactone) to use the mixed solution as a solvent at the time of preparing a methylammonium leadtriiodide, ($CH_3NH_3PbI_3$) solution.

Figure 14:
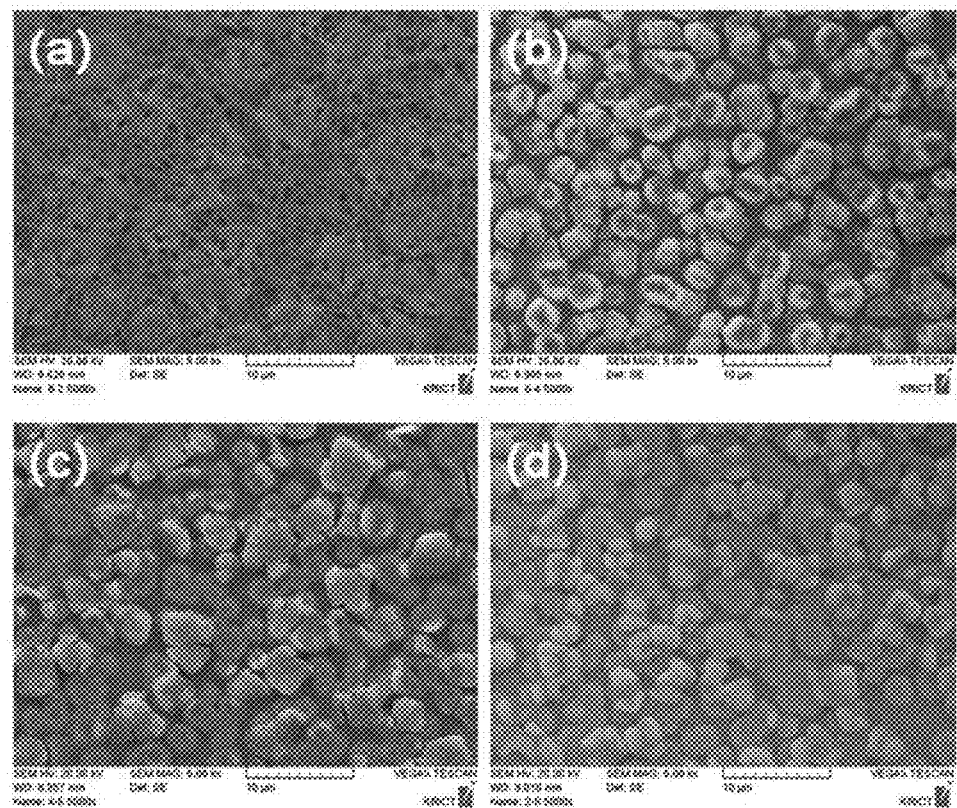
FIGS. 14A to 14D are scanning electron microscope photographs obtained by observing light absorption structure bodies manufactured in Preparation Examples 10 (FIG. 14A), 11 (FIG. 14B), 12 (FIG. 14C), and 13 (FIG. 14D)

FIGS. 14A to 14D are scanning electron microscope photographs obtained by observing light absorption structure bodies manufactured in Preparation Examples 10 (FIG. 14A), 11 (FIG. 14B), 12 (FIG. 14C), and (FIG. 14D). As shown in FIGS. 14A to 14D, it may be appreciated that in the case of preparing the light absorber solution using the mixed solvent to manufacture the composite layer and the light absorption structure, the shape was significantly different as compared to the case of Preparation Examples using a single solvent. It may be appreciated that in the case of Preparation Example 10, a structure in which the wire shaped pillars having a wire web structure and plate shape pillars were mixed was obtained, and the coverage was significantly high (about 90%). As shown in FIGS. 14A to 14D, it may be appreciated that in the light absorption structure bodies in Preparation Examples 11 to 13, as the content of the 2-methoxyethanol was decreased and the content of the gamma-butyrolactone was increased, the shape of the pillar was gradually changed into the plate shape and at the same time, the coverage was decreased. In addition, it was confirmed that in the case of in Preparation Example 13 in which the lowest coverage was obtained, the coverage was 50%.

Example 3

A solar cell was manufactured by the same method as that in Example 1 except for using the sample prepared in Preparation Example 7 as the sample in which the light absorption structure was formed on the composite layer before forming the hole conductive layer in Example 1 instead of using the sample prepared in Preparation Example 5-1 (or Preparation Example 5-2).

Example 4

A solar cell was manufactured by the same method as that in Example 1 except for using the sample prepared in Preparation Example 8 as the sample in which the light absorption structure was formed on the composite layer before forming the hole conductive layer in Example 1 instead of using the sample prepared in Preparation Example 5-1 (or Preparation Example 5-2).

Example 5

A solar cell was manufactured by the same method as that in Example 1 except for using the sample prepared in Preparation Example 9 as the sample in which the light absorption structure was formed on the composite layer before forming the hole conductive layer in Example 1 instead of using the sample prepared in Preparation Example 5-1 (or Preparation Example 5-2).

Example 6

A solar cell was manufactured by the same method as that in Example 1 except for using the sample prepared in Preparation Example 10 as the sample in which the light absorption structure was formed on the composite layer before forming the hole conductive layer in Example 1 instead of using the sample prepared in Preparation Example 5-1 (or Preparation Example 5-2).

Example 7

A solar cell was manufactured by the same method as that in Example 1 except for using the sample prepared in Preparation Example 11 as the sample in which the light absorption structure was formed on the composite layer before forming the hole conductive layer in Example 1 instead of using the sample prepared in Preparation Example 5-1 (or Preparation Example 5-2).

Example 8

A solar cell was manufactured by the same method as that in Example 1 except for using the sample prepared in Preparation Example 12 as the sample in which the light absorption structure was formed on the composite layer before forming the hole conductive layer in Example 1 instead of using the sample prepared in Preparation Example 5-1 (or Preparation Example 5-2).

Example 9

A solar cell was manufactured by the same method as that in Example 1 except for using the sample prepared in Preparation Example 13 as the sample in which the light absorption structure was formed on the composite layer before forming the hole conductive layer in Example 1 instead of using the sample prepared in Preparation Example 5-1 (or Preparation Example 5-2).

As described above, the size and shape of the pillar and the size of the light absorber in the light absorption structure in addition to the coverage by the light absorption structure may have an influence on optical properties of the solar cell. The reason is that the size and shape of the pillar and the size of the light absorber may have an influence on interfacial resistance between the porous metal oxide layer (composite layer) formed with the light absorber and the light absorption structure, separation and movement efficiency of photohole, a movement restriction effect of the photohole toward the second electrode, the contact area with the hole conductive layer, and the like.

The following Table 2 shows results obtained by measuring performance of the solar cells manufactured in Examples 3 to 9.

TABLE 2

| | Performance of solar cell | | | |
|---|---|---|---|---|
| | Short-circuit current density (mA/cm$^2$) | Open circuit voltage (V) | Fill factor (%) | Power conversion efficiency (%) |
| Example 3 | 21.5 | 1.02 | 69 | 15.1 |
| Example 4 | 18.6 | 0.91 | 62 | 10.5 |
| Example 5 | 17.2 | 0.99 | 70 | 11.9 |
| Example 6 | 21.6 | 1.05 | 72 | 16.3 |
| Example 7 | 20.8 | 1.02 | 70 | 14.9 |
| Example 8 | 19.7 | 0.96 | 70 | 13.2 |
| Example 9 | 18.6 | 0.91 | 68 | 11.5 |

As shown in Table 2, it may be appreciated that in the case of the solar cell applying the structure in which highly crystalline column shaped pillars having a size of 2 μm or less were formed on the surface of the composite layer with a coverage of 70% or more as in Example 3, excellent short-circuit current density and open circuit voltage were obtained, such that high power conversion efficiency was obtained, and particularly, in the case of forming the pillar having a micro structure as in Example 3, electrical charges formed in the light absorber may be more easily separated and move, such that high power conversion efficiency was obtained. On the other hand, it may be appreciated that in the case of Example 1, when the shape of the pillar was wide and thin but density of the pillars present on the surface was low, the solar cell had relatively low short-circuit current density and open circuit voltage, such that the solar cell had relatively low efficiency. This indicates that in the structure in which the crystallinity of the pillar formed on the composite layer is excellent, its own photohole and photoelectron transporting property may be improved, such that the photohole may be further efficiently transported to the interface, thereby obtaining excellent power conversion efficiency. However, in the case of Example 1, the fill factor was relatively low due to the thin pillar structure. It may be appreciate that in the case of Example 5, the solar cell had a structure in which thin pillars were present with high surface density, but the pillar was composed of small particles having a size of several nm, such that the short-circuit current density was low, and in the case of Example 4, since a coverage of the pillar was low and a thickness of the pillar was thick, the hole transporting material did not cover the entire surface of the light absorption structure, such that the fill factor was low.

It may be appreciate that in the case of Example 6, the solar cell had a structure in which the pillar covered at least 90% of the upper portion of the composite layer, such that the solar cell had relatively high photovoltaic efficiency as compared to the case of using the single solvent in Examples 3 and 1. It may be appreciated that power conversion efficiency of the solar cells of Examples 7 to 9 was slightly decreased as compared to the case of Example 3 using the single solvent, which may be interpreted as the result depending on formation of the pillar having a shape similar to that in Example 1.

As known through the suggested Examples, the surface coverage by the light absorption structure formed on the porous electrode play a critical role on device efficiency. Particularly, it may be appreciated that the higher the surface coverage, the more excellent photovoltaic properties.

Preparation Example 14

Preparation of Light Absorber Solution and Light Absorber 0.96M methylammonium leadtriiodide, (CH$_3$NH$_3$PbI$_3$) solution was prepared by the same method as that in Preparation Example 2 except for using dimethylsulfoxide as a solvent.

The prepared light absorber solution (total volume of 1 ml, at least 700% based on the total pore volumes of the porous electron transporting material) was applied onto (injected into) a rotational center on the porous electrode on which the porous electron transporting material having a thickness of 300 nm at one time and prepared by the method in Preparation Example 1-4, and spin coating was initiated at 3000 rpm. At a timing point at which a spin coating time was 50 seconds, 1 mL of toluene, which is a non-solvent, was applied again onto (injected into) the rotational center of the spinning porous electrode at one time, and then spin coating was further performed for 5 seconds. After performing the spin coating, the drying was performed at 100° C. under atmospheric pressure for 30 minutes, thereby forming a perovskite light absorber. At the time of manufacturing the light absorber, environmental conditions were maintained at a temperature of 25° C. and relative humidity of 25%.

Preparation Example 15

Preparation of Light Absorber Solution and Light Absorber 0.96M methylammonium leadtriiodide, $(CH_3NH_3PbI_3)$ solution was prepared by the same method as that in Preparation Example 2-1 except for using a mixed solvent in which gamma-butyrolactone and dimethylsulfoxide were mixed at a volume ratio of 2 (gamma-butyrolactone):8 (dimethylsulfoxide) as a solvent.

The light absorber was prepared by the same method as in Preparation Example 14 except for the prepared methylammonium leadtriiodide solution as the light absorber solution.

Preparation Example 16

Preparation of Light Absorber Solution and Light Absorber 0.96M methylammonium leadtriiodide, $(CH_3NH_3PbI_3)$ solution was prepared by the same method as that in Preparation Example 2-1 except for using a mixed solvent in which gamma-butyrolactone and dimethylsulfoxide were mixed at a volume ratio of 4 (gamma-butyrolactone):6 (dimethylsulfoxide) as a solvent.

The light absorber was prepared by the same method as in Preparation Example 14 except for the prepared methylammonium leadtriiodide solution as the light absorber solution.

Preparation Example 17

Preparation of Light Absorber Solution and Light Absorber 0.96M methylammonium leadtriiodide, $(CH_3NH_3PbI_3)$ solution was prepared by the same method as that in Preparation Example 2-1 except for using a mixed solvent in which gamma-butyrolactone and dimethylsulfoxide were mixed at a volume ratio of 6 (gamma-butyrolactone):4 (dimethylsulfoxide) as a solvent.

The light absorber was prepared by the same method as in Preparation Example 14 except for the prepared methylammonium leadtriiodide solution as the light absorber solution.

Preparation Example 18

Preparation of Light Absorber Solution and Light Absorber 0.96M methylammonium leadtriiodide, $(CH_3NH_3PbI_3)$ solution was prepared by the same method as that in Preparation Example 2-1 except for using a mixed solvent in which gamma-butyrolactone and dimethylsulfoxide were mixed at a volume ratio of 8 (gamma-butyrolactone):2 (dimethylsulfoxide) as a solvent.

The light absorber was prepared by the same method as in Preparation Example 14 except for the prepared methylammonium leadtriiodide solution as the light absorber solution.

Here, it was confirmed that in the cases of Preparation Examples 14 to 18 in which after the light absorber solution was applied onto (injected into) the rotational center at one time and spin coating was performed at 3000 rpm for 100 seconds to thereby complete application of the light absorber solution, 1 mL of toluene corresponding to the non-solvent was applied onto (injected into) the rotational center at one time and spin coating was further performed for 10 seconds, similar sample was prepared.

In addition, it was confirmed that in the case of applying chloroform, chlorobenzene, 1,2-dichlorobenzene, isopropanol, or diethyl ether instead of toluene in Preparation Example 18, a thin film type light absorption structure was manufactured.

Figure 15:
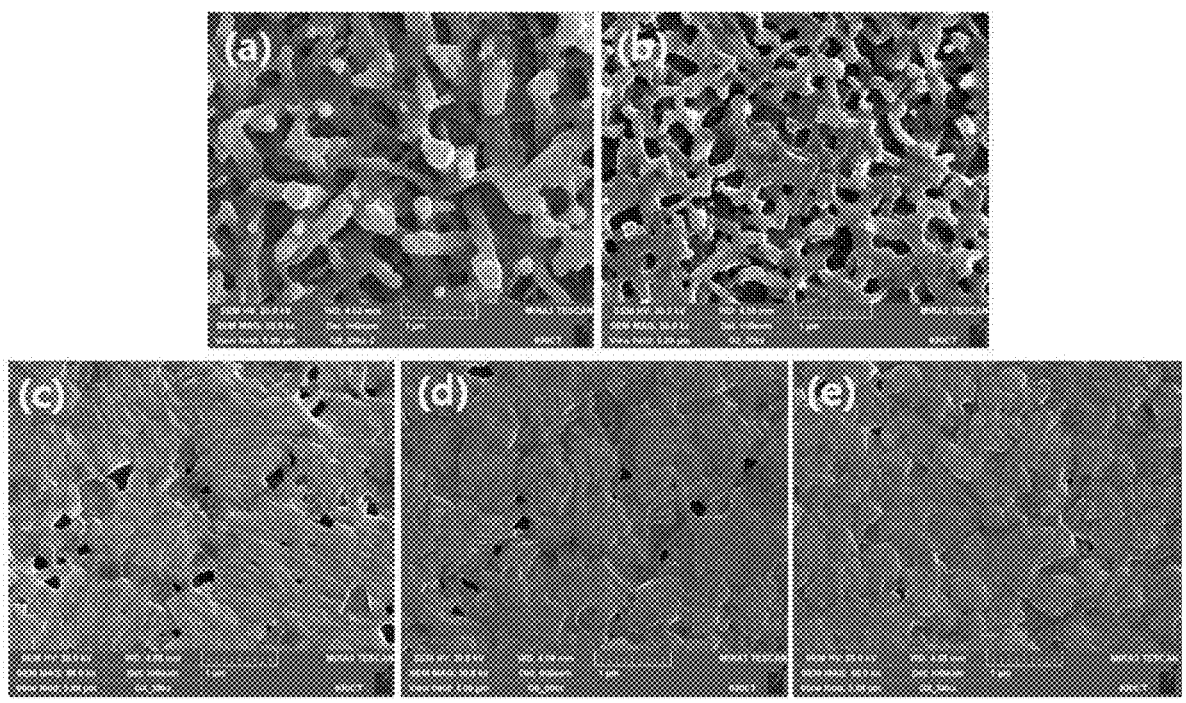
FIGS. 15A to 15E are scanning electron microscope photographs obtained by observing light absorption structure bodies manufactured in Preparation Examples 14 (FIG. 15A), 15 (FIG. 15B), 16 (FIG. 15C), 17 (FIG. 15D), and 18 (FIG. 15E)
Figure 16:
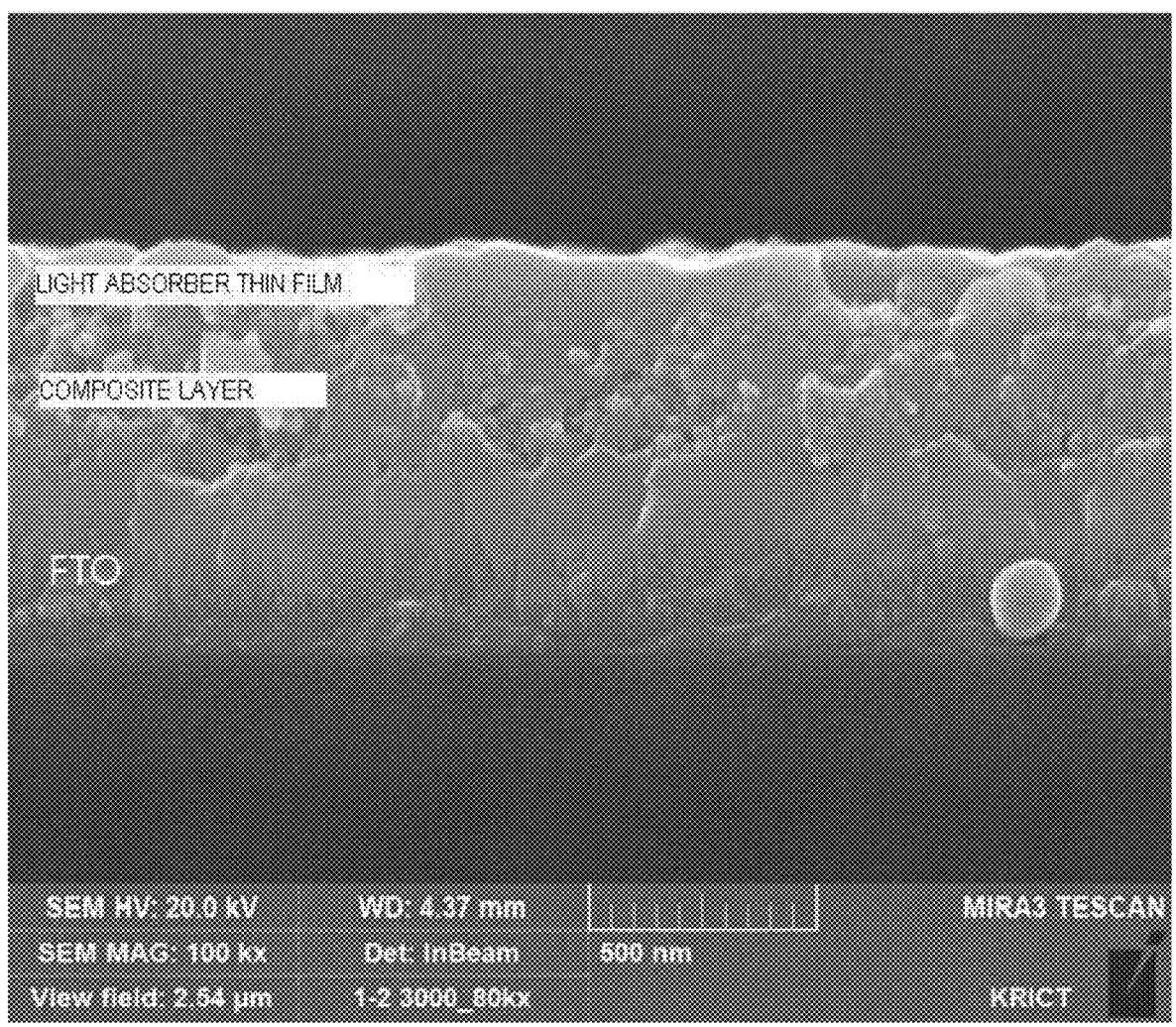
FIG. 16 is a scanning electron microscope (SEM) photograph obtained by observing a cross section of a sample manufactured in Preparation Example 18.

FIGS. 15A to 15E are scanning electron microscope photographs obtained by observing light absorption structure bodies manufactured in Preparation Examples 14 (FIG. 15A), 15 (FIG. 15B), 16 (FIG. 15C), 17 (FIG. 15D), and 18 (FIG. 15E). FIG. 16 is a scanning electron microscope (SEM) photograph obtained by observing a cross section of a sample manufactured in Preparation Example 18.

As shown in FIGS. 15A to 15E, it was confirmed that the light absorption structure was manufactured in a shape of light absorber thin film in which the light absorbers are continuously connected to each other by sequentially applying the light absorber solution and the non-solvent, and the light absorber thin film was manufactured as a porous thin film or dense film. It may be appreciated that in the cases in which the light absorber thin film was formed in the porous thin film shape as in Preparation Examples 14 and 15, pores were uniformly and homogeneously present, and in Preparation Examples 16 to 18, the light absorber thin film was formed in the dense film shape. It was confirmed that in the cases of Preparation Examples 16 and 17, pores partially trapped at an interface of the light absorber grain such as a triple point remained, but surface coverage of the composite layer was high (90% or more), and in the case of Preparation Example 18, there was almost no remaining pore, such that the surface coverage reached 100%.

FIG. 16 is a scanning electron microscope (SEM) photograph obtained by observing a cross section of a sample manufactured in Preparation Example 18. As shown in FIG. 16, it was confirmed that all of the pores of the porous electron transporting material were filled with the light absorber and the composite layer was simultaneously manufactured, and the light absorber thin film having a thickness of 150 nm was manufactured on the composite layer.

Example 10

A solar cell was manufactured by the same method in Example 1 except for using the sample prepared in Preparation Example 14 as the sample in which the light absorption structure was formed on the composite layer before forming the hole conductive layer in Example 1 instead of using the sample prepared in Preparation Example 5-1 (or Preparation Example 5-2).

Example 11

A solar cell was manufactured by the same method in Example 1 except for using the sample prepared in Preparation Example 15 as the sample in which the light absorption structure was formed on the composite layer before forming the hole conductive layer in Example 1 instead of using the sample prepared in Preparation Example 5-1 (or Preparation Example 5-2).

Example 12

A solar cell was manufactured by the same method in Example 1 except for using the sample prepared in Preparation Example 16 as the sample in which the light absorption structure was formed on the composite layer before forming the hole conductive layer in Example 1 instead of using the sample prepared in Preparation Example 5-1 (or Preparation Example 5-2).

Example 13

A solar cell was manufactured by the same method in Example 1 except for using the sample prepared in Preparation Example 17 as the sample in which the light absorption structure was formed on the composite layer before forming the hole conductive layer in Example 1 instead of using the sample prepared in Preparation Example 5-1 (or Preparation Example 5-2).

Example 14

A solar cell was manufactured by the same method in Example 1 except for using the sample prepared in Preparation Example 18 as the sample in which the light absorption structure was formed on the composite layer before forming the hole conductive layer in Example 1 instead of using the sample prepared in Preparation Example 5-1 (or Preparation Example 5-2).

TABLE 3

| | Performance of solar cell | | | |
|---|---|---|---|---|
| | Short-circuit current density (mA/cm$^2$) | Open circuit voltage (V) | Fill factor (%) | Power conversion efficiency (%) |
| Example 10 | 18.1 | 0.91 | 60 | 9.9 |
| Example 11 | 20 | 1.02 | 70 | 14.3 |
| Example 12 | 21.5 | 1.04 | 72 | 16.1 |
| Example 13 | 21.8 | 1.04 | 74 | 16.8 |
| Example 14 | 22 | 1.08 | 73 | 17.3 |

Example 15

A solar cell was manufactured by the same method as that in Example 14 except for using the porous electron transporting material having a thickness of 600 nm and prepared in Preparation Example 1-3 instead of the porous electron transporting material having a thickness of 300 nm in Example 14.

Example 16

A solar cell was manufactured by the same method as that in Example 14 except for using the porous electron transporting material having a thickness of 100 nm and prepared in Preparation Example 1-5.

TABLE 4

| | Performance of solar cell | | | |
|---|---|---|---|---|
| | Short-circuit current density (mA/cm$^2$) | Open circuit voltage (V) | Fill factor (%) | Power conversion efficiency (%) |
| Example 15 | 21.6 | 1.02 | 72 | 15.9 |
| Example 16 | 22.1 | 1.06 | 60 | 14.1 |

Table 4 shows results of measuring power conversion efficiency of the solar cells manufactured in Examples 15 and 16. The fill factor of the solar cells according to the thickness of the porous electron transporting material was shown in Table 4. As a result of observing the scanning electron microscope photograph of the cross section, it was confirmed that the thinner the thickness of the porous electron transporting material, the thicker the light absorber thin film (dense film). In detail, it was confirmed that in the case of using the porous electron transporting material having a thickness of 100 nm, the light absorber thin film having a thickness of 400 nm was formed on the composite layer, and in the case of using the porous electron transporting material having a thickness of 600 nm, the light absorber thin film having a thickness of 50 nm was formed on the composite layer. As shown in Table 4 and the performance result of the solar cell of Example 14, it was confirmed that in the case in which the light absorber thin film was excessively thin, photo current was relatively decreased, such that power conversion efficiency may be decreased as compared to the case in Example 14, and in the case in which the porous electron transporting material was excessively thin, the contact area between the light absorber in the composite layer and the electron transporting material was decreased, such that power conversion efficiency of the solar cell may also be decreased. It may be confirmed that in the case (Example 14) in which the thicknesses of the light absorber thin film and the composite layer were 150 nm and 300 nm, respectively, power conversion efficiency of the solar cell may also be increased due to an increase in the absorption rate of irradiated solar cell in the light absorption structure and improvement of a photocharge separation property in the composite layer.

Example 17

A light absorber solution was prepared by the same method as that in Preparation Example 18 except for preparing 0.72M light absorber solution instead of 0.96M light absorber solution, and a solar cell was manufactured by the same method as that in Example 14 except for using 0.72M light absorber solution prepared herein.

Example 18

A light absorber solution was prepared by the same method as that in Preparation Example 18 except for preparing 0.84M light absorber solution instead of 0.96M light absorber solution, and a solar cell was manufactured by the same method as that in Example 14 except for using 0.84M light absorber solution prepared herein.

Example 19

A light absorber solution was prepared by the same method as that in Preparation Example 18 except for preparing 1.08M light absorber solution instead of 0.96M light absorber solution, and a solar cell was manufactured by the same method as that in Example 14 except for using 1.08M light absorber solution prepared herein.

Example 20

A light absorber solution was prepared by the same method as that in Preparation Example 18 except for preparing 1.20M light absorber solution instead of 0.96M light absorber solution, and a solar cell was manufactured by the same method as that in Example 14 except for using 1.20M light absorber solution prepared herein.

The thickness of the light absorber thin film on the composite layer was measured by observing the cross section of each of the samples (porous electrode formed with the light absorber) similarly manufactured in Example 14 and Examples 17 to 20 before forming the hole conductive layer for manufacturing the solar cell. The fill factor of the solar cells manufactured in Example 14 and Examples 17 to 20 and thickness of the manufactured light absorber thin film were shown in Table 5. As shown in Table 5, it may be appreciated that under the same thickness condition of the porous electron transporting material and the same application condition, as the concentration of the light absorber solution was increased, the light absorber thin film having a thicker thickness was manufactured. In addition, it may be appreciated that when the light absorber thin film was thin, a photo current value was decreased, and when the light absorber thin film was thick, a fill factor value was decreased, such that in the case of the light absorber thin film having a thickness of about 150 nm, the solar cell may have excellent efficiency. This result may be due to an excellent electrical charge separation property at an junction area between the porous electron transporting material and the light absorber in the composite layer and the electron and hole transporting property of the inorganic-organic hybrid perovskite compound in the light absorber thin film layer when solar light irradiated through the composite layer and the light absorber thin film (light absorption structure) was absorbed.

TABLE 5

Thickness of light absorber thin film and performance of solar cell

| | Thickness of light absorber thin film layer (nm) | Short-circuit current density (mA/cm$^2$) | Open circuit voltage (V) | Fill factor (%) | Power conversion efficiency (%) |
|---|---|---|---|---|---|
| Example 17 | 40 | 18.0 | 1.06 | 75 | 14.3 |
| Example 18 | 90 | 19.8 | 1.09 | 75 | 16.2 |
| Example 14 | 150 | 22.0 | 1.08 | 73 | 17.3 |
| Example 19 | 230 | 22.1 | 1.04 | 69 | 15.9 |
| Example 20 | 250 | 22.0 | 1.03 | 65 | 14.7 |

Example 21

A solar cell was manufactured by the same method as that in Example 14 except for using a spiro-OMeTAD dissolved solution [60 mg (spiro-OMeTAD)/1 mL (chlorobenzene)] instead of the PTAA dissolved toluene in order to form the hole conductive layer on the composite layer formed with the light absorption structure.

In the case of Example 14, the short-circuit current density was 22.0 mA/cm$^2$, the open circuit voltage was 1.08V, the fill factor was 73%, and the power conversion efficiency was 17.3%, and the case of Example 21, the short-circuit current density was 22.0 mA/cm$^2$, the open circuit voltage was 1.04V, the fill factor was 69%, and the power conversion efficiency was 15.8%. Therefore, it may be appreciated that a polymer hole transporting material may be more preferably in view of energy level matching with the light absorber, which is the inorganic-organic hybrid perovskite compound.

In the solar cell according to the present invention, the light absorber layer includes the composite layer having a structure in which the electron transporting material and the light absorber are impregnated with each other and the light absorption structure formed on the composite layer to have a double layered structure, and the solar cell has a new structure in which the electron transporting material and the hole transporting material are suitably bonded to each other, such that the solar cell may have significantly high power conversion efficiency (10 to 17.3%), thereby making it possible to substantially and immediately replace a silicon based solar cell. In addition, the solar cell may be manufactured as an entirely solid state while having high power conversion efficiency, such that the stability may be excellent, and the solar cell may be manufactured using cheap materials and the simple solution application method, such that the solar cell may be cheaply mass-produced in a short time.

With the manufacturing method according to the exemplary embodiment of the present invention, the solar cell may be manufactured by the application process such as application of slurry, application of the light absorber solution, and application of the hole transporting material, such that the solar cell may be manufactured through the significantly simple and easy process. In addition, a process construction cost for manufacturing the solar cell may also be significantly low, and the solar cell may be manufactured using cheap raw materials, such that a cheap high quality solar cell may be mass-produced in a short time. Further, the solar cell having significantly high power conversion efficiency of 10 to 17.3% while having excellent commerciality may be manufactured.

Hereinabove, although the present invention is described by specific matters, exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described examples, and the following claims as well as all modified equally or equivalently to the claims are intended to fall within the scopes and spirits of the invention.

What is claimed is:

1. A solar cell comprising:
   a first electrode;
   a composite layer disposed on the first electrode and containing a porous metal oxide layer and a light absorber comprising an inorganic-organic hybrid perovskite compound;
   a light-absorbing structure disposed on the composite layer and continuously extended from the light absorber of the composite layer, and consisting of a light absorber comprising an inorganic-organic hybrid perovskite compound which is same with the inorganic-organic hybrid perovskite compound of the light absorber of the composite layer;

a hole conductive layer disposed on the light-absorbing structure; and a second electrode disposed on the hole conductive layer, wherein the porous metal oxide layer of the composite layer includes aggregated metal oxide particles and pores between the metal oxide particles, and the light absorber of the composite layer entirely fills in the pores of the porous metal oxide layer.

2. The solar cell of claim 1, wherein the light-absorbing structure satisfies the following Correlation Equation 1:

$$0.05 \leq Cov/Surf \leq 1 \quad \text{(Correlation Equation 1)}$$

(In Correlation Equation 1, Surf is the entire surface area of a surface of the composite layer on which the light-absorbing structure is disposed, and Cov is a surface area of the composite layer covered by the light-absorbing structure).

3. The solar cell of claim 1, wherein Cov/Surf (Surf is the entire surface area of a surface of the composite layer on which the light-absorbing structure is disposed, and Cov is a surface area of the composite layer covered by the light-absorbing structure) corresponding to a surface coverage of the composite layer by the light-absorbing structure is 0.7 to 1.

4. The solar cell of claim 1, wherein the light-absorbing structure includes a light absorber pillar, a light absorber thin film, or a light absorber pillar protruding on the light absorber thin film.

5. The solar cell of claim 4, wherein the light absorber pillar has a column shape, a plate shape, a needle shape, a wire shape, a rod shape, or a mixed shape thereof.

6. The solar cell of claim 4, wherein the light absorber thin film is a dense film, a porous film, or a laminate film thereof.

7. The solar cell of claim 1, wherein the-light-absorbing structure includes a light absorber thin film having a thickness of 1 nm to 2000 nm.

8. The solar cell of claim 1, wherein the inorganic-organic hybrid perovskite compounds of the light absorber of the composite layer and the light absorber of the light-absorbing structure are satisfying the following Chemical Formulas 1 and 2:

$$AMX_3 \quad \text{(Chemical Formula 1)}$$

(In Chemical Formula 1, A is a monovalent organic ammonium ion or Cs+, M is a divalent metal ion, and X is one or two or more halogen ions selected from Cl—, Br—, and I—), and $$A_2MX_4 \quad \text{(Chemical Formula 2)}$$

(In Chemical Formula 2, A is a monovalent organic ammonium ion or Cs+, M is a divalent metal ion, and X is one or two or more halogen ions selected from Cl—, Br—, and I—).

9. The solar cell of claim 1, wherein the porous metal oxide layer has a thickness of 50 nm to 10 μm.

10. The solar cell of claim 1, further comprising a metal oxide thin film disposed between the first electrode and the composite layer.

11. The solar cell of claim 1, wherein the hole conductive layer is a monomer- or polymer-based organic hole transporting material.

12. The solar cell of claim 11, wherein the organic hole transporting material is one or two or more selected from thiophene based hole conductive polymers, para-phenylene vinylene based hole transporting polymers, carbazole based hole transporting polymers, and triphenylamine based hole transporting polymers.

* * * * *